United States Patent [19]
Yamada et al.

[11] Patent Number: 6,027,254
[45] Date of Patent: Feb. 22, 2000

[54] OPTO-ELECTRONIC HYBRID INTEGRATION PLATFORM, OPTICAL SUB-MODULE, OPTO-ELECTRONIC HYBRID INTEGRATION CIRCUIT, AND PROCESS FOR FABRICATING PLATFORM

[75] Inventors: Yasufumi Yamada; Shinji Mino, both of Mito; Ikuo Ogawa, Yokohama; Hiroshi Terui; Kaoru Yoshino, both of Mito; Kuniharu Kato, Naka-gun; Kazuyuki Moriwaki, Mito; Akio Sugita, Tomobe-machi; Masahiro Yanagisawa; Toshikazu Hashimoto, both of Mito, all of Japan

[73] Assignee: Nippon Telegraph and Telephone Corporation, Tokyo, Japan

[21] Appl. No.: 08/694,620

[22] Filed: Aug. 9, 1996

Related U.S. Application Data

[62] Division of application No. 08/286,968, Aug. 8, 1994, Pat. No. 5,621,837.

[30] Foreign Application Priority Data

| Aug. 9, 1993 | [JP] | Japan | 5-197325 |
| Dec. 7, 1993 | [JP] | Japan | 5-306578 |
| May 20, 1994 | [JP] | Japan | 6-106492 |
| Jun. 29, 1994 | [JP] | Japan | 6-148222 |

[51] Int. Cl.$^7$ .................................... G02B 6/36
[52] U.S. Cl. .............................. 385/88; 385/89; 385/14; 385/132; 385/92
[58] Field of Search .................... 385/14, 88–94, 385/131, 132

[56] References Cited

U.S. PATENT DOCUMENTS

| 4,930,857 | 6/1990 | Acarlar | 385/88 |
| 5,128,915 | 7/1992 | Yamashita et al. | 369/44.12 |
| 5,228,101 | 7/1993 | Lebby et al. | 385/91 |
| 5,353,364 | 10/1994 | Kurashima | 385/88 |
| 5,412,748 | 5/1995 | Furuyama et al. | 385/88 |
| 5,416,871 | 5/1995 | Takahashi et al. | 385/88 |
| 5,521,992 | 5/1996 | Chun et al. | 385/14 |

FOREIGN PATENT DOCUMENTS

| 0 320 722 | 6/1989 | European Pat. Off. . |
| 0 466 134 | 7/1991 | European Pat. Off. . |
| 62-242362 | 10/1987 | Japan . |
| 63-131104 | 6/1988 | Japan . |
| 5-3748 | 1/1993 | Japan . |
| 5-60952 | 3/1993 | Japan . |
| 5067770 | 3/1993 | Japan . |

OTHER PUBLICATIONS

"Hybrid–Integrated 4×4 Optical . . . Waveguides and LD Array Chips", by Yasufumi Yamada et al., pp. 383–390, Journal of Lightwave Technology, vol. 10, No. 3, Mar., 1992.

"Gigabit Transmitter Array Modules on Silicon Waferboard", by Craig A. Armiento et al., pp. 1072–1080; IEEE, vol. 15, No. 6, Dec., 1992.

"Silica–Based Optical Waveguide On Terraced Silicon Substrate as Hybrid Integration Platform", by Y. Yamada et al., pp. 444–445, Electronics Letters, vol. 29, No. 5, Mar. 4, 1993.

(List continued on next page.)

*Primary Examiner*—Hung N. Ngo
*Attorney, Agent, or Firm*—Venable; Robert J. Frank; Michael A. Sartori

[57] ABSTRACT

An opto-electronic hybrid integrated circuit of the present invention satisfy a low-loss optical waveguide function, an optical bench function and a high-frequency electrical wiring function. The circuit includes a substrate such as a silicon substrate, a dielectric optical waveguide part arranged in a recess of the substrate, and an optical device mounting part formed on a protrusion of the substrate. An electrical wiring part is disposed on the dielectric layer. The optical device is mounted on the substrate. An optical sub-module includes the optical device which is possible to mount on the substrate.

58 Claims, 78 Drawing Sheets

OTHER PUBLICATIONS

"LiNbO$_3$ Chip Assembly On Silica–Based Waveguide On Terraced Silicon Substrate", by Yasufumi Yamada et al., pp. 204–205, LEOS '93 6th Annual Meeting, Nov. 15–18, 1993, San Jose, CA.

Physical Concepts of Materials for Novel Optoelectronic Device Applications II: Device Physics and Applications, vol. 1362, "Integrated Optical Devices With Silicon Oxynitride Prepared By PECVD on Si and GaAs Substrates", D. Peters & J. Müller, pp. 338–349 (1990).

43rd Electronic Components & Technology Conference, Jun. 1–4, 1993, "Multichannel for Asynchronous Transfer Mode Switching Systems", Y. Arai et al., pp. 825–830.

ntegration platform, an optical sub-module which can be
OPTO-ELECTRONIC HYBRID INTEGRATION PLATFORM, OPTICAL SUB-MODULE, OPTO-ELECTRONIC HYBRID INTEGRATION CIRCUIT, AND PROCESS FOR FABRICATING PLATFORM This is a Division of application Ser. No. 08/286,968 filed Aug. 8, 1994 now U.S. Pat. No. 5,621,837.

BACKGROUND OF THE INVENTION

1. Field of the Invention

The present invention relates to a hybrid optical integration platform capable of incorporating an optical device or optical sub-module used for optical communication and optical signal processing in addition to optical waveguides and electrical wiring, an optical sub-module which can be equipped on an opto-electronic board, and a hybrid optical integrated circuit equipped with the optical device or optical sub-module, and to a process for fabricating the hybrid optical integration platform.

2. Description of the Prior Art

With recent advances in optical communication and optical information processing, development of an opto-electronic integration circuit is in demand. In such a circuit, active devices are incorporated in low-loss optical waveguides and the like to be driven by a high-frequency electrical circuit.

To achieve a circuit incorporating active devices on the optical waveguide and driven at a high-frequency, three conditions are required for the opto-electronic board. These are (1) a low-loss optical waveguide function, (2) an optical bench function to incorporate an optical device on the same substrate and prevent axis deviation, and (3) a high-frequency electrical wiring function required to drive the optical device.

However, a circuit that satisfies the above three conditions has not been obtained with the prior art.

As a prior art example, FIG. 1 is a schematic perspective view showing a construction called a "Silicon optical bench" in which, using a guide groove 2 and positioning reference surfaces 3a, 3b, and 3c formed on a silicon substrate 1, an optical fiber 4 and a semiconductor laser (LD) 5 are integrated on the silicon Substrate. In this construction, since the guide groove can be formed with a good precision utilizing good processability of the silicon substrate, integration of the optical fiber 4 with optical devices such as the semiconductor laser 5 and a photo-detector (PD) can be easily achieved. Further, since the silicon substrate is superior in thermal conductivity, it also functions as a good heat sink for optical devices.

Further, the electrical wiring 6 is formed directly on the surface of the silicon substrate 1, or through a very thin oxide film of less than 0.5 µm in thickness, but this structure has a problem of considerably deteriorating the high-frequency characteristics of the electrical wiring 6. That is, to form the electrical wiring 6 with superior high-frequency characteristics, the electrical wiring layer must have a sufficient thickness and be formed on an insulator with small dielectric loss. However, the silicon substrate 1 is very thin, the resistance is not high enough to ensure high-frequency characteristics, and it has a specific resistivity of about 1 k-ohm.cm.

FIG. 2 shows the high-frequency characteristics of a 0.6 mm long coplanar wiring formed directly on the silicon substrate (T. Suzuki et al.: Microwave Workshop Digest (1993) p95). The axis of ordinates indicates the transmission characteristics $S_{21}$ of the S parameter and the axis of abscissas indicates the frequency (GHz). Loss of the 0.6 mm long wiring is about 0.4 dB (2 GHz) and about 0.8 dB (10 GHz), which are converted to 1 cm as 7 dB (2 GHz) and 13 dB (10 GHz), thus showing a substantial loss.

On the other hand, in an optical packaged circuit having an optical waveguide function, the application of a silica-based optical waveguide formed on the silicon substrate is expected. Prior art optical waveguides include (1) a "ridge type optical waveguide" in which the core is protected with a thin over-cladding layer as shown in FIGS. 3A and 3B, and (2) an "embedded optical waveguide" in which the core is embedded in a sufficiently thick over-cladding layer as shown in FIGS. 3C and 3D.

FIG. 4 is a schematic perspective view showing an example of the ridge type optical waveguide which is described in a document. This document is "Hybrid-Integrated 4×4 Optical Gate Matrix Switch Using Silica-Based Optical Waveguides and LD Array Chips", IEEE J. Lightwave Technol., vol. 10, pp. 383–390, 1992, by Y. Yamada et al. This example shows a hybrid optical integrated circuit including a silica-based optical waveguide 7 formed on the silicon substrate 1 and a semiconductor optical device 8. In this example, a semiconductor laser amplifier (SLA) is represented. The optical waveguide 7 has a structure of a ridge type optical waveguide, in which a core 7a formed on a thick under-cladding layer 7c formed on the silicon substrate 1 is protected with very thin cladding layers 7b and 7c. The SLA 8 is surface packaged in an upside-down construction in which an active layer 8a is facing down in the vicinity of the waveguide end, and a heat sink 9 for heat dissipation is provided on the backside. Since, in such a structure, the core is only covered with very thin cladding layers 7b and 7c, it has problems that (1) the optical waveguide has a large loss, (2) it is liable to be affected by an external disturbance, and (3) formation of a directional coupler circuit is difficult. In particular, the directional coupler is an indispensable circuit element to fabricate a high-performance optical circuit, and the impossibility of its formation means that application of the ridge type optical waveguide is limited to a narrow area. Thus, the ridge type optical waveguide does not sufficiently satisfy the optical waveguide function. Further, the electrical wiring function is not investigated here.

FIG. 5 shows an example of an "optical waveguide circuit with terrace" (Yamada, Kawachi, Kobayashi: Japanese Patent Application Laying-open 63-131104 "Hybrid Optical Integrated Circuit") in which an optical waveguide is formed in a recess 1a on a silicon substrate 1 having irregularities, and a device is equipped on a protruded part 1b. In FIG. 5, an under-cladding layer 10c of a silica-based optical waveguide 10 is formed in the recess 1a of the silicon substrate 1, and a core layer 10b is formed on top, and finally an embedding cladding layer 10a is formed. The upper surface of the under-cladding layer 10c and the upper surface of the protruded part 1b of the silicon substrate are in line in height, and the protruded part 1b can be used as a height reference surface of the optical device 8. In such a substrate 1, the low-loss optical waveguide function and optical bench function are satisfied, but a function to provide high-frequency wiring is not considered at all. When electrical wiring is provided, it is formed on the protruded part 1b of the silicon substrate 1, which does not satisfy the requirements for high-frequency characteristics. In FIG. 5, the reference numeral 8a indicates an active layer, and 11 indicates a reference surface for device positioning.

FIG. 6 is a schematic perspective view showing the construction of a hybrid optical integrated circuit disclosed in Japanese Patent Application Laying-open No. 62-242362. This circuit almost comprises a buffer layer 12 provided on a silicon substrate 1, a silica-based optical waveguide 13 provided thereon, a device holding table 14 having the same height from the upper surface of the silicon substrate 1 as the buffer layer 12, a semiconductor laser 15 held in upside-down construction on the holding table 14, and an electrical wiring table 16 having a conductive film 16a electrically connected with a gold wire W to the upper electrode of the semiconductor laser 15 and protrudingly provided on the upper surface of the silicon substrate 1. The reference numeral 17 indicates a heat sink.

In such a circuit construction, since a difference in height from the upper surface of the buffer layer 12 to the core of the waveguide 13 is set equal to the difference in height from the upper surface of the device holding table 14 to the active layer 15a of the semiconductor laser 15, it has an advantage that optical devices such as a semiconductor laser can be equipped with a very high positioning precision.

However, even with this circuit, the optical waveguide 13 is limited to the ridge type, tends to be affected by an external disturbance, and cannot provide a low loss optical waveguide function.

FIG. 7 is a schematic perspective view showing construction of a hybrid optical integrated circuit disclosed in Japanese Patent Application Publication 5-3748. This circuit mainly comprises an optical waveguide 18 protrudingly disposed with nearly the same height on the silicon substrate, an optical fiber guide 19, an optical device guide 20, an electrical wiring holding table 21, a first conductive film (common electrode) 22 disposed on the silicon substrate 1, a second conductive film 23 disposed on the upper surface of the electrical wiring holding table 21 and insulated from the first conductive film 22, an optical fiber 24 disposed along the optical fiber guide 19, and a laser diode 25 as an optical device disposed along the optical device guide 20.

The circuit of this construction, since the optical device is equipped directly on the silicon substrate, has an advantage that the silicon substrate can function as a heat sink.

However, even with this circuit, the optical waveguide 18 is limited to the ridge type, tends to be affected by an external disturbance, and cannot provide a low loss optical waveguide function.

FIG. 8 is a schematic cross sectional view showing construction of an optical waveguide device disclosed in Japanese Patent Application Laying-open 5-60952. This device mainly comprises a silicon substrate 1, an optical waveguide 26 formed on the substrate 1, and a semiconductor device 27 equipped in an upside-down construction in a recess of the silicon substrate 1.

In the device of this construction, the optical waveguide 26 is formed on a convex region of the silicon substrate 1, and therefore an under-clad of a sufficient thickness cannot be formed. Therefore, it has a large transmission loss, tends to be affected by an external disturbance, and does not satisfy a sufficient optical waveguide function.

Further, in the above device, since the electrical wiring 28 is provided on the silicon substrate 1, the requirements for high-frequency characteristics are not satisfied.

As described above, the prior art hybrid optical integration technology does not satisfy the above three requirements. In particular, the high-frequency electrical wiring function has not been considered.

SUMMARY OF THE INVENTION

An object of the present invention is to provide an opto-electronic hybrid packaged platform which satisfy a low-loss optical waveguide function, an optical bench function, and a high-frequency electrical wiring function.

A further object of the present invention is to provide a process for fabricating an opto-electronic hybrid packaged platform which satisfy the three function described above.

A still further object of the present invention is to provide an opto-electronic hybrid integration circuit which satisfy the three functions described above.

Another object of the present invention is to provide an optical sub-module which satisfy the three functions described above.

According to an aspect of the present invention, one of the foregoing objects can be achieved by providing an opto-electronic hybrid packaged platform, having an optical waveguide part, an optical device mounting part, and an electrical wiring part provided on a same substrate, wherein the optical device mounting part has a terrace provided as a protrusion on the substrate; and the electrical wiring part has a dielectric layer formed on the substrate and a conductor pattern formed on the surface of and within the dielectric layer.

The terrace may be made of silicon material. The substrate may have a silicon terrace for electronic circuit formation in addition to the silicon terrace for optical device mounting. An upper surface of the conductor pattern on the dielectric layer may be set lower than an upper surface of the silicon terrace in the optical device mounting part and at least in the vicinity of the silicon terrace of the electrical wiring part.

The silicon terrace may have a side surface having an inclination angle; and a thin film electrode may be formed on the surface and the side surface of the silicon terrace, and the thin film electrode may be electrically connected to the conductor pattern formed on an upper surface or inside the dielectric layer in the periphery of the silicon terrace.

The silicon terrace for the optical device may be divided into two or more sections, a space between the divided silicon terrace may be filled with the dielectric layer, and a conductor pattern may be provided on the dielectric layer between the silicon terraces for the optical device. The optical waveguide part may include a positioning groove formed on the silicon terrace, and an optical fiber fixed in the positioning groove.

The optical waveguide part may have an under-cladding layer formed on the substrate, a core, and an over-cladding layer, and a height of a core bottom surface of the optical waveguide may be set higher than the upper surface of the silicon terrace.

The optical waveguide may include at least one signal optical waveguide and at least one monitor optical waveguide.

The optical waveguide may be a dielectric optical waveguide, and the dielectric layer of the electrical wiring part may have an under-cladding layer of the dielectric optical waveguide.

A second dielectric layer may be stacked on a part of a first dielectric layer, the first dielectric layer including the under-cladding layer of the optical waveguide, the second dielectric layer including a material different from the optical waveguide, and a conductor pattern may be formed inside or on the surface of the second dielectric layer.

The substrate may be a silicon substrate, the optical waveguide and the electrical wiring part dielectric layer are formed of a silica-based optical waveguide, a conductor pattern formed on the electrical wiring part dielectric layer may be a coplanar wiring having a central conductor and a ground conductor, and the dielectric layer may have a thickness of 50 µm or more.

The silicon substrate may have an average resistivity of 50 ohm-cm or more, the optical waveguide and the dielectric layer are formed on a silica-based optical waveguide, a conductor pattern provided on the electrical wiring part dielectric layer may be a coplanar wiring comprising a central conductor and a ground conductor, and the dielectric layer may have a thickness of 20 µm or more.

According to another aspect of the present invention, one of the foregoing objects can be achieved by providing an opto-electronic hybrid packaged platform, having a silica-based optical waveguide including an under-clad, a core and an over-clad which are formed on a silicon substrate; and an electrical wiring layer including a coplanar wiring, the coplanar wiring having a central conductor and a grounding conductor which are formed on any one of the under-clad and the over-clad layers of the silica-based optical waveguide, wherein the silica-based optical waveguide defined between the electrical wiring layer and the silicon substrate may have a thickness of 50 µm or more.

According to another aspect of the present invention, one of the foregoing objects can be achieved by providing an opto-electronic hybrid packaged platform, having a silica-based optical waveguidge including an under-clad layer, a core and an over-clad layer which are formed on a silicon substrate; and an electrical wiring layer including a coplanar wiring, the coplanar wiring having a central conductor and a grounding conductor which are formed on any one of the under-clad and the over-clad of the silica-based optical waveguide, wherein the silicon substrate may have an average resistivity of 50 ohm-cm or more, and the silica-based optical waveguide defined between the electrical wiring layer and the silicon substrate may have a thickness of 20 µm or more.

The silica-based optical waveguide may have a total thickness of 120 µm or less. The substrate may be a silicon substrate having a recess and a protrusion formed on the surface, the silicon substrate protrusion functions as the silicon terrace, the optical waveguide may have an under-cladding layer, a core, and an over-cladding layer formed on the recess, and the electrical wiring part may have a dielectric layer formed on the silicon substrate recess and a conductor pattern provided on the surface or inside of the dielectric layer.

A conductor pattern may be formed within the substrate, and the conductor pattern in the substrate and the conductor pattern in or on the dielectric layer are electrically connected.

The optical waveguide part may include an under-clad layer, a core and an over-clad layer which are formed on the silicon substrate, wherein the height of the bottom surface of the core of the optical waveguide part may be higher than that of the upper surface of the silicon terrace, and wherein the conductor pattern of the electrical wiring part may be formed on a surface of the dielectric layer, the dielectric layer having a height which may be substantially equal to a surface of the over-clad layer of the optical waveguide.

According to another aspect of the present invention, one of the foregoing objects can be achieved by providing a method for producing a platform, having the steps of: providing a protruding silicon terrace on a substrate; forming an optical waveguide under-cladding layer on the substrate, and flattening the surface; forming a core pattern and an over-cladding layer; removing an over-cladding layer of the silicon terrace and the electrical wiring part, all of the core and part of an under-cladding layer to form a device mounting part, whereby exposing a silicon terrace upper surface, and setting the under-cladding layer of the electrical wiring part lower by a desired size than the silicon terrace surface; and forming a conductor pattern on the electrical wiring part.

According to another aspect of the present invention, one of the foregoing objects can be achieved by providing an opto-electronic hybrid integrated circuit, having a packaged platform, the platform including: an optical waveguide having an under-cladding layer, a core, and an over-cladding layer provided on a substrate; a silicon terrace functioning as a device mounting part provided as a protrusion adjacent to the optical waveguide; and an electrical wiring part provided adjacent to the silicon terrace and including a dielectric layer and a conductor pattern provided on the surface or inside of the dielectric layer, wherein on the platform, an optical functional device may be mounted on the optical device silicon terrace, with an optical device surface facing down and at least part of the optical device surface contacted with the silicon terrace upper surface, and maintaining optical coupling with the optical waveguide and electrical connection with a conductor pattern of the electrical wiring part.

According to another aspect of the present invention, one of the foregoing objects can be achieved by providing an opto-electronic hybrid integrated circuit, having a platform, the platform including: an optical waveguide including an under-cladding layer, a core, and an over-cladding layer provided on a substrate; a silicon terrace functioning as a device mounting part provided as a protrusion adjacent to the optical waveguide; an electrical wiring part provided adjacent to the silicon terrace and including a dielectric layer and a conductor pattern provided on the surface or inside of the dielectric layer; and an electronic circuit silicon terrace provided as a protrusion on the substrate in the electrical wiring part and functioning as an electronic circuit mounting part; wherein on the platform, an optical functional device may be mounted on the optical device silicon terrace, with an optical device surface facing down and at least part of the optical device surface contacted with the silicon terrace upper surface, and maintaining optical coupling with the optical waveguide and electrical connection with a conductor pattern of the electrical wiring part, and an electronic circuit may be mounted on the silicon terrace while maintaining thermal connection with the silicon terrace.

The height of the conductor pattern upper surface on the dielectric layer in the vicinity of the electronic circuit silicon terrace may be set lower than the electronic circuit silicon terrace upper surface, the electronic circuit may be held with part thereof contacted with the electronic circuit silicon terrace, and at least part of an electrode on the electronic circuit surface may be fixed while maintaining electrical connection with a conductor pattern on the dielectric layer corresponding to the electrode through an electroconductive material.

The optical functional device may be contacted and fixed with a backside electrode of the optical functional device electrically contacted with a conductor pattern on the recess of a sub-carrier including thermal conductive material provided with the conductor pattern provided on the surface with a protrusion and a recess and electrically connected from the recess surface to the protrusion surface; the silicon terrace may be divided into two or more sections, and a spacing between the divided silicon terrace may be filled with the dielectric layer; a first conductor pattern to the electrode provided on the active layer side surface of the optical functional device and a second conductor pattern corresponding to the optical functional device backside electrode are provided on the dielectric layer in the periphery of the silicon terrace; the height of the upper surfaces of the first and second conductor patterns may be set lower than the silicon terrace upper surface; the optical functional device mounted on the sub-carrier may be mounted on the platform with the device surface facing down and while the periphery of the optical device surface maintaining connection and thermal connection with the silicon terrace surface; the optical functional device surface electrode and the first conductor pattern are electrically connected through an electroconductive bonding material; and the optical functional device backside electrode may be electrically connected with the second conductor pattern through the conductor pattern on the sub-carrier protrusion and an electroconductive bonding material.

The optical functional device may be contacted and fixed with a backside electrode of the optical functional device electrically contacted with a conductor pattern on the recess of a sub-carrier including thermal conductive material provided with the conductor pattern provided on the surface with a protrusion and a recess and electrically connected from the recess surface to the protrusion surface; the silicon terrace may be divided into two or more sections, and may have an inclination angle; the periphery of the divided silicon terrace may be filled with the dielectric layer; on the dielectric layer in the periphery of the silicon terrace, a first conductor pattern corresponding to the electrode provided on the active layer side surface of the optical functional device, and the height of the first conductor pattern may be set lower than the silicon terrace upper surface; a thin film electrode corresponding to the optical functional device backside electrode may be formed on part of the silicon terrace upper surface and the inclined side surface, and the thin film electrode may be electrically connected with a second conductor pattern provided on the dielectric layer; wherein the optical functional device mounted on the sub-carrier may be mounted on the packaged substrate with the device surface facing down and while the periphery of the optical device surface maintaining connection and thermal connection with the silicon terrace surface; wherein the optical functional device surface electrode and the first conductor pattern are electrically connected through an electroconductive bonding material; and wherein the optical functional device backside electrode may be electrically contacted with the second conductor pattern through the conductor pattern on the sub-carrier protrusion and the thin film electrode on the silicon terrace.

The distance from the sub-carrier outer side surface to the optical functional device active layer may be set to a desired setting value D in the optical functional device fixed on the sub-carrier; a guide structure formed of the optical waveguide material may be provided in the vicinity of the silicon terrace; the distance from the guide structure inner side surface to the optical waveguide core center may be set to the setting value D; and the optical functional device may be mounted on the silicon terrace while the sub-carrier outer side surface maintains contact with the guide structure inner side surface.

The optical waveguide may include at least one signal line optical waveguide and at least monitor optical waveguide;

the optical functional device may have a signal port and a monitor port formed at positions individually corresponding to the signal optical waveguide and the monitor optical waveguide on the platform; and the monitor optical waveguide of the platform and the monitor port of the optical functional device are optically coupled and, at the same time, the optical functional device may be disposed on the silicon terrace on the platform with the signal optical waveguide and the signal port optically coupled.

According to another aspect of the present invention, one of the foregoing objects can be achieved by providing an opto-electronic hybrid integrated circuit, having: an optical waveguide part including at least one signal optical waveguide and at least one monitor optical waveguide which are formed on a substrate; an optical device mounting part disposed at an end or a way of the optical waveguide; and an optical functional device including a signal port for optically connecting the signal optical waveguide of the optical waveguide part and a monitor port for optically connecting the monitor optical waveguide of the optical waveguide part, wherein the monitor optical waveguide of the platform and the monitor port of the optical functional device are optically coupled and the signal optical waveguide of the optical waveguide part and the signal port of the optical functional device are optically coupled, and the optical functional device may be disposed on the optical device mounting part with optical couples being performed at the same time.

The other end of the waveguide of the individual monitor optical waveguides optically coupled with the optical functional device may be conducted to an end of the opto-electronic hybrid platform.

Two or more optical functional devices are mounted on the opto-electronic hybrid packaged substrate, and the monitor port of each optical functional device may be optically coupled with the monitor optical waveguide connecting the optical functional device monitor port and an end of the opto-electronic hybrid platform or the monitor optical waveguide connecting between the two or more optical functional devices.

The optical functional device mounted on the opto-electronic hybrid platform may have two or more monitor ports, the monitor optical waveguides of a number corresponding to the number of the monitor ports are provided on the opto-electronic hybrid platform; and at least one of the monitor ports may be set to a width wider than the signal port width, or at least one of these signal optical waveguides may be set to a width wider than the signal optical waveguide width.

According to another aspect of the present invention, one of the foregoing objects can be achieved by providing an optical sub-module, having: an optical functional device having an optical device height reference surface at a predetermined distance from an active layer; an optical device holding surface for holding the optical functional device; and a carrier having a carrier height reference surface at a predetermined distance from the optical device holding surface and a carrier electrical wiring; the optical device height reference surface of the optical functional device and the optical device holding surface of the carrier being contacted and fixed, and an active layer side electrode of the optical functional device and the carrier electrical wiring being electrically connected.

The carrier may be formed of a substrate having a protrusion and a recess and a dielectric layer formed on the substrate recess, the optical device holding surface and the carrier height reference surface are formed of the substrate protrusion, and the carrier electrical wiring may be formed on the dielectric layer.

The dielectric layer forming the carrier may be a film-formed material having an electrical wiring layer formed on the surface and inside.

The carrier electrical wiring may be formed on the surface and inside of the carrier.

According to another aspect of the present invention, one of the foregoing objects can be achieved by providing an opto-electronic hybrid integrated circuit, having: an opto-electronic hybrid platform, the platform including: an optical waveguide including an under-clad layer, a core, and an over-clad layer; a silicon terrace, a dielectric layer, and a conductor pattern provided inside or on the surface of the dielectric layer; thickness of the dielectric layer being set so that the height of the conductor pattern may be substantially equal to a height of the optical waveguide over-clad surface; a carrier having an optical device holding surface for holding an optical device, a carrier height reference surface located at a predetermined distance from the optical device holding surface, and a carrier electrical wiring; and an optical device held on the optical device holding surface; wherein the height from the optical functional device active layer to the carrier height reference surface may be set nearly equal to a step between the optical waveguide core and the silicon terrace upper surface; the carrier electrical wiring and an active layer side electrode of the optical functional device are electrically connected forming an optical sub-module; a silicon terrace of the opto-electronic hybrid packaged substrate and the carrier height reference surface of the optical device sub-module contact, and the conductor pattern on the dielectric layer of the opto-electronic hybrid packaged substrate and the carrier electrical wiring of the optical sub-module are electrically connected.

The above and other objects, effects, features and advantages of the present invention will become more apparent from the following description of embodiments thereof taken in conjunction with the accompanying drawings.

BRIEF DESCRIPTION OF THE DRAWINGS

FIG. 1A is an enlarged portion thereof;

FIG. 14A is a cross-sectional view showing a process for forming a silica-based optical waveguide on a substrate;

FIG. 14B is a cross-sectional view showing a step for forming silicon terraces for mounting an optical device and an electrical circuit, respectively;

FIG. 14C is a cross-sectional view showing a step for removing a layer of polyimide which is formed on the terraces as shown in FIG. 14B to expose the terraces; and FIG. 14D is a cross-sectional view showing a step for forming an electrical wiring part on the polyimide layer;

FIG. 16A is a cross-sectional view showing a step for forming a part corresponding to a silicon terrace on a substrate;

FIG. 16B is a cross-sectional view showing a step for forming an under-cladding layer of silica-based optical waveguide in a recess of the substrate;

FIG. 16C is a cross-sectional view showing a step for forming a core pattern and an over-cladding layer on the under-cladding layer;

FIG. 16D is a cross-sectional view showing a step for removing the core pattern and the over-cladding layer to expose the silicon terrace; and FIG. 16E is a cross-sectional view showing a step for forming an electrical wiring part on the under-cladding layer;

FIGS. 63A and 63B are drawings of a process for alignment of an optical functional device which is to be mounted on the circuit of FIG. 62; wherein FIG. 63A is a schematic top plan view showing core adjustment and mounting of an LD array as the optical functional device; and FIG. 63B is a schematic top plan view showing core adjustment and mounting of the modulator array as the optical functional device;

DESCRIPTION OF PREFERRED EMBODIMENTS

Embodiment 1

Figure 9:
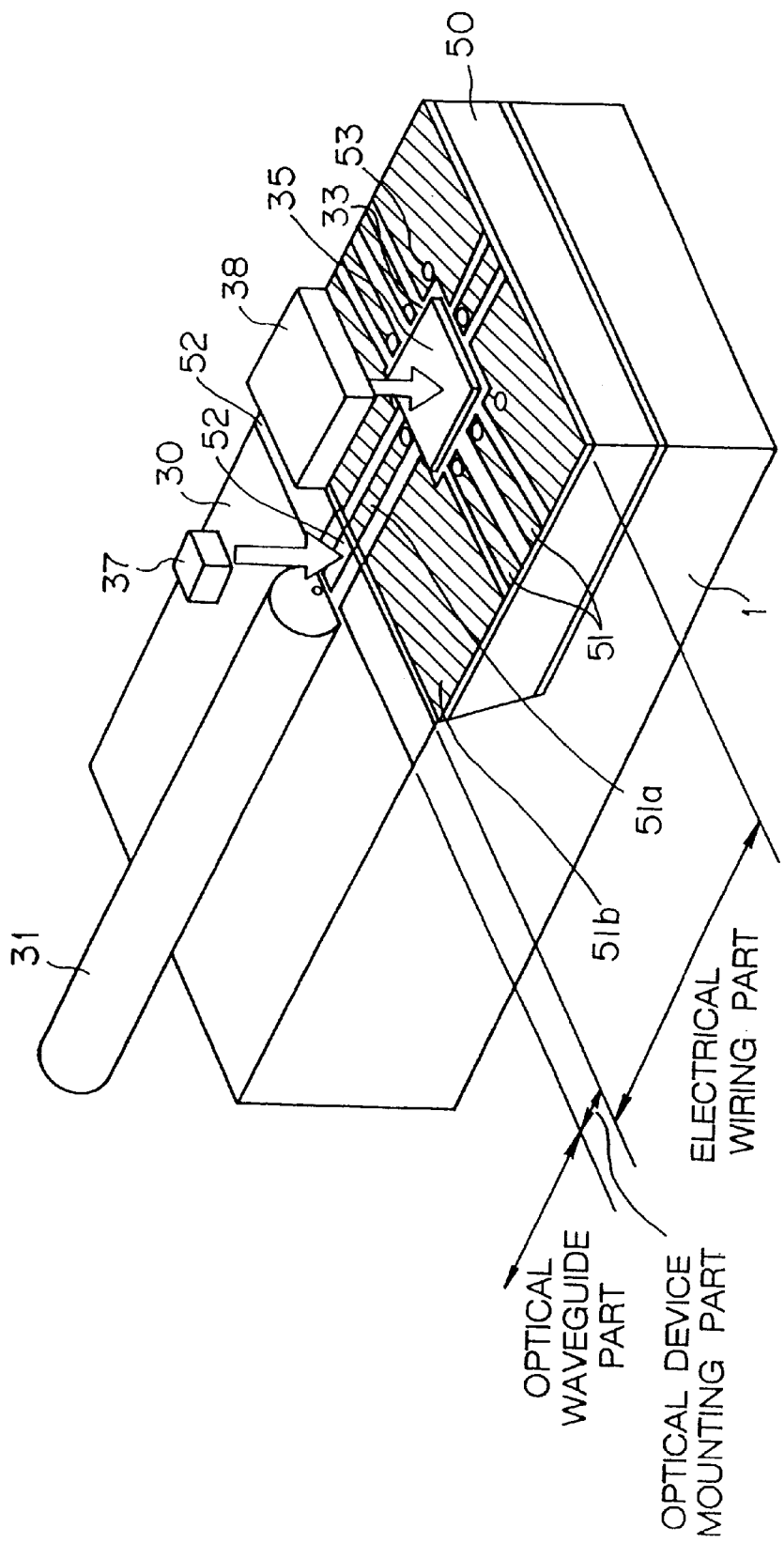
FIG. 9 is Ea schematic perspective view showing a first embodiment of an opto-electronic hybrid integrated circuit according to the present invention.

FIG. 9 is a schematic perspective view showing a first embodiment of the hybrid optical integrated circuit of the present invention. The reference numeral 1 indicates a substrate, and the present embodiment uses a silicon substrate provided with a protrusion and a recess on the surface. The reference numeral 30 indicates a silicon terrace which functions as an optical device mounting part, utilizing the protruded upper surface of the silicon substrate 1. The reference numeral 31 indicates an optical fiber used as an optical waveguide of the present embodiment, which is held in an optimum position in a V-groove provided in the silicon terrace 30. The reference numeral 52 indicates a thin film electrode for contacting with the surface electrode of an optical functional device 37 disposed on the silicon terrace 30, which is formed by patterning 1 $\mu$m thick Au-Sn solder on a 0.5 $\mu$m thermal oxide film provided on the silicon terrace 30 surface. This thin film electrode 52 is electrically connected to a surface electrode pattern 51a, 51b of the optical functional device disposed on the surface of a dielectric layer 50 formed in a recess of the silicon substrate of an electrical wiring portion. The reference numeral 35 indicates a silicon terrace for an electronic circuit. The terrace 35 is surrounded by a dielectric layer 33, and a conductor pattern 51 for an electronic circuit is formed on the surface. In the present embodiment, the silicon recess has an 80 $\mu$m step, the dielectric layer 50 has a thickness of 50 $\mu$m, and the conductor pattern 51 on the dielectric layer 50 is formed by a 5 $\mu$m thick Au plating. As a result, a 25 $\mu$m step is provided between the upper surface of the terrace 35 and the upper surface of the conductor pattern 51.

The present embodiment uses a semiconductor laser (LD) as the optical functional devise 37. The device 37 is put on a device mounting part on the silicon terrace 30 in an upside-down configuration with the active layer facing down, thereby achieving positioning in the height direction between the fiber and LD without a core adjustment. Positioning in the lateral direction may be made by monitoring the optical coupling efficiency of the optical fiber and the LD, or using a guide structure formed at the substrate side without a core adjustment. In this case, the active layer side electrode of the LD 37 contacts the thin film electrode 52 on the silicon terrace 30, and is electrically connected with a conductor pattern of an electronic circuit 38 on the dielectric layer 50. In the thin film electrode 52, solder is heat melted to fix the LD 37 on the substrate. Since, in the present embodiment, the LD is fixed using the thin film electrode 52 on the silicon terrace 30 as shown above, the silicon terrace 30 can be utilized as a heat sink. At the same time, since electrical wiring except the connection with the optical functional device is provided on the dielectric layer 50 having a sufficient thickness, superior high-frequency characteristics can be obtained.

The electronic circuit 38 is disposed on the silicon terrace 35 with the device forming surface facing down. In this case, since the upper surface of the conductor pattern 51 on the dielectric layer 50 is set 25 $\mu$m lower than the upper surface of the silicon terrace 35, when an about 25 $\mu$m thick solder bump 53 is used, the surface of the central portion of the electronic circuit can be contacted to the upper surface of the silicon terrace 35 and, at the same time, the electronic circuit electrode can be contacted with the conductor pattern 51 of the dielectric layer 50 without using an electrical wiring. Therefore, in the present embodiment, heat dissipation of the electronic circuit using the silicon terrace 35 is possible, and a high-frequency electrical wiring is achieved which is not through the silicon substrate 1.

As described above, with the optical/electronic hybrid integrated substrate of the present invention, the optical bench function of the silicon terrace, that is, optical axis positioning function between the optical functional device and the optical fiber, a heat dissipation function of the optical functional device and the electronic circuit can be achieved, and the high-frequency electrical wiring function can be provided.

Embodiment 2

Figure 10:
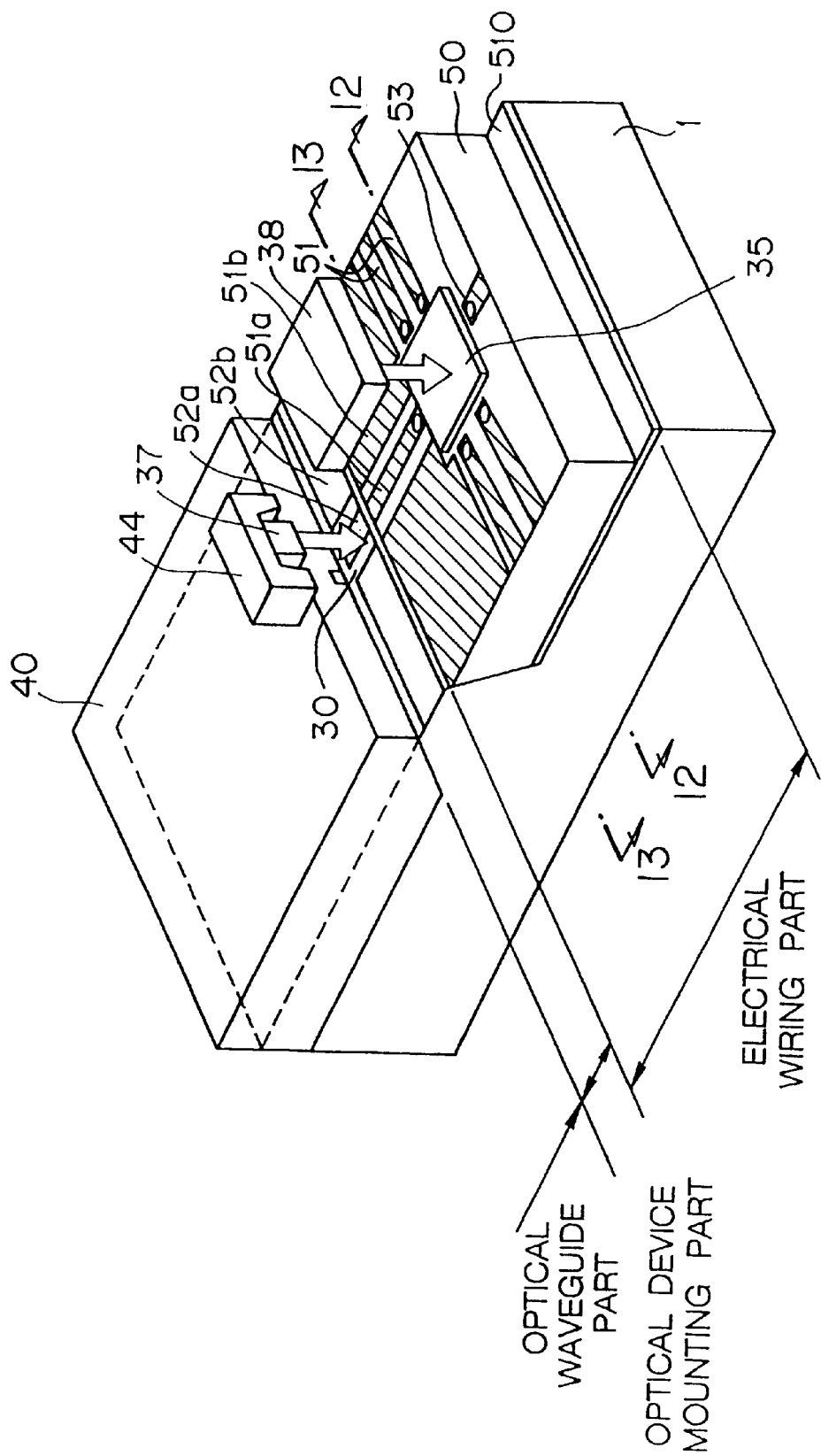
FIG. 10 is a schematic perspective view showing a second embodiment of an opto-electronic hybrid integrated circuit according to the present invention.
Figure 11:
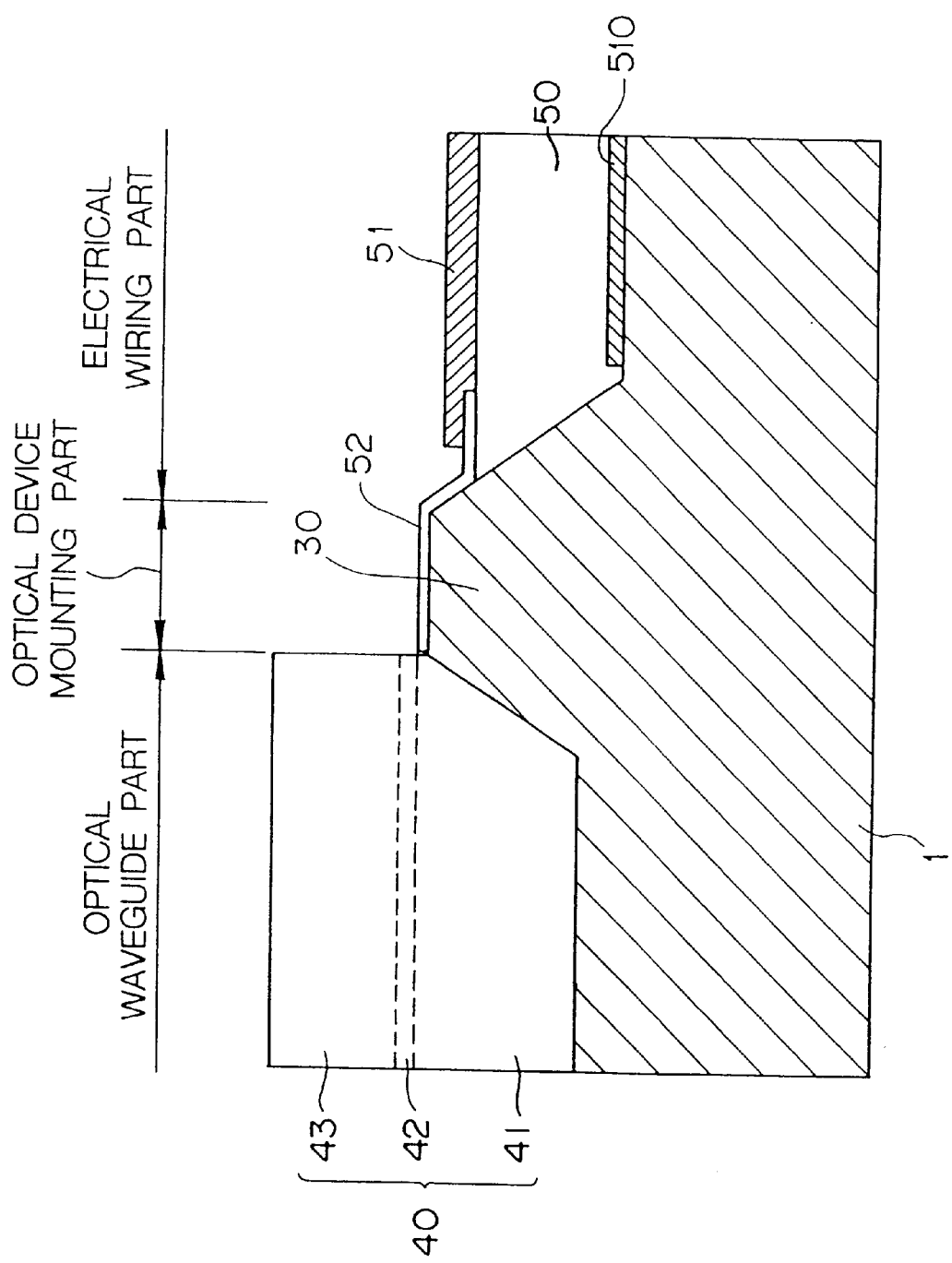
FIG. 11 is a cross-sectional view showing an optical device mounting part of the circuit shown in FIG. 10.
Figure 12:
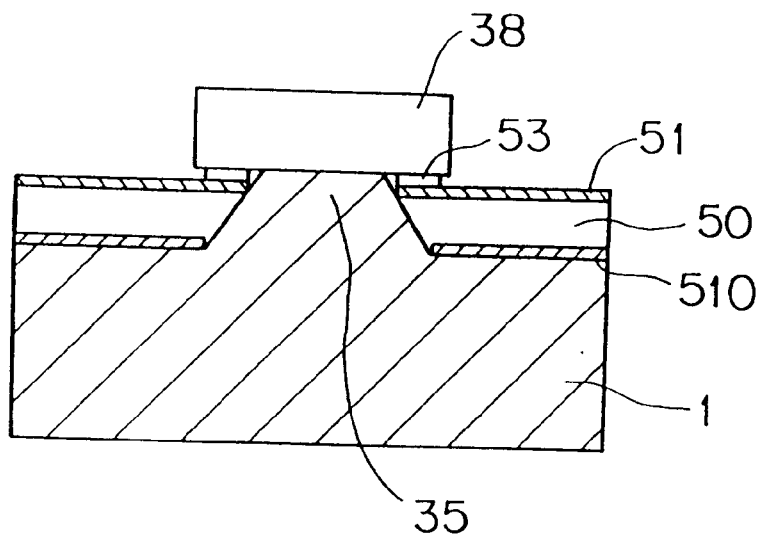
FIG. 12 is a cross-sectional view taken on line 12—12 of FIG. 10.
Figure 13:
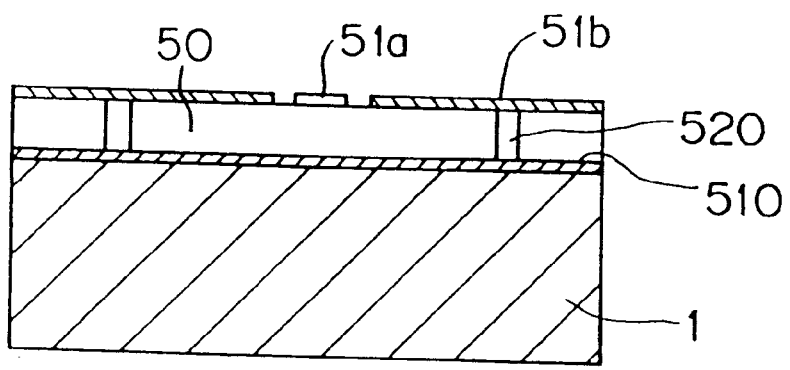
FIG. 13 is a cross-sectional view taken on line 13—13 of FIG. 10.

FIG. 10 is a schematic perspective view showing the entire construction of a second embodiment of the optical/electronic hybrid optical integrated circuit of the present invention. FIG. 11 is a schematic cross sectional view in the vicinity of the circuit shown in FIG. 10, FIG. 12 is a cross-sectional view taken along surface 12—12 in FIG. 10, and FIG. 13 is a cross sectional view taken along surface 13—13 in FIG. 10.

As shown in FIG. 10, the packaged substrate of the present embodiment uses the silicon substrate 1 provided with a protrusion and a recess on the surface as in Embodiment 1. In the optical waveguide unit, a silica-based optical waveguide 40 is formed in the recess of the silicon substrate 1. As shown in FIG. 12, the silicon terrace 35 is provided on an electronic circuit mounting part. In the electrical wiring portion, a dielectric layer 50 comprising a polyimide resin is formed in the recess of the silicon substrate, the conductor patterns 51 and 510 are provided on the surface of and inside the dielectric layer. The silicon terrace 35 for an electronic circuit is disposed at the center of the electrical wiring portion.

As shown in FIG. 11, there is a 17, um step in the silicon recess in the optical waveguide part on the left side of the silicon terrace 30, and the silica-based optical waveguide 40 comprising an under-clad layer 41 (20 µm thick), a core 42 (6 µm×6 µm), and an over-clad layer 43 (15 µm thick) is stacked on top. The waveguide structure is referred to as an "embedded type structure", which has superior optical waveguide characteristics since the core pattern is embedded in a clad layer with a sufficient thickness.

The silicon terrace 30 has an inclined side surface, and the upper surface and the electrical wiring side surface are provided with a thin film electrode 52 formed by patterning a 1 µm thick Au-Sn solder. The distance from the surface of the thin film electrode 52 to the optical waveguide core center is 5 µm. This size is equal to the distance from the surface of the mounted LD to the active layer, and positioning in the height direction of the optical waveguide core 42 and the optical functional device can be achieved without adjustment by mounting the optical functional device on the silicon terrace 30 in the upside-down condition with the surface of the active layer facing down.

The electrical wiring portion on the right of the silicon terrace 30 includes the dielectric layer 50 comprising a 15 µm thick polyimide on the recess of 25 µm depth in silicon, the conductor pattern 51 comprising a 5 µm thick Au pattern formed on the surface, and the conductor pattern 510 formed inside. The conductor pattern 51 on the dielectric layer 50 electrically contacts the thin film electrodes 52 formed on the upper surface and the side surface of the silicon terrace 30. In this case, there is a step of about loam between the surface of the silicon terrace 35 and the surface of the dielectric layer 50, and such electrical wiring can be achieved between two layers with different heights because the side surfaces of the silicon terraces are inclined. When the silicon terrace 30 side surface is formed nearly vertical, it is difficult to electrically connect the two layers without using a wire because the electrical wiring is opened by the step between the thin film electrode on the silicon terrace and the conductor pattern on the dielectric layer.

In the electrical wiring portion, as shown in FIG. 10, the silicon terrace 35 for an electronic circuit is provided at the center, where the electronic circuit is disposed. The electrical wiring connecting the silicon terrace 30 for an optical device and the silicon terrace 35 for an electronic circuit is formed of a coplanar wiring comprising a central conductor 51a and a ground conductor 51b. Electrical wiring around the electronic circuit is formed of a microstrip wiring comprising the surface conductor pattern 51 and the ground conductor 510 provided in the dielectric material. As shown in FIG. 13, the ground conductor 51b of the coplanar wiring and the ground conductor 510 of the microstrip wiring are connected with a through electrode 520 provided in the dielectric layer 50.

Comparing the coplanar wiring and the microstrip wiring, the former can be easily formed since it is formed of a single layer of electrical wiring, but the wiring density is not high. On the other hand, the latter has a multilayer of electrical wiring and requires complex fabrication work, but can achieve a high wiring density. Since, in the present embodiment, polyimide is used, which makes it easy to form a multilayer wiring as a dielectric layer in the electrical wiring portion, formation of the microstrip wiring is possible. By the use of such a packaged substrate structure, integration of the optical functional device and the electronic circuit with a number of connection terminals can be implemented.

The optical functional device 37 mounted on the packaged substrate is a semiconductor laser (LD), which is mounted on a sub-carrier 44, which is formed by processing a heat conductive material such as the silicon substrate. The sub-carrier 44 has a protrusion and a recess formed on the surface, and is fixed so that, after a conductor pattern electrically connected from the protrusion surface to the recess surface, the backside of the LD 37 contacts the recess, and the LD backside and the conductor pattern on the sub-carrier are electrically connected. To mount the LD mounted on the carrier on the silicon terrace 30, the active layer side surface of the LD is faced down and contacted with the silicon terrace 30. The LD active layer side electrode and a first thin film electrode 52a directly contact each other, and the LD backside electrode contacts a second thin film electrode 52b on the packaged substrate through the sub-carrier. In this case, since the distance from the thin film electrode surface on the silicon terrace 30 to the center of the waveguide core 42 and the distance from the LD device to the active layer are in line with each other, positioning in the height direction with the optical waveguide is completed merely by mounting the LD. Positioning within the surface is made by monitoring the coupling effect of the optical waveguide with the LD. The silicon terrace is a reference surface with high precision when mounting the device and, at the same time, functions as a heat sink.

The electronic circuit is mounted on the silicon terrace 35 using a solder bump 53 with the device surface facing down as in Embodiment 1. In this case, as described above, the height of the dielectric layer of the electrical wiring portion and the conductor pattern surface formed thereon is lower than the upper surface of the silicon terrace. As a result, it is possible with this structure to contact/mount the electronic circuit on the silicon terrace, and directly contact all electrodes of the electronic circuit directly with the conductor pattern on the dielectric layer rather than through the electrical wiring on the silicon terrace. Thus, the electronic circuit can be mounted with superior heat dissipation characteristics and high-speed operation.

As described above, in the present embodiment, the silicon terrace for the electronic circuit is provided in the electrical wiring portion, and the height of the conductor pattern surface around the circuit is set lower than the silicon terrace. Therefore, in the optical/electronic hybrid integrated circuit of the present embodiment, the electronic circuit electrodes and the conductor pattern on the dielectric layer can be electrically directly connected using a solder bump and, at the same time, the electronic circuit can be packaged while maintaining contact with the silicon terrace. Further, since the side surface of the silicon terrace is inclined, in spite of the step between the upper surface of the silicon terrace and the conductor pattern on the dielectric layer, the thin film electrode provided on the silicon terrace for the optical device and the conductor pattern on the dielectric layer can be electrically connected. Therefore, the electrode leads of the optical functional device can be provided on the silicon terrace to enhance the heat sink effect, and all electrical wirings other than the electrode leads can be formed on the dielectric layer, thereby achieving superior high-frequency characteristics.

With the present embodiment, the optical bench function, that is, the optical axis positioning function between the optical functional device and the optical fiber and the heat dissipation function of the optical functional device and the electronic circuit are possible, and the high-frequency electrical wiring function can be provided.

Figure 14A:
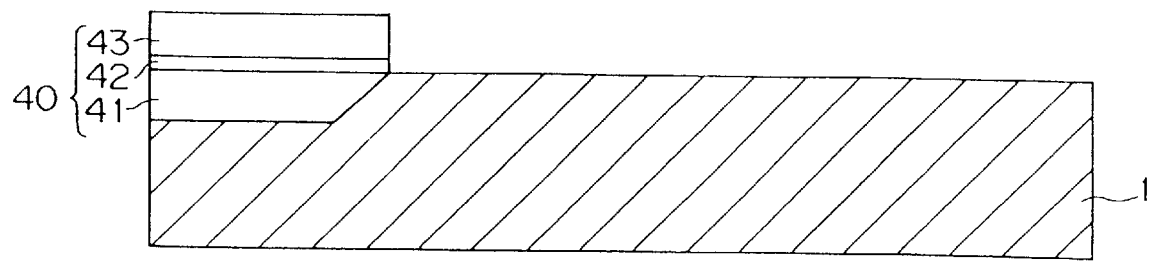
FIGS. 14A to 14D are cross-sectional views showing an embodiment of a process for fabricating a platform according to the present invention wherein, respectively.
Figure 14B:
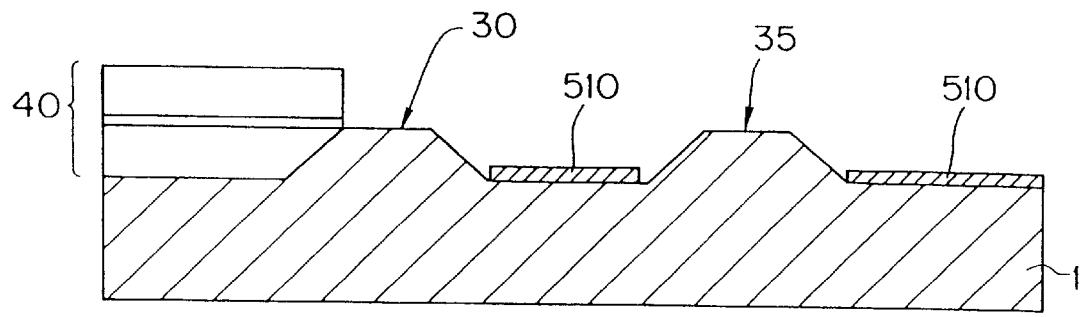
Figure 14C:
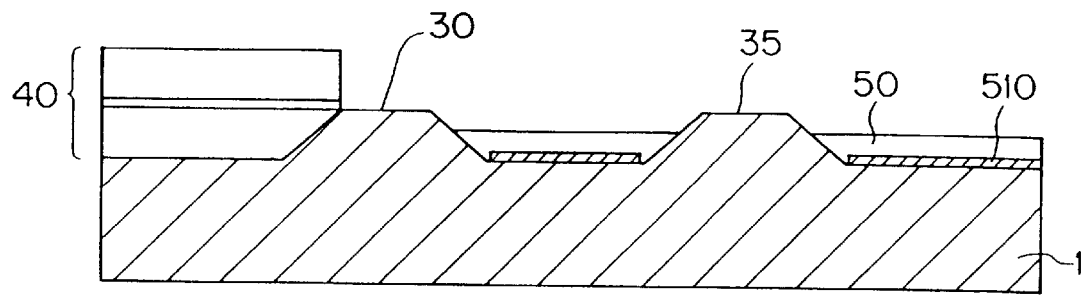
Figure 14D:
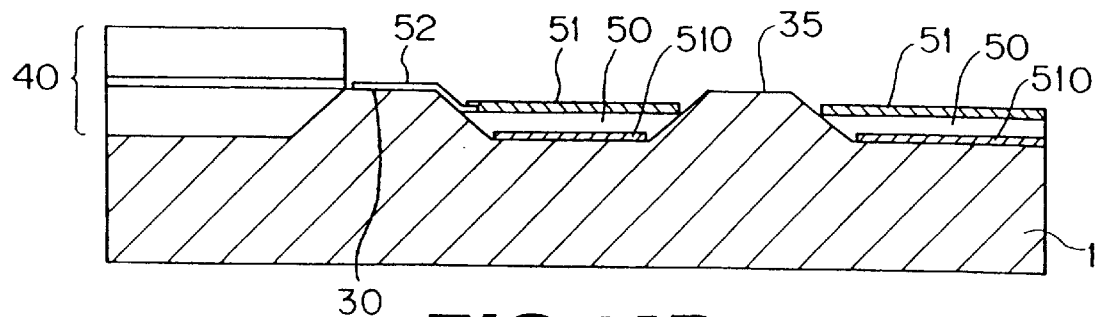

The packaged substrate of the present embodiment can be fabricated, for example, in steps shown in FIG. 14A to 14D. First, by a method described later, a recess is formed on the silicon substrate 1, and the silica-based optical waveguide 40 comprising the under-clad layer 41, the core pattern 42, and the over-clad layer 43 is formed (FIG. 14A). Then, the surface of the silicon substrate 1 is processed to form the silicon terrace 30 for an optical device and the silicon terrace 35 for an electronic circuit. In this case, on the bottom surface of the silicon recess in the vicinity of the silicon terrace 35 for an electronic circuit, the conductor film silicon such as gold or copper is provided as a ground conductor layer 510 (FIG. 14B). On top of it, polyimide is coated and cured as a dielectric material for the electrical wiring portion, unnecessary poly[]imide is removed by dry etching or the like to expose the silicon terraces 30 and 35. Further, the polyimide layer 50 is etched so that the layer is lower by a predetermined step from the silicon terraces (FIG. 14C). Finally, the conductor pattern 51 is formed on the surface of the dielectric material 50, and the thin film electrode 52 is formed to electrically connect with the conductor pattern 51 on the dielectric layer 50 on the silicon terrace 30 for the optical device.

Embodiment 3

Figure 15:
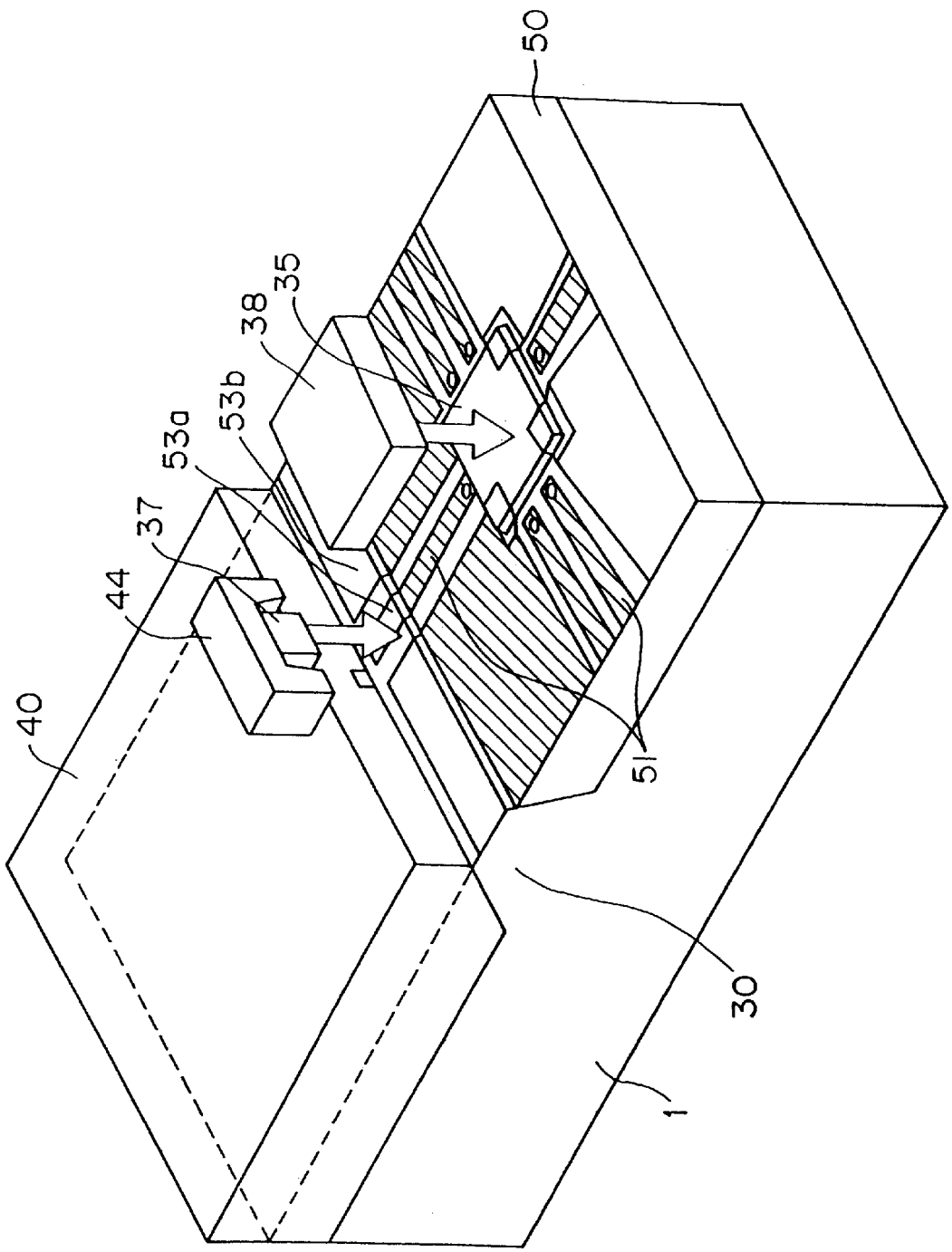
FIG. 15 is a schematic perspective view showing a third embodiment of an opto-electronic hybrid integrated circuit according to the present invention.

FIG. 15 is a schematic perspective view showing the construction of a third embodiment of the hybrid optical integrated circuit of the present invention. A major difference of the present embodiment from Embodiment 2 is that the dielectric layer of the electrical wiring portion is formed using the same material as the optical waveguide.

That is, the silicon recess is formed by providing a 33 μm step from the silicon terrace surface with the optical waveguide and the electrical wiring portion. In the silicon recess corresponding to the optical waveguide, the silica-based optical waveguide 40 having the under-clad 41 (35 μm thick), the core 42 (6 μm×6 μm), and the over-clad 43 (30 μm thick) is formed. On the other hand, on the silicon recess corresponding to the electrical wiring portion, the under-clad layer 41 of the silica-based optical waveguide is formed as the dielectric layer 50. It has a thickness of 25 μm, and is 10 μm lower than the upper surface of the silicon terrace 30 for the optical device and the silicon terrace 35 for the electronic circuit. Since the height of the conductor pattern upper surface of the electrical wiring portion is set lower then the upper surface of the silicon terrace 35, important electrical wiring can all be formed on the dielectric layer 50 and connected using a solder bump, and the electronic circuit and the silicon terrace 35 can be contacted. Therefore, the packaged substrate has high-frequency electrical characteristics and a good device heat dissipation function.

Figure 16A:
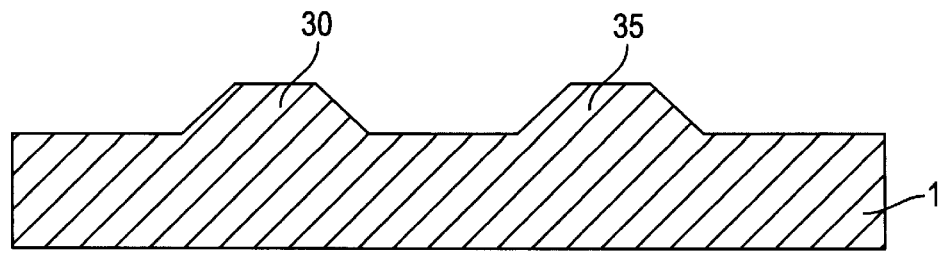
FIGS. 16A to 16E are cross-sectional views showing another embodiment of a process for fabricating a platform according to the present invention wherein, respectively.
Figure 16B:
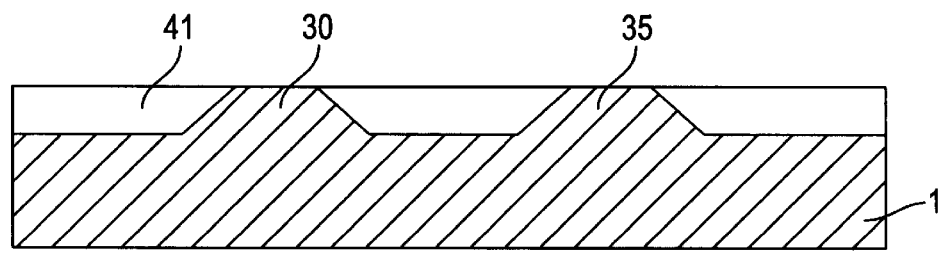
Figure 16C:
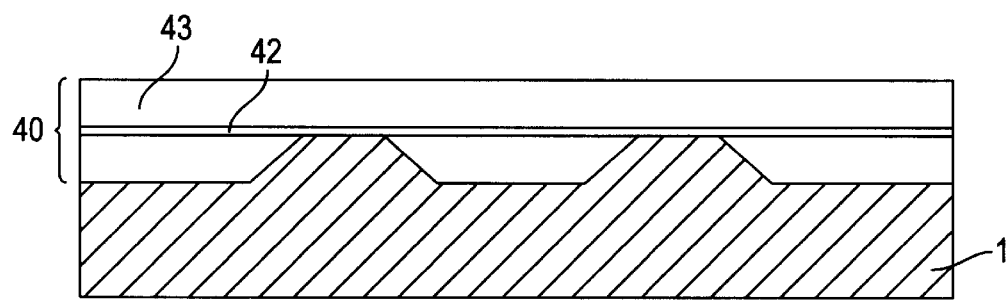

The structure of the present embodiment, in which the dielectric material of the electrical wiring portion and the optical waveguide are formed of the same material, has the effect of simplifying the substrate formation step. For this effect, the substrate formation process will be described with reference to FIGS. 16A to 16E. A first step of the substrate fabrication is to form steps corresponding to the silicon terraces 30 and 35 on the substrate 1 (FIG. 16A). In the present embodiment using silicon as the substrate, a desired step can be formed by anisotropic etching using an alkali etching solution such as KOH. By appropriately selecting the crystal orientation of the silicon substrate, the silicon terrace side surfaces can be formed with an inclination of about 7° as shown. After that, the under-clad layer 41 of the dielectric optical waveguide 40 such as a silica-based optical waveguide is formed on the substrate recess, and the surface is flattened by polishing or the like (FIG. 16B). Then, the core pattern 42 and the over-clad layer 43 of the optical waveguide are formed (FIG. 16C). After that, the optical waveguide formed in the region of the electrical wiring including the silicon terraces are removed by etching to expose the silicon terraces. At this time, in the etching step of the silica-based optical waveguide and the polymer waveguide (polyimide optical waveguide, etc.), that is, in reactive ion etching using a mixture of $CF_4$ and $H_2$ or $O_2$ gas as an etchant, the silicon substrate 1 can be used as an etching stop layer. Therefore, when the silicon terraces 30 and 35 are exposed as the etching advances, etching of the surface does not advance.

Figure 16D:
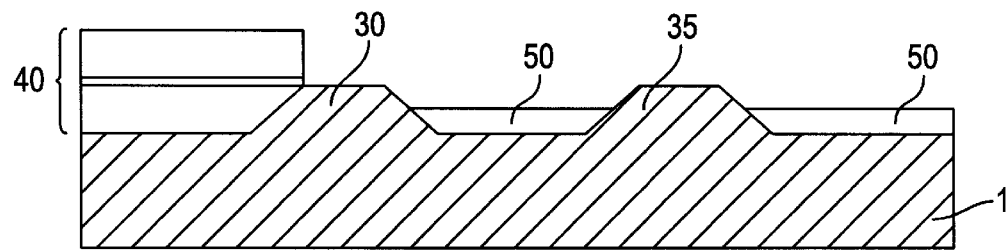

On the other hand, etching of the optical waveguide portion is continued. As a result, the step between the dielectric surface of the electrical wiring portion and the silicon terraces can be formed by a single etching step (FIG. 16D).

Figure 16E:
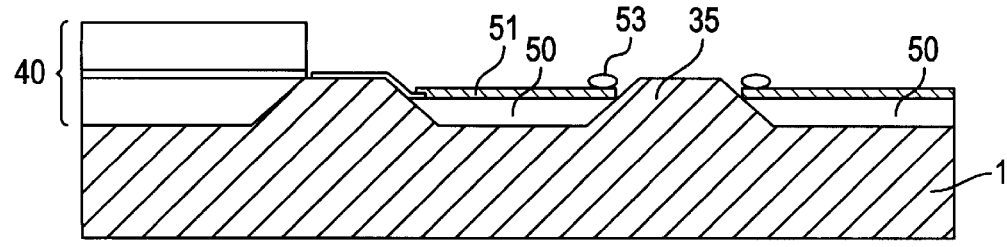

Finally, the conductor pattern is formed on the dielectric surface of the electrical wiring portion, and the thin film electrodes are formed on the surface and the inclined surface of the silicon terrace to form the packaged substrate of the present embodiment (FIG. 16E). In this case, an anisotropic etching of the silicon substrate is used in the step shown in FIG. 16A, an inclination can be automatically formed on the silicon terrace side surface. Since this method can easily form the inclination of the silicon terrace side surface, even with a step between the silicon terrace and the upper surface of the dielectric layer, the electrical wiring can be formed without an open circuit between both.

Thus, by forming the dielectric optical waveguide and the dielectric layer of the electrical wiring portion using the same material, the fabrication process can be simplified compared to formation of both parts with different materials.

Further, that the silicon terrace side surface is inclined as described above, rather than formed vertically, has the effect of considerably relaying the difficulty of packaged substrate fabrication. That is, when the silicon terrace side surface is formed nearly vertical, for example, in the packaged substrate in FIG. 9, if there is a step between the silicon terrace 30 for the optical device and the upper surface of the dielectric layer 50, it is difficult to electrically connect the thin film electrode 52 on the silicon terrace 30 and the conductor pattern 51a on the dielectric layer 50. Therefore, formation of the upper surface of the silicon terrace and the upper surface of the dielectric layer without a step in the process of FIG. 16D in order to achieve an electrical wiring as shown in FIG. 9 using a silicon terrace having a vertical side surface requires very high control over the etching time and etching rate of the optical waveguide, which makes fabrication of the packaged substrate of this structure extremely difficult. This difficulty is eliminated by inclining the side surface of the silicon terrace as described above.

Embodiment 4

Figure 17:
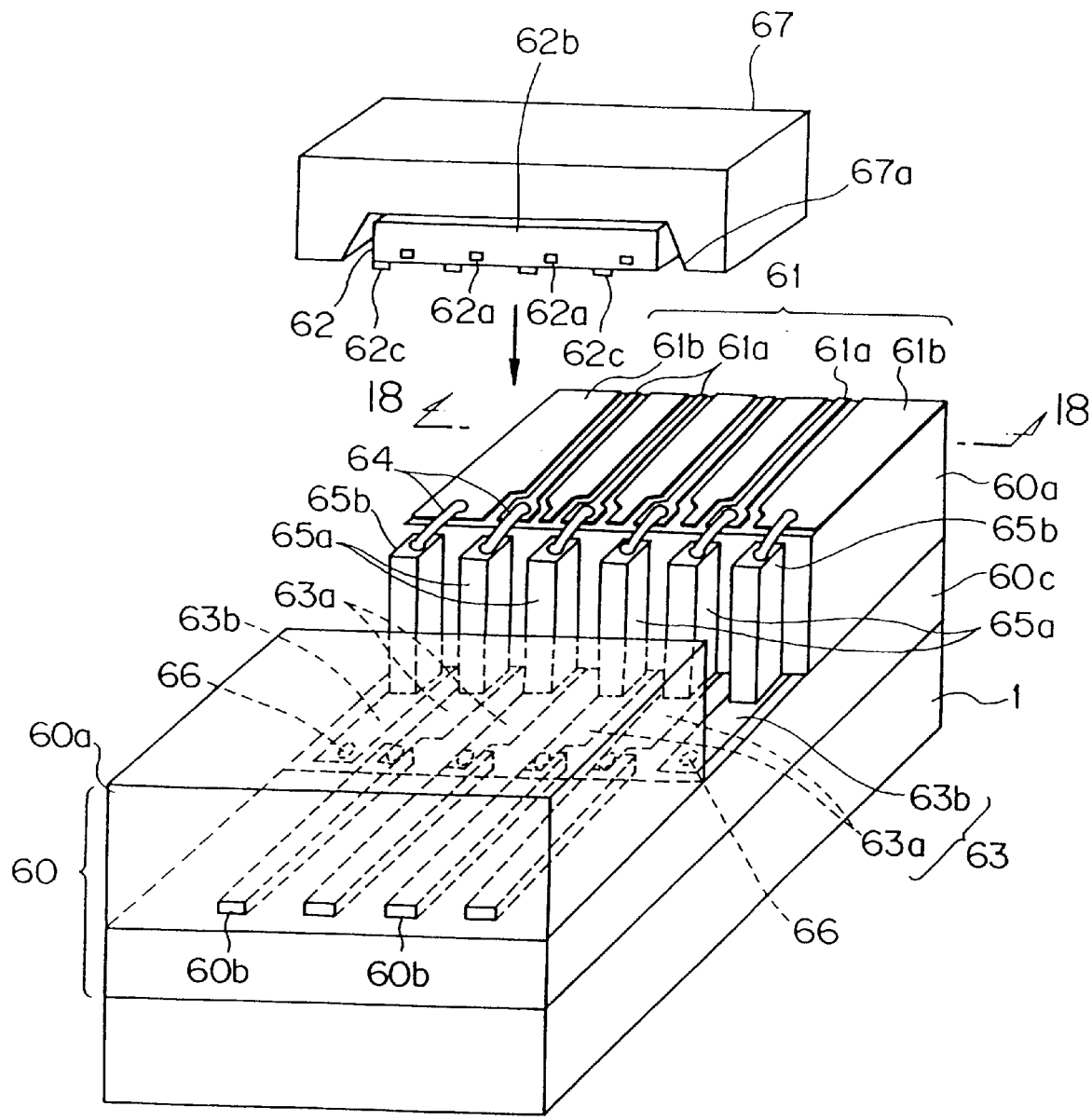
FIG. 17 is a schematic perspective view showing a fourth embodiment of an opto-electronic hybrid integrated circuit according to the present invention.
Figure 18:
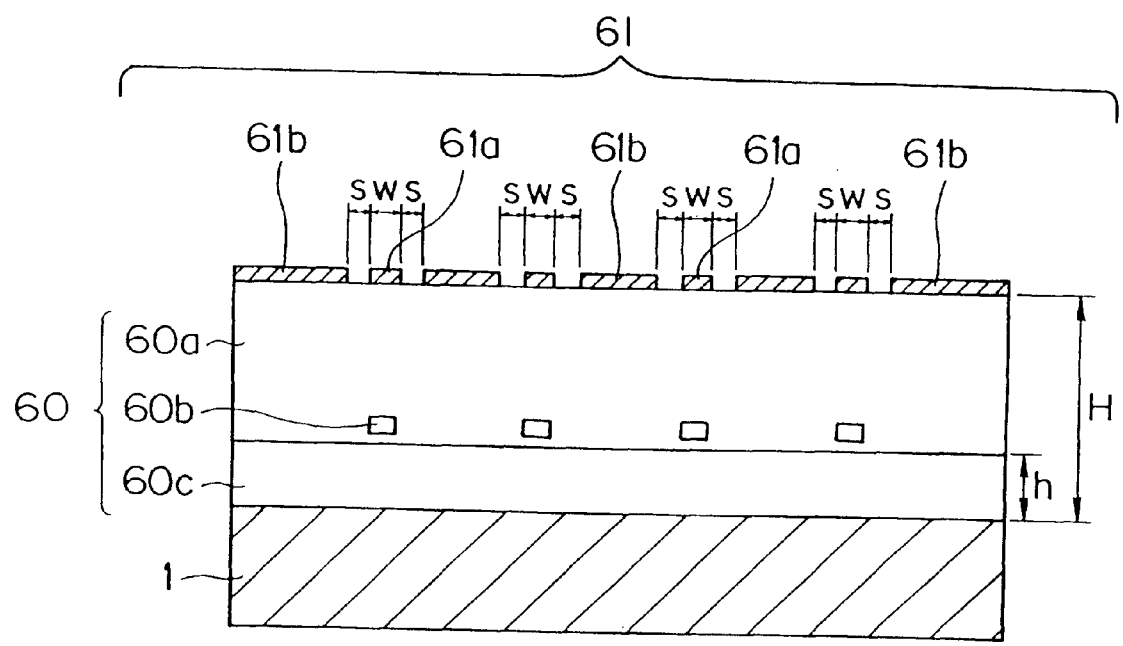
FIG. 18 is a cross-sectional view taken on line 18—18 of FIG. 17.

FIG. 17 is a schematic perspective view of a fourth embodiment of the hybrid optical integrated circuit of the present invention, and FIG. 18 is a schematic cross-sectional view taken along line 18—18 in FIG. 17. The Figures show an embedded type optical waveguide 60 in which an under-cladding layer 60c, a core 60b, and an over-cladding layer 60a are integrated on the silicon substrate 1. Since the example shown in FIG. 17 is intended to mount a 400 μm pitch 4-array optical device, the cores 60b are arranged at 400 μm intervals.

As shown in FIG. 18, a coplanar line 61 comprising central conductors 61a at 400 μm intervals and ground conductors 61b is formed. A width W of the central conductor 61a, a gap interval S between the central conductor 61a and the ground conductor 61b, and a thickness H of the silica-based waveguide layer between the coplanar line 61 and the silicon substrate 1 are important parameters affecting the high-frequency characteristics of the coplanar line 61. The parameters will be described later with reference to a table.

A mounting part 63 of an optical device 62 is formed by etching the over-cladding layer 60a to expose the upper surface of the under-cladding layer 60c, where electrical wiring layers 63a and 63b are formed. In this case, a 5 μm thick Au plated wire is used for the electrical wiring layers 61a, 61b, 63a, and 63b, and the length of the wiring layers 63a and 63b is set to less than 1 mm to reduce the loss.

The central conductors 61a of the four coplanar lines 61 are connected by gold ribbon wires 64 to copper guide posts 65a (called ground posts) connected to the electrical wiring layer (electrodes 63a on the under-clad 60c), and connected to four electrodes 62c under the optical device 62 through a solder pattern 66 comprising a gold-tin alloy.

The ground conductor 61b of the coplanar line 61 is similarly connected to the guide post 65b by a gold ribbon wire 64, connected to the electrical wiring layer (electrodes 63b on the under-clad 60c), and connected to the electrical wiring layer 67a of a silicon sub-carrier 67 through the solder pattern 66. Here, the silicon sub-carrier is formed on the surface with a conductive layer 67a, and held by connecting the electrode 62b on the backside of the optical device 62 to the conductive layer 67a of the recess by gold-tin solder. Therefore, with the optical device 62 mounted on the mounting part 63, it is possible to high-frequency drive with the four arrays by the coplanar line 61.

With the optical device 62 mounted on the mounting part 63, four active layers 62a of the optical device 62 are optically coupled with the core 60b of the silica-based optical waveguide at the front side in FIG. 17. In the present embodiment, the positions of the electrode 62b and solder pattern 66 of the optical device 62 are shifted to the side from directly beneath the active layer 62a of the optical device 62, thereby preventing stress due to mounting of the optical device from directly acting on the active layer.

Here, the S parameter $S_{21}$ and axis deviation as an optical bench function will be considered on the main parameters W, S, and H which affect the high-frequency characteristics of the coplanar line.

TABLE 1

Embodiment 4 of the present invention
(structural parameter dependence of CPW line)

| | HF electrical wiring function | | | | | Optical bench function Axis deviation of arrayed |
|---|---|---|---|---|---|---|
| | Thickness of under-clad | Total thickness of silica-waveguide | Structural parameter of cpw line | $S_{21}$ (dB/cm) | | optical device and optical waveguide end face |
| | h (μm) | H (μm) | (w, s) | 2 GHz | 10 GHz | (μm) |
| Embodiment I-1 | 24.0 | 60.0 | (320,20) | −1.2 | −2.3 | 0.7 |
| Embodiment I-2 | 24.0 | 60.0 | (160,20) | −0.8 | −1.6 | 0.7 |
| Embodiment I-3 | 24.0 | 60.0 | (80,20) | −0.6 | −1.1 | 0.7 |
| Embodiment I-4 | 24.0 | 60.0 | (40,20) | −0.4 | −0.7 | 0.7 |
| Embodiment I-5 | 24.0 | 60.0 | (20,20) | −0.3 | −0.6 | 0.7 |

H: Here, the core is 6 μm, and the upper clad is 30 μm, and H = h + 36.
cpw: Coplanar
Arrayed optical device: 4-arrayed optical device with 400 μm pitch.

Table 1 shows the relationship between w and s and transmission loss $S_{21}$ of the coplanar line, and the silicon substrate 1 has an average resistivity of less than 1 ohm-cm. For parameters W and S, since patterning is made by coating a resist on the substrate having a several tens 1 step such as silica-based optical waveguide, it is difficult to form less than 20 μm with good repeatability. Therefore, w and s are more than 20 μm. In Table 1, the thickness h of the under-clad 2c is 24 μm, and the thickness H of the entire silica-based waveguide is 60.0 μm, and w is varied from Embodiment I-1 to Embodiment I-5. As a result, the S parameter $S_{21}$ is smallest when w and s are smallest, and the loss is the smallest. Since, in Table 1, the thicknesses h and H are not varied, the axis deviation is a constant value of 0.7 μm even with 4 arrays.

TABLE 2

Embodiment 4 of the present invention
(structural parameter dependence of CPW line)

| | HF electrical wiring function | | | | | Optical bench function Axis deviation of arrayed optical device and optical waveguide end face |
|---|---|---|---|---|---|---|
| | Thickness of under-clad | Total thickness of silica-waveguide | Structural parameter of cpw line | $S_{21}$ (dB/cm) | | |
| | h (μm) | H (μm) | (w, s) | 2 GHz | 10 GHz | (μm) |
| Reference II-1 | 10.0 | 46.0 | (20,20) | −0.8 | −1.6 | 0.6 |
| Embodiment II-2 | 14.0 | 50.0 | (20,20) | −0.6 | −1.2 | 0.6 |
| Embodiment II-3 | 20.0 | 56.0 | (20,20) | −0.4 | −0.8 | 0.6 |
| Embodiment II-4 | 24.0 | 60.0 | (20,20) | −0.3 | −0.6 | 0.7 |
| Embodiment II-5 | 54.0 | 90.0 | (20,20) | −0.3 | −0.5 | 0.8 |
| Embodiment II-6 | 84.0 | 120.0 | (20,20) | −0.2 | −0.4 | 1.0 |
| Reference II-7 | 104.0 | 140.0 | (20,20) | −0.2 | −0.4 | 1.2 |

H: Here, the core is 6 μm, and the upper clad is 30 μm, and H = h + 36.
cpw: Coplanar
Arrayed optical device: 4-arrayed optical device with 400 μm pitch.

Table 2 utilizes the results of Table 1 so that (w, s)=(20,20) μm where $S_{21}$ is smallest, and S parameter and axis deviation are picked up when the thickness h of the under-clad 60c and H are varied. In Reference Examples II-1 and II-7, the prior art structure is applied, and in Reference Examples II-2 to II-6, h and H are varied. As a result, good results are shown in the vicinity of H=50 to 90. Axis deviation is caused by warping of the substrate due to the thickness of the clad, which leads to an increase in coupling loss.

Table 2 will be described in detail. As to the thickness H dependence, in general, loss in the high-frequency region must be less than 1.0 dB/cm and, considering wide applications of the hybrid substrate of the present embodiment, it is required to be less than 1.5 dB/cm. From Table 2, to reduce the loss to less than 1.5 dB/cm, the total thickness H of the silica layer must be more than 50 μm.

Figure 19:
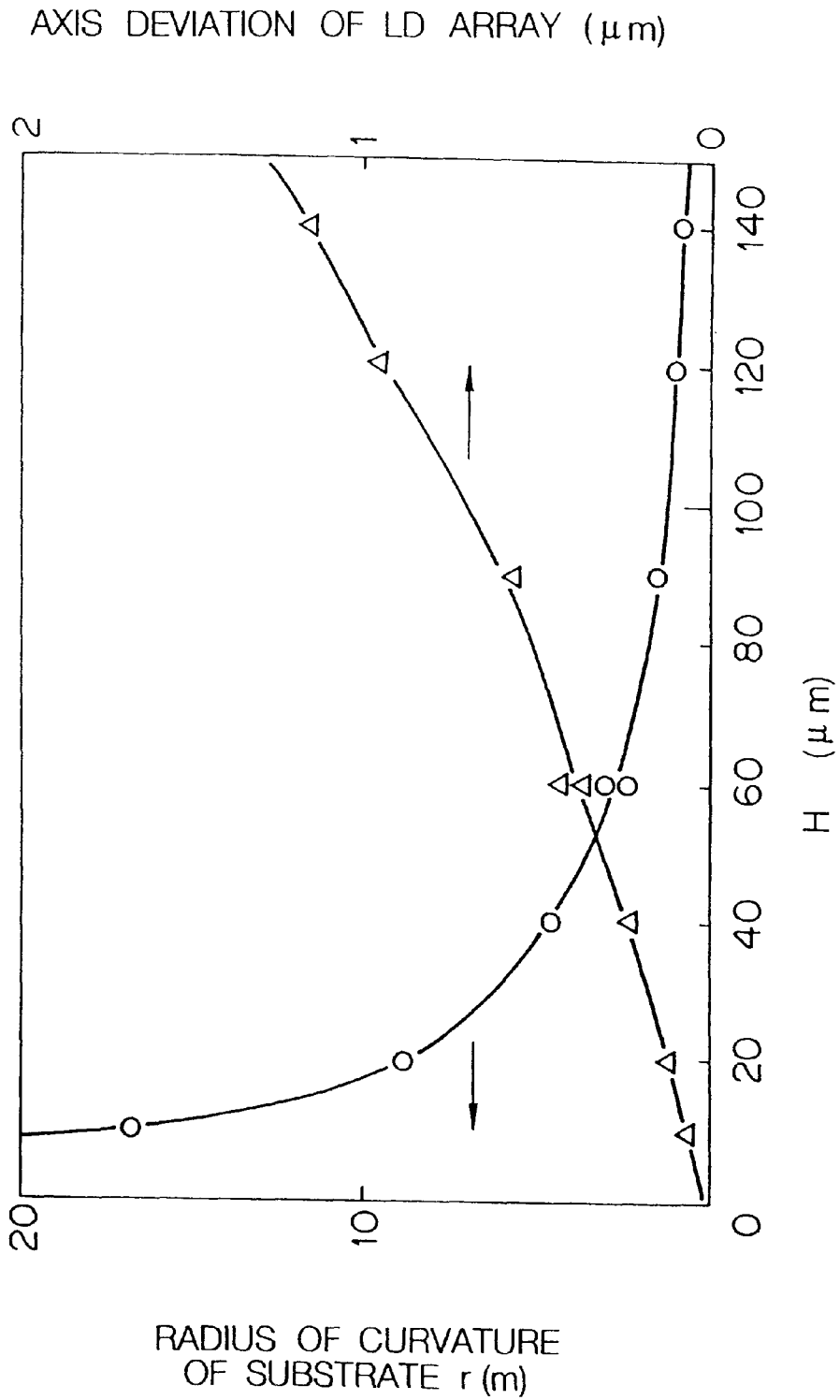
FIG. 19 is a graph illustrating the curvature radius of the substrate and the axis deviation between LD array and an optical waveguide core.

Further, for the hybrid substrate to maintain a good optical bench function, warping of the substrate must be small. In FIG. 18, since the silica-based optical waveguide layer and the silicon substrate 1 differ in thermal expansion coefficient, warping of substrate increases as H increases. When warping of the substrate is increased, the optical waveguide end face and optical device, for example, the active layer of the LD array, causes dislocation, resulting in optical coupling loss and impairing the optical bench function. Since the opto-electronic hybrid packaged substrate is required to be developed to 4×4 switches and the like, it is required that, for example, a 4-array LD module or the like is mounted on the substrate to deal with array application of the optical device. As a result, the value in the right column of Table 2 (axis deviation) is required to be decreased. FIG. 19 shows the relationship of the thickness H of the silica layer on the silicon substrate, warping of the silicon substrate (curvature radius), and the axis deviation in a 400 μm interval 4-array LD module. It can be seen from the Figure that the thickness H must be less than 120 μm to reduce the axis deviation to less than 1 μm.

In summary, in the silica-based optical waveguide in FIG. 18, to satisfy the high-frequency electrical wiring function and the optical bench function for mounting the optical device, H is required to be more than 50 μm and less than 1204 μm.

As can be seen from Table 1 and Table 2, the example shown in FIG. 17 is practically and optimally usable as a low-loss optical waveguide, which uses a hybrid optical integrated substrate of under-clad h=30 μm, core diameter= 6×6 μm, over-clad=3 μm, and total silica layer=66 μm. Further, transmission loss of the optical waveguide shown in FIG. 17 is less than 0.1 dB/cm, and when LD is used as an optical device, good characteristics are obtained in high-speed modulation of 10 GHz for the 4 arrays.

Thus, the present embodiment has a low-loss optical waveguide function, an optical bench function with reduced axis deviation, and a high-frequency electrical wiring function with reduced $S_{21}$.

Figure 20:
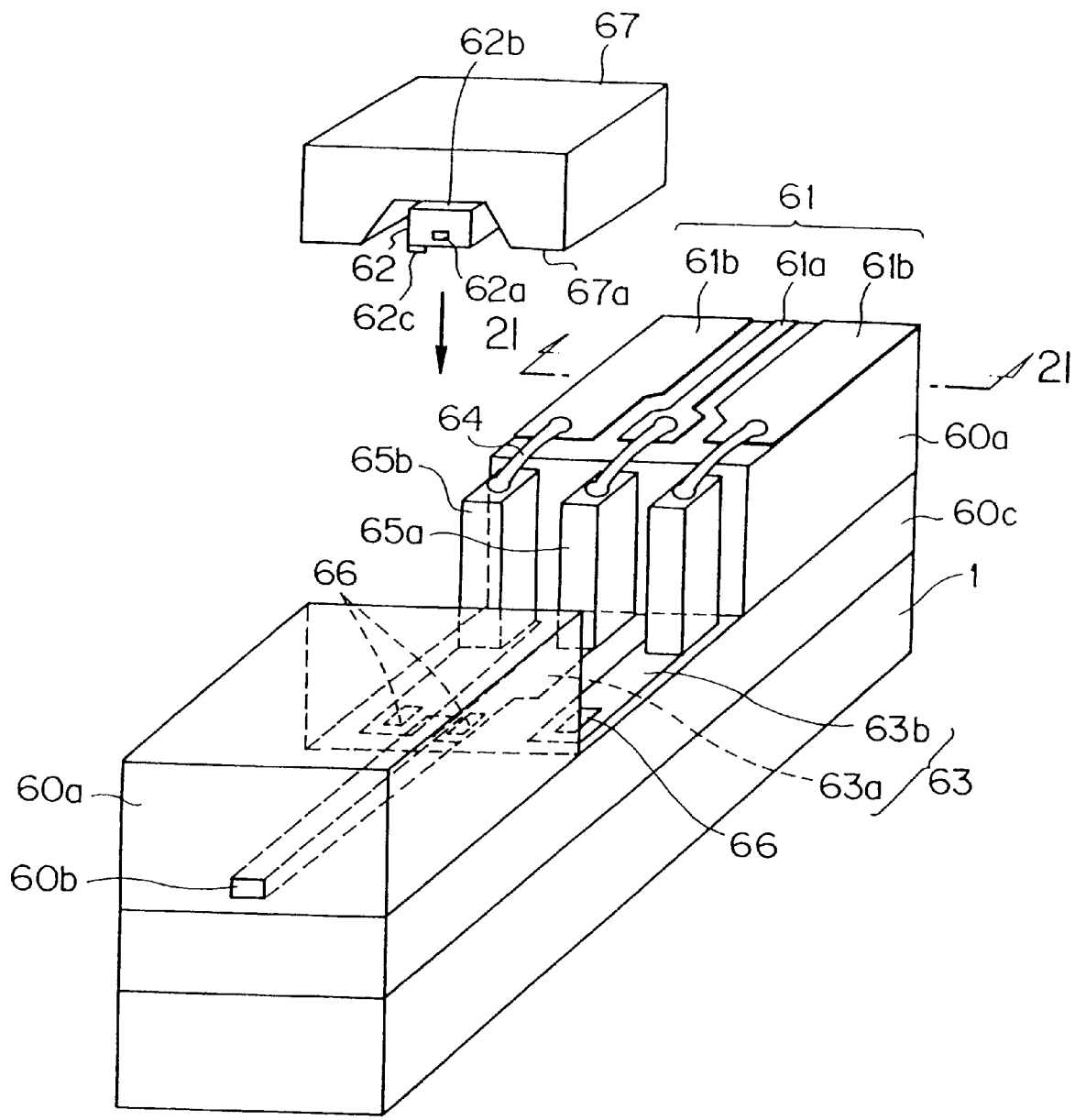
FIG. 20 is a schematic perspective view showing an optical device as a single body corresponding to the array optical device as shown in FIG. 18.
Figure 21:
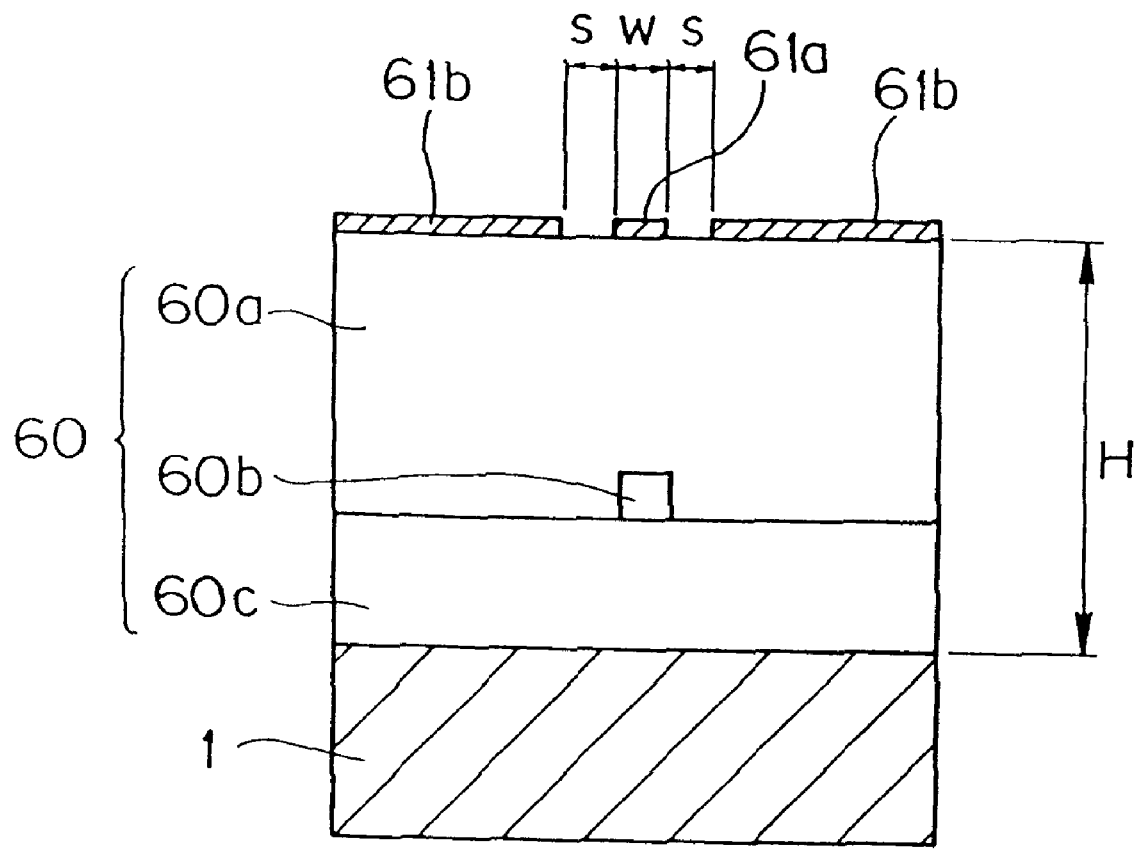
FIG. 21 is a cross-sectional view taken on line 21—21 of FIG. 20.

FIGS. 20 and 21 show the 4-array of FIG. 17 divided into discrete devices. In this case, since it is not an arrayed device but the arrayed device is divided into discrete devices, even when warping of the substrate occurs, no axis deviation occurs, and it has the above three functions even except the condition of the thickness H of less than 120 μm. On the contrary, when discrete devices are combined into an array, the condition of thickness H of less than 120 μm is added.

Figure 22:
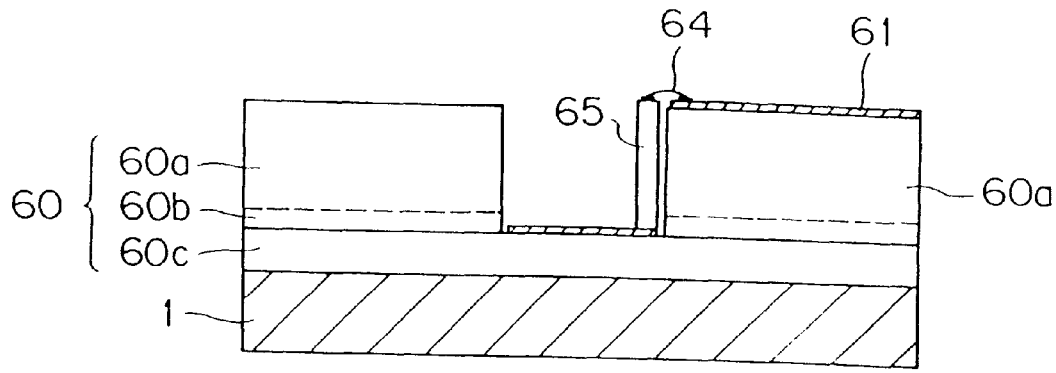
FIG. 22 is a cross-sectional side view showing the circuit as shown in FIG. 18.
Figure 23:
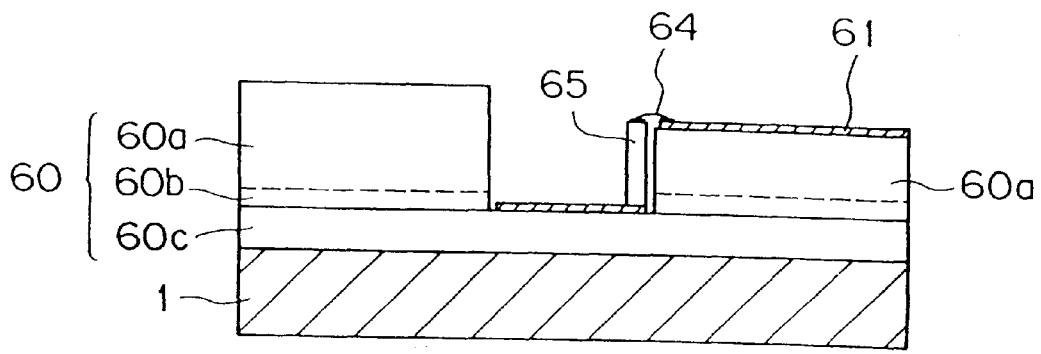
FIG. 23 is a cross-sectional side view showing a circuit whose coplanar wiring part is lowered as compared to FIG. 18.
Figure 24:
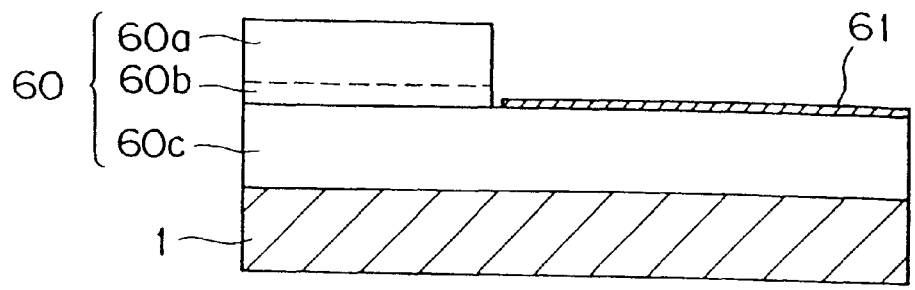
FIG. 24 is a cross-sectional side view showing a circuit whose coplanar wiring part is formed on an under-cladding part, and whose under-cladding part is thick as compared to FIG. 18.

In the present embodiment, the coplanar line 61 is formed on the surface of the over-clad, but the coplanar line can also be formed in other positions. FIG. 22 shows a side view of FIG. 17, FIG. 23 shows a side view in which the over-clad 60a under the coplanar line 61 is made thin, and FIG. 24 shows a side view in which the entire under-cladding layer 60c is made thicker, and the coplanar like 61 is formed directly on the under-clad 60c. As in the examples shown in FIGS. 23 and 24, even when the height of the coplanar wiring layer is set lower than the upper surface of the over-clad of the optical waveguide, it can also be used as a good opto-electronic packaged substrate as well.

Embodiment 5

Embodiment 4 was an example using a general-purpose silicon substrate (resistivity: up to 1 ohm-cm). On the other hand, the high-frequency electrical wiring function can be even further improved by increasing the resistivity of the silicon substrate. This enables a thinner silica-based optical waveguide between the coplanar line and the silicon substrate, and construction is possible as shown in FIG. 25 in which the high-frequency line can be placed on a thinner under-clad 2c, thereby expanding the application.

Figure 25:
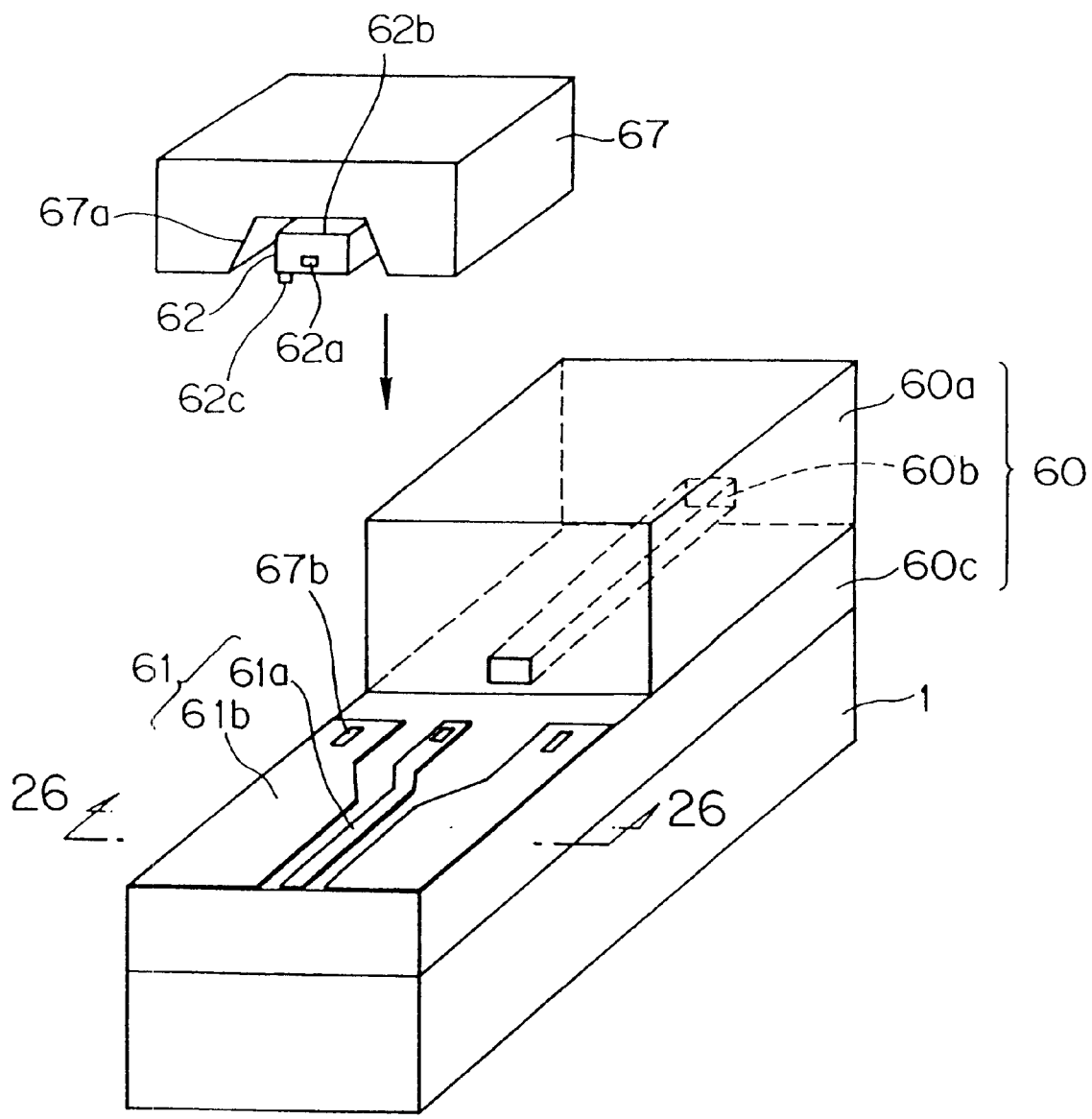
FIG. 25 is a schematic perspective view showing a fifth embodiment of an opto-electronic hybrid integrated circuit according to the present invention.
Figure 26:
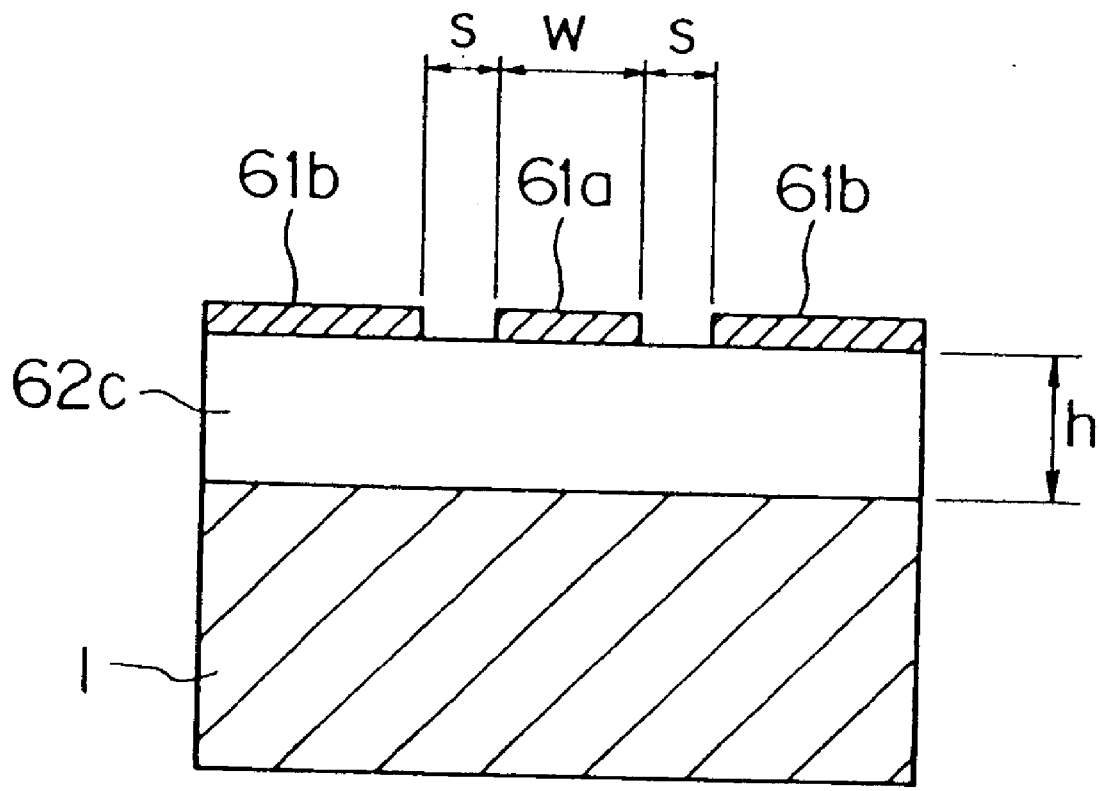
FIG. 26 is a cross-sectional view taken on line 26—26 of FIG. 25.

First, for the structural parameter of the substrate used in FIG. 25, optimization is made in view of the high-frequency electrical wiring function and the optical bench function by FIG. 26 which has the same structure as the line 26—26 cross sectional view of the high-frequency electrical wiring portion in FIG. 25. In FIGS. 25 and 26, the reference numeral 61a indicates a central conductor of the coplanar line, 61b indicates a ground conductor, 61c indicates an under-cladding layer, and 1 is a silicon substrate having a higher resistance than Embodiment 1 shown in FIG. 17.

In FIG. 25, 67 is a sub-carrier of silicon, and the optical device 62 is held in the recess. A conductive layer 67a is formed on the surface of the sub-carrier 67, which electrically connects with the backside of the optical device 62. By connecting both legs of the sub-carrier to solder pattern 67b, the coplanar line 61 and the electrode 62b on the backside of the optical device 62 are electrically connected. On the other hand, the electrode 62c on the side of the active layer of the optical device is connected by a solder pattern 67b formed on the central conductor 61a of the coplanar line 61, and the optical device 62 can be operated by the coplanar line. Further, the silicon sub-carrier 67 absorbs heat generated in the optical device, and dissipates the heat to the air or the coplanar line 61. In the present embodiment, the position of the solder pattern 67b connecting to the electrode 62c of the optical device 62 is shifted to the side from directly beneath the active layer 62a of the optical device, thereby preventing a stress associated with mounting of the optical device from acting directly on the active layer.

Main parameters affecting the high-frequency characteristics of the coplanar line are thickness h of the silica under-cladding layer between the coplanar line and the silicon substrate, width w of the central conductor 61a of the coplanar line, and gap spacing s between the central conductor 61a and the ground conductor layer 61b of the coplanar line.

Relationship between the parameters S and W and S parameter $S_{21}$ representing loss of the coplanar line is shown in Table 3, and the S parameter $S_{21}$ and axis deviation by the thickness of the under-clad 2c based on s and w of Table 3 are shown in Table 4.

The silicon substrate uses one which has an average resistivity of up to 50 ohm-cm. For w and s, since patterning is made by coating a resist on the substrate which has a step of several tens um such as silica-based optical waveguide and the like, it is difficult to form in less than 20 $\mu$m with good reproducibility. Further, FIGS. 25 and 26 are examples of discrete optical devices, and Table 4 shows axis deviation due to warping of the substrate when a 4-array optical device is mounted in 400 $\mu$m pitch.

First, changes in conductor width w which is structural parameter of the coplanar line and S parameter $S_{21}$ by the gap s are shown in Table 3.

TABLE 3

Embodiment 5 of the present invention
(structural parameter dependence of CPW line)

| | | HF electrical wiring function | | | | Optical bench function Axis deviation of arrayed |
|---|---|---|---|---|---|---|
| | Thickness of under-clad | Total thickness of silica-waveguide | Structural parameter of cpw line | $S_{21}$ (dB/cm) | | optical device and optical waveguide end face |
| | h ($\mu$m) | H ($\mu$m) | (w, s) | 2 GHz | 10 GHz | ($\mu$m) |
| Embodiment III-1 | 30.0 | 66.0 | (320,20) | −1.0 | −3.2 | 0.4 |
| Embodiment III-2 | 30.0 | 66.0 | (160,20) | −0.7 | −2.4 | 0.4 |
| Embodiment III-3 | 30.0 | 66.0 | (80,20) | −0.5 | −1.6 | 0.4 |
| Embodiment III-4 | 30.0 | 66.0 | (40,20) | −0.5 | −1.1 | 0.4 |
| Embodiment III-5 | 30.0 | 66.0 | (20,20) | −0.5 | −1.0 | 0.4 |

H: Here, the core is 6 $\mu$m, and the upper clad is 30 $\mu$m, and H = h + 36.
cpw: Coplanar
Arrayed optical device: 4-arrayed optical device with 400 $\mu$m pitch.

As can be seen from Table 3, as results of Embodiments III-1 to III-5, (w, s)=(20, 20)$\mu$ gives the smallest loss as in Table 1.

TABLE 4

Embodiment 5 of the present invention
(structural parameter dependence of CPW line)

| | | HF electrical wiring function | | | | Optical bench function Axis deviation of arrayed |
|---|---|---|---|---|---|---|
| | Thickness of under-clad | Total thickness of silica-waveguide | Structural parameter of cpw line | $S_{21}$ (dB/cm) | | optical device and optical waveguide end face |
| | h ($\mu$m) | H ($\mu$m) | (w, s) | 2 GHz | 10 GHz | ($\mu$m) |
| Reference IV-1 | 1.5 | 37.5 | (20,20) | −3.4 | −1.6 | 0.03 |
| Reference IV-2 | 10.0 | 46.0 | (20,20) | −1.1 | −1.2 | 0.07 |
| Reference IV-3 | 15.0 | 51.0 | (20,20) | −0.8 | −0.8 | 0.10 |
| Embodiment IV-4 | 20.0 | 56.0 | (20,20) | −0.6 | −0.6 | 0.15 |
| Embodiment IV-5 | 30.0 | 66.0 | (20,20) | −0.5 | −0.5 | 0.17 |
| Embodiment IV-6 | 60.0 | 96.0 | (20,20) | −0.3 | −0.4 | 1.36 |
| Embodiment IV-7 | 84.0 | 120.0 | (20,20) | −0.2 | −0.4 | 1.96 |

TABLE 4-continued

Embodiment 5 of the present invention
(structural parameter dependence of CPW line)

|  | HF electrical wiring function | | | | | Optical bench function Axis deviation of arrayed |
| --- | --- | --- | --- | --- | --- | --- |
|  | Thickness of under-clad | Total thickness of silica-waveguide | Structural parameter of cpw line | $S_{21}$ (dB/cm) | | optical device and optical waveguide end face |
|  | h (μm) | H (μm) | (w, s) | 2 GHz | 10 GHz | (μm) |
| Reference IV-8 | 94.0 | 130.0 | (20,20) | −0.2 | −0.3 | 1.05 |
| Reference IV-9 | 120.0 | 156.0 | (20,20) | −0.2 | −0.3 | 1.31 |

H: Here, the core is 6 μm, and the upper clad is 30 μm, and H = h + 36.
cpw: Coplanar
Arrayed optical device: 4-arrayed optical device with 400 μm pitch.

Further, as shown in Table 4, with (w, s)=(20, 20) μm, $S_{21}$ and axis deviation with changes in the under-clad thickness h are shown. As shown, in order to reduce $S_{21}$ to less than 1.5 db/cm at 10 GHz, h is required to be more than 20 μm. By increasing the resistivity of the silicon substrate, the thickness of the silica layer on the silicon substrate can be reduced to less than Embodiment 1. Further, to reduce the axis deviation between the active layer of the optical device and the core of the optical waveguide, the total thickness H of the silica layer must: be less than 120 μm As described above, in the silica-based optical waveguide of FIGS. 25 and 26, it has been found that, to satisfy the high-frequency electrical wiring function and the high precision optical bench function for mounting the optical device, the under-clad thickness h of the silica-based optical waveguide must be more than 20 μm. Further, when an optical device of 4-array or more is mounted in 400 μm pitch, a condition is added that the total thickness H of the silica-based optical waveguide must be less than 120 μm.

As can be seen from Table 3 and Table 4, an example using a discrete LD module as an optical device using a substrate in which under-clad h=30 μm, core diameter=6×6 μm, over-clad thickness=30 μm, and the entire silica layer of 66 μm is shown in FIG. 25, which is considered to be optimum as a low loss silica-based optical waveguide.

As described above, the hybrid optical integrated substrate of Embodiment 5 satisfies not only the proven low loss optical waveguide function, but also the high-frequency wiring function for driving the optical device and the high precision optical bench function for ensuring the flatness of the substrate. Further, as compared with Embodiment 1, the present embodiment uses an under-clad of 30 μm thick which has been proven as optical waveguide, and does not use a guide post or the like, thereby simplifying the electrode structure. Therefore, the high-frequency characteristics are improved and the packaging work has been simplified.

Transmission loss of the optical waveguide of the hybrid optical integrated circuit was less than 1 db/cm. Further, when LD is used as an optical device, good characteristics are shown in high-speed modulation at 10 GHz.

Embodiment 6

Figure 27:
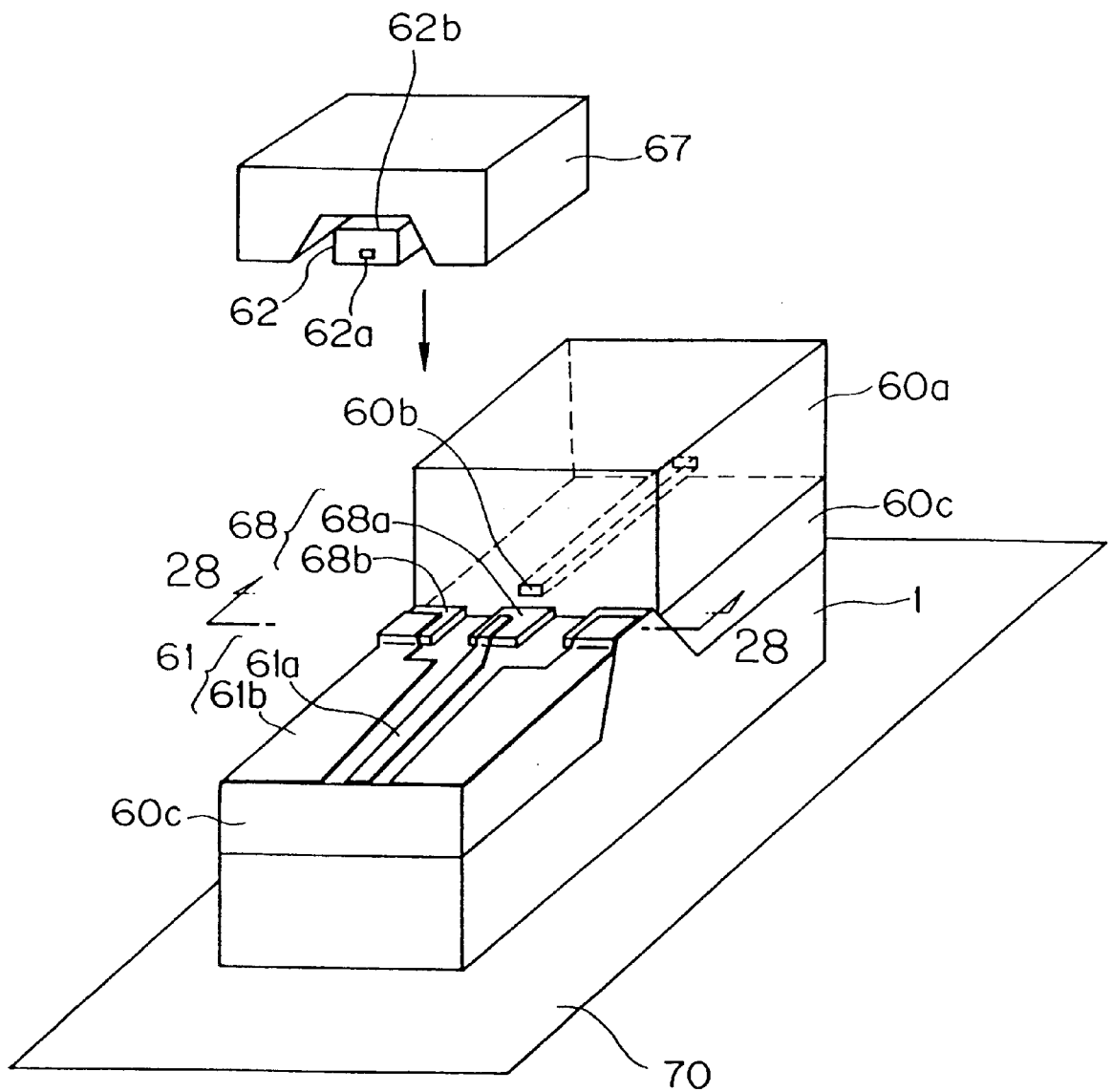
FIG. 27 is a schematic perspective view showing a sixth embodiment of an opto-electronic hybrid integrated circuit according to the present invention.

FIG. 27 is a schematic view showing a sixth embodiment of the hybrid optical integrated circuit of the present invention. The present embodiment uses the silicon substrate 1 having protrusion and recess in place of the flat silicon substrate 1 used in Embodiment 4. The under-cladding layer 60c of the silica-based optical waveguide is formed in the recess of the silicon substrate 1, and protrusions 68a and 68b of the silicon substrate are exposed to an optical device mounting part 68 as shown, which can be used as a height reference surface when mounting the optical device 62.

Figure 28:
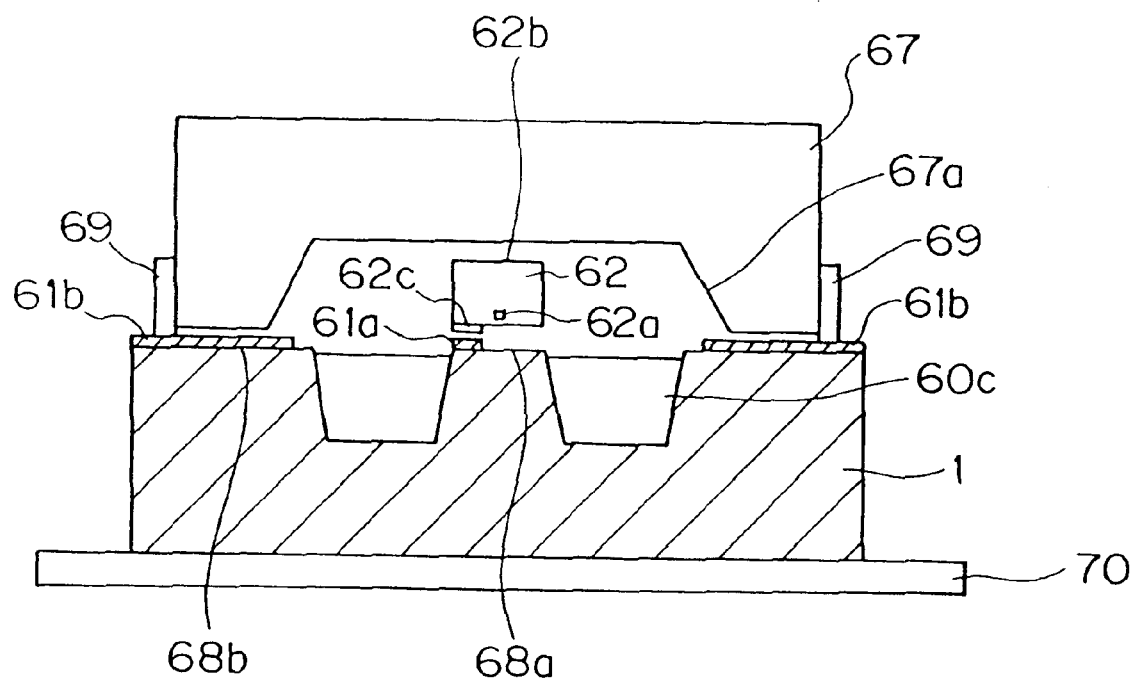
FIG. 28 is a cross-sectional view taken on line 28—28 of FIG. 27.

The cross section in FIG. 27 corresponding to that taken in FIG. 25 is the same in structure as in FIG. 26, wherein the under-cladding layer 60c is of thickness h=30 μm which is optimized in Table 3 and Table 4. A line 28—28 cross-sectional view in the optical device mounting part 68 is shown in FIG. 28. On the protrusion 68a of the silicon substrate 1, a thin electrode 62c is formed separately from the active layer 62a of the optical device 62, which functions as the height reference surface and an electrode of the optical device 62. The coplanar line 61 uses a 5 μm thick gold plating layer on the under-clad, but uses a gold spatter film of less than 1 μm in thickness on silicon terraces 68a and 68b. The electrode 62b on the backside of the optical device 62 is held by the silicon sub-carrier, and electrically connected to the electrode 61b on the silicon terrace 68b through the conductive layer 67a on the surface of the silicon sub-carrier 67 and a conductive bonding material 69.

Using the silicon substrate having the protrusion, the silicon protrusion 68a can be used as the mounting height reference surface, and positioning of the optical device 62 and the optical waveguide core 62a can be made with even higher precision. Heat generated in the optical device 62 can be dissipated to heat conductive silicon substrate 1 through the sub-carrier 67 and 68b and, since the substrate 1 is closely contacted to a highly heat conductive package 70, heat dissipation of the optical device 62 is remarkably improved.

High-frequency characteristics in the coplanar line 61 are also good as in Embodiment 4. Although the high-frequency line is located immediately above the electrode on the silicon terraces 68a and 68b, the distance flowing high-frequency is actually very short, and the loss is very small.

The thickness H including the under-clad 60c, the core 60b, and the over-clad 60a uses 66 μm optimized in Table 4, which is a good optical bench with reduced warping.

Embodiment 7

Figure 29:
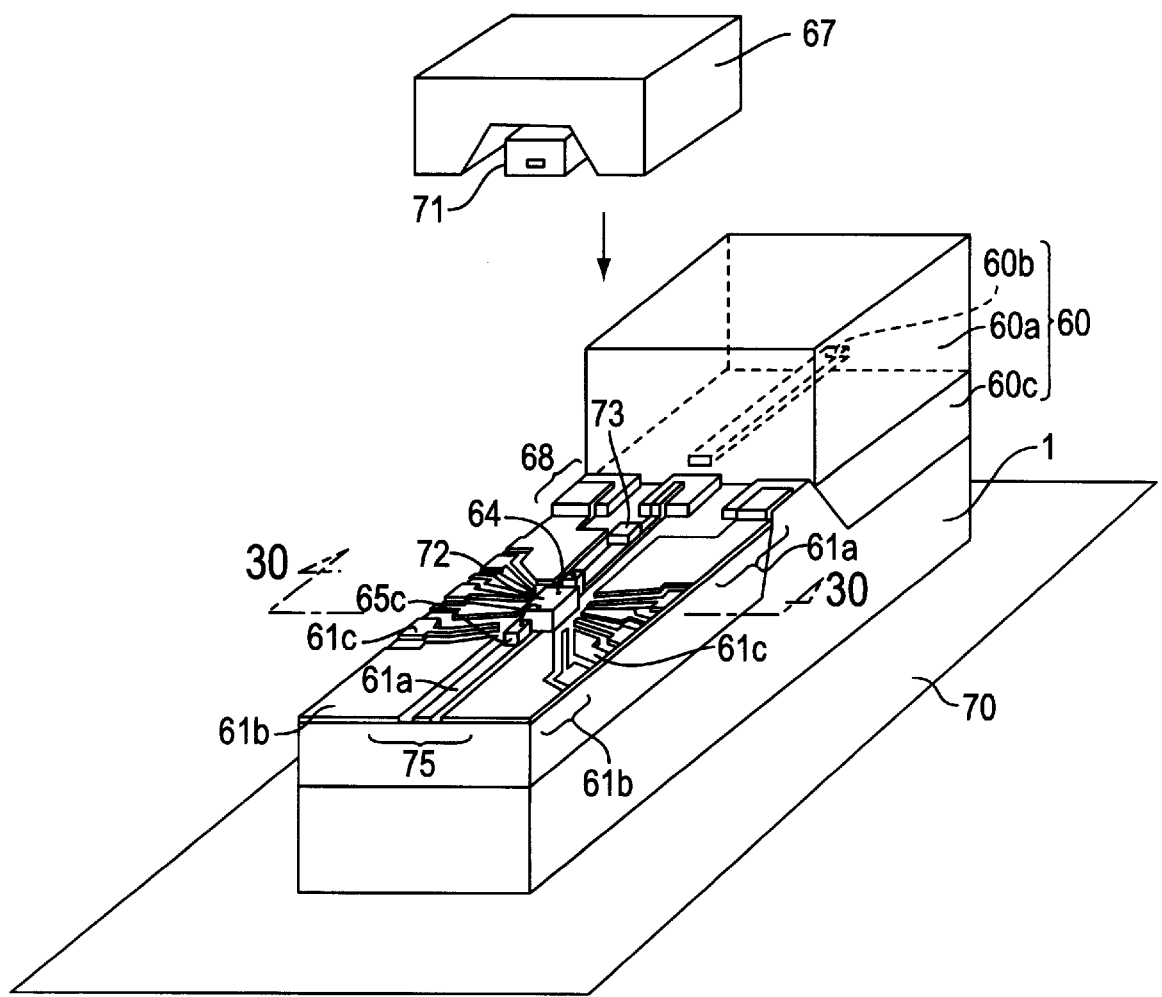
FIG. 29 is a schematic perspective view showing a seventh embodiment of an opto-electronic hybrid integrated circuit according to the present invention.
Figure 30:
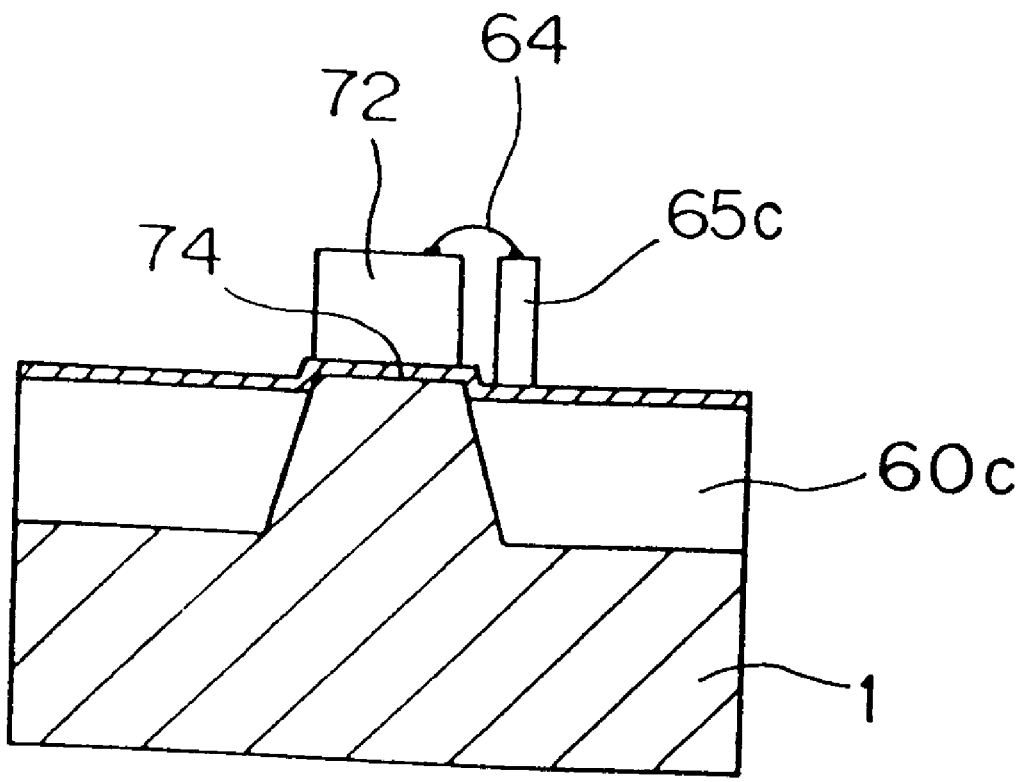
FIG. 30 is a cross-sectional view taken on line 30—30 of FIG. 29.

FIG. 29 is a schematic perspective view showing a seventh embodiment of the hybrid optical integrated circuit of the present invention. The present embodiment uses an LD 71 as the optical device 62 of Embodiment 6, and further an LD driver 72 for driving the LD is mounted on the same substrate 1. The optical device mounting part 68 is the same in structure as in FIG. 27. The input side coplanar line 61b to the LD driver is the same in structure as the coplanar line 61 in FIG. 27. However, the coplanar line 61a connecting the LD driver 72 and the LD 71 is inserted with a high-frequency chip resistor 73 for impedance matching of the 50-ohm coplanar line with the LD. A line 30—30 cross-sectional view of the LD driver 72 is shown in FIG. 30. As shown, the LD driver 72 is placed on a protrusion 74 of the silicon substrate in order to efficiently dissipate heat of the LD driver 72 which has high heat evolution. As in Embodiment 5, heat of the LD is efficiently absorbed by the silicon substrate. By contacting the entire LD module closely with a package of highly heat conductive material, heat can be efficiently dissipated. Connection between the LD driver 72 and the coplanar line 61*a* and between the LD driver 72 and a DC bias line 61*c*, as shown in FIG. 30, is made using a guide post 65*c* and a gold ribbon wire 64 to reduce loss of the high-frequency components to a minimum. Since the silicon protrusion 74 contacts only the bottom surface of the driver, and separates from the coplanar line, the high-frequency characteristics are not deteriorated.

Transmission loss of the optical waveguide of the hybrid optical integrated circuit was less than 1 dB/cm. Further, by inputting a 10 GHz modulation signal from a coplanar line input end 75 to the LD driver 72 and adjusting the amplitude and modulation potential by the DC bias line 61*c*, the LD device showed good modulation characteristics up to 10 GHz.

As described above, by utilizing the low-loss optical waveguide function, high-frequency electrical wiring function, and high precision optical bench function of the hybrid optical integrated substrate of the present embodiment, such a high-speed LD module can be achieved on the same substrate of several cm square.

Embodiment 8

Figure 31:
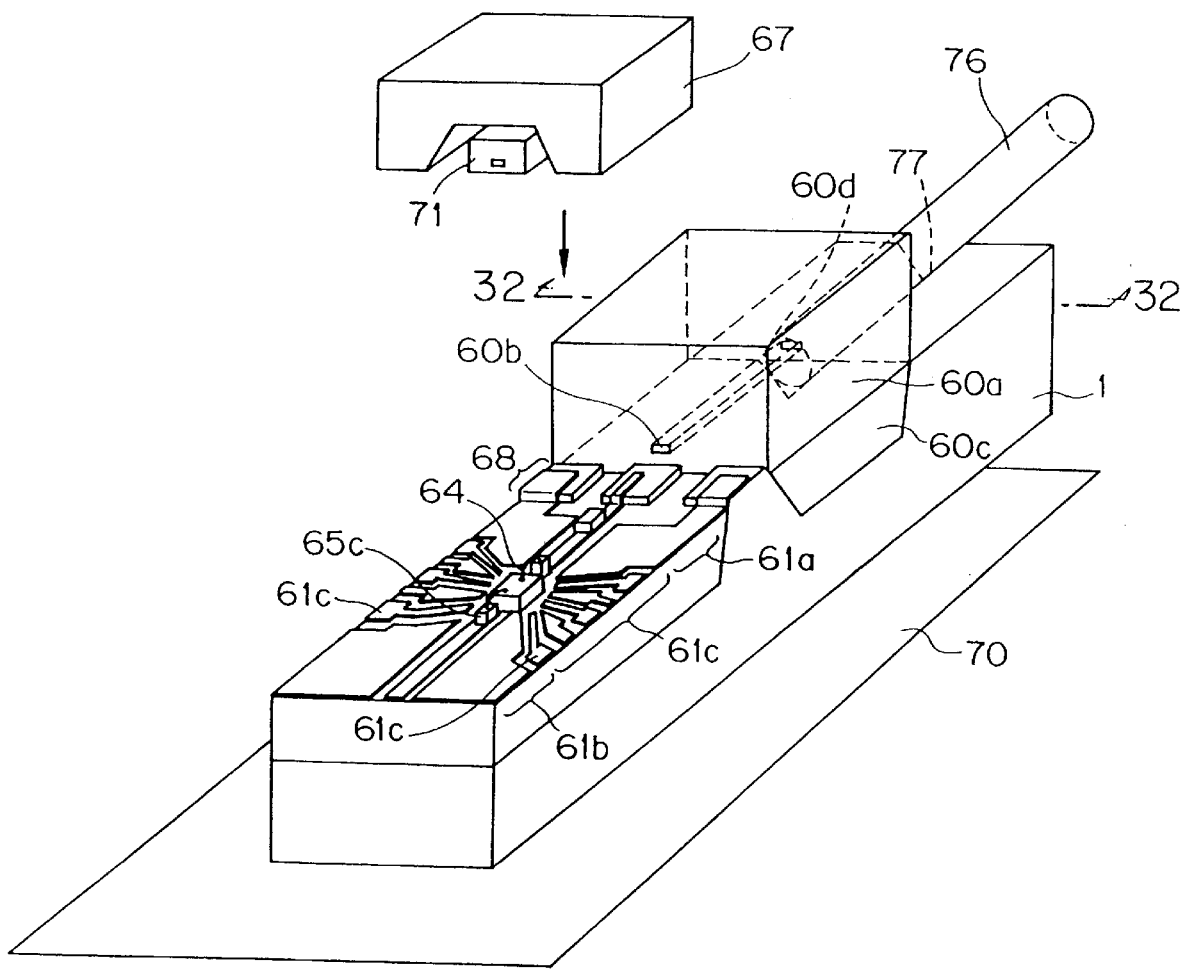
FIG. 31 is a schematic perspective view showing an eighth embodiment of an opto-electronic hybrid integrated circuit according to the present invention.
Figure 32:
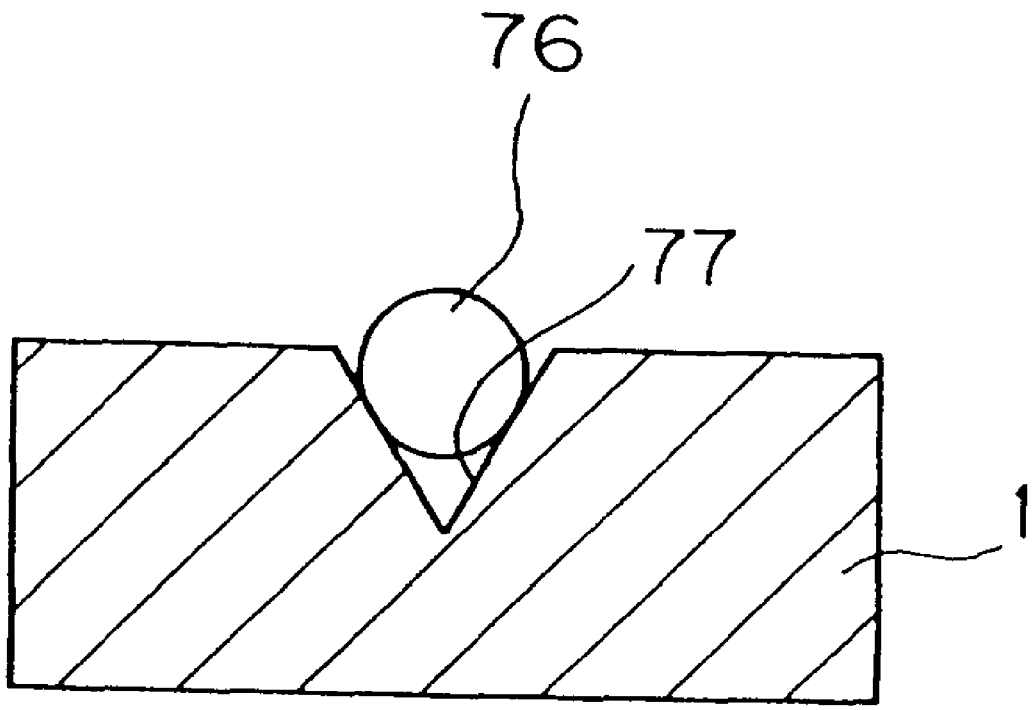
FIG. 32 is a cross-sectional view taken on line 32—32 of FIG. 31.

FIG. 31 is a schematic perspective view showing an eighth embodiment of the hybrid optical integrated substrate of the present invention. The present embodiment has the same construction for the silica-based optical waveguide, the optical device mounting part 68, the coplanar wiring parts 61*a* and 61*b*, and the LD driver mounting part 61*c*. However, the silicon substrate 1 is extended to form a guide groove 77 so that a fiber 76 can be connected on an end face 60*d* of the silica-based optical waveguide without core adjustment. A 32—32 cross-sectional view of the guide groove 77 is shown in FIG. 32. The guide groove 77 can be easily formed by etching the optical waveguide and the silicon substrate. By the guide groove 77, the optical fiber 76 can be easily connected to the optical waveguide core 60*b* without core adjustment, thereby even further expanding application of the hybrid optical integrated substrate.

Embodiment 9

Figure 33:
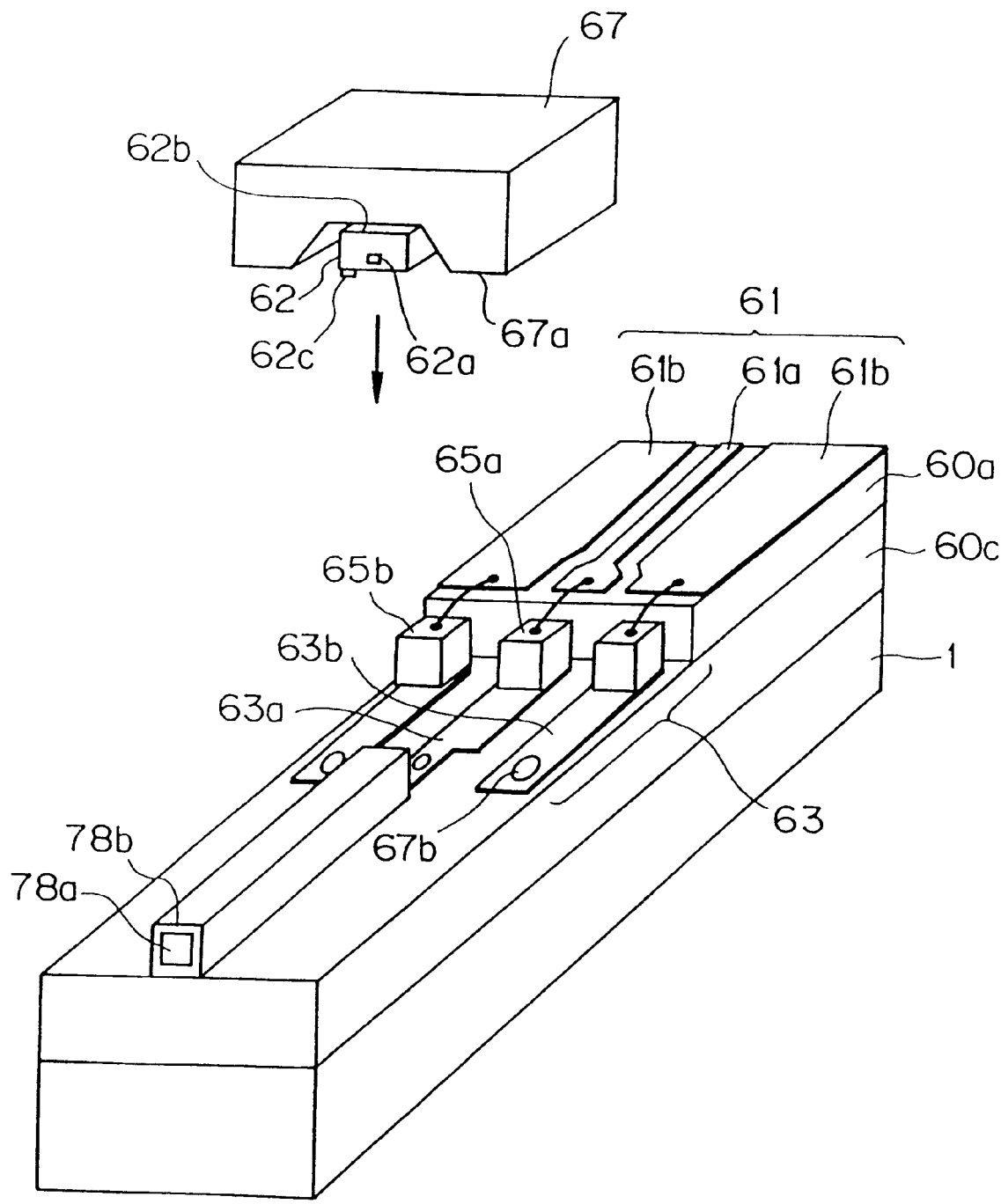
FIG. 33 is a schematic perspective view showing a ninth embodiment of an opto-electronic hybrid integrated circuit according to the present invention.

FIG. 33 is a schematic perspective view showing a ninth embodiment of the hybrid optical integrated circuit of the present invention. In the present embodiment, portions other than the silica-based optical waveguide have the same construction as Embodiment 4, and the silica-based optical waveguide is changed from the embedded type to the ridge type. In association with the change, only the thickness of the over-clad 62*a* is the same as that of a ridge type optical waveguide 78 and is thus small. As previously described, the ridge type optical waveguide is slightly inferior in characteristics to the embedded type but, for other points, functions as a good packaged substrate for hybrid optical integration.

Embodiment 10

A tenth embodiment (not shown) is the same as Embodiment 4 shown in FIG. 20, except for the optical device mounting part 63, in which the optical device mounting part 63 is changed to an optical device mounting part 68 using the silicon terrace as shown in FIG. 27. Compared with Embodiment 4, good characteristics are maintained in terms of the optical waveguide function and the electrical wiring function as in Embodiment 4 and, as described in Embodiment 6, the silicon terrace can also be used as a height reference surface of optical device mounting, and heat dissipation is improved.

Embodiment 11

Figure 34:
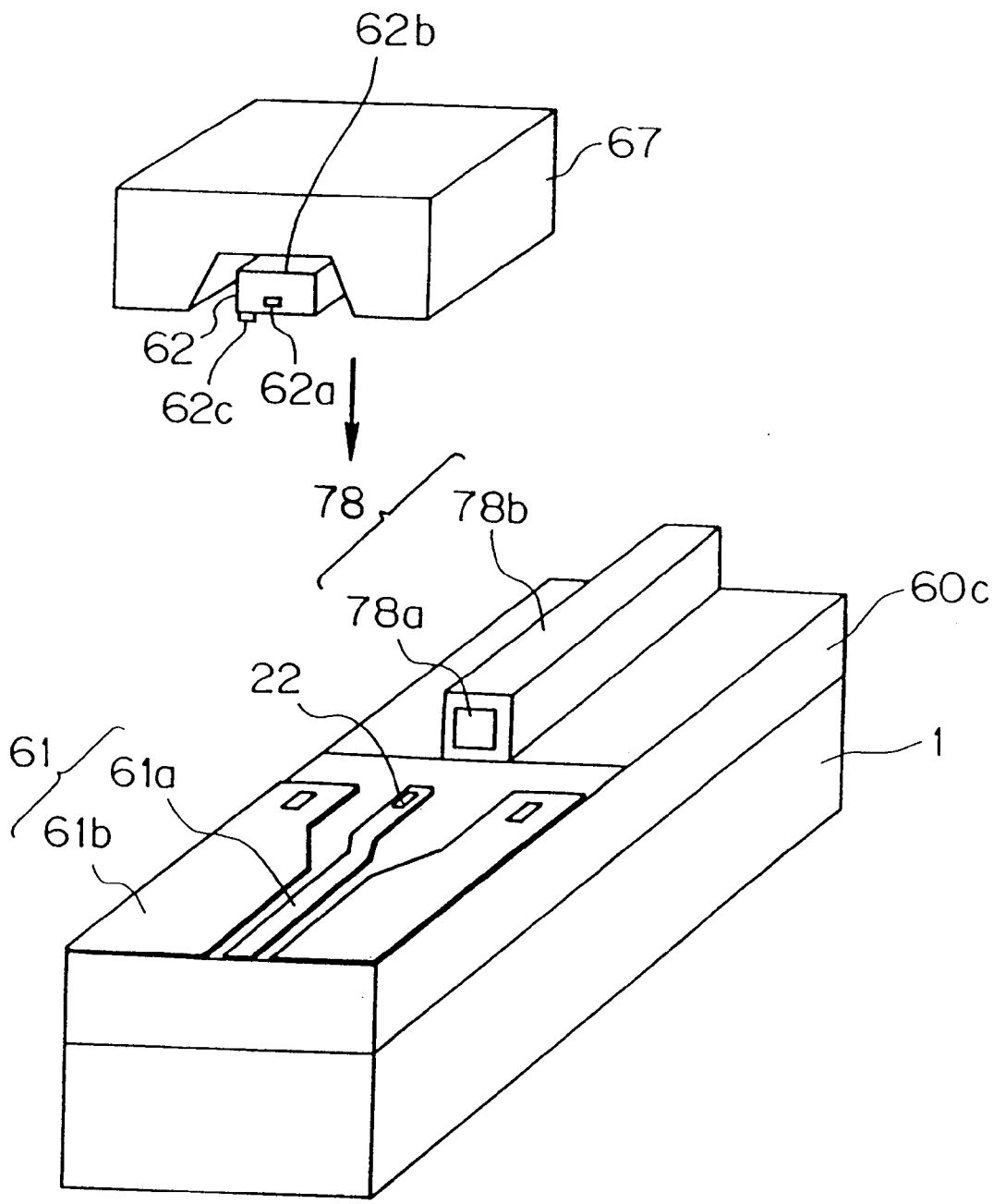
FIG. 34 is a schematic perspective view showing an eleventh embodiment of an opto-electronic hybrid integrated circuit according to the present invention.

FIG. 34 is a schematic perspective view showing an eleventh embodiment of the hybrid optical integrated circuit of the present invention. The present embodiment is the same in structure as Embodiment 5 shown in FIG. 25 except that the silica-based optical waveguide 60, and the embedded type optical waveguide 60 is changed to ridge type optical waveguide 78. As previously described, the ridge type optical waveguide is slightly inferior to the embedded type optical waveguide in optical waveguide characteristics, but Embodiment 11 functions as a good packaged substrate for hybrid integration as in Embodiment 5 in terms of the high-frequency electrical wiring function and the optical bench function.

Embodiment 12

Figure 35:
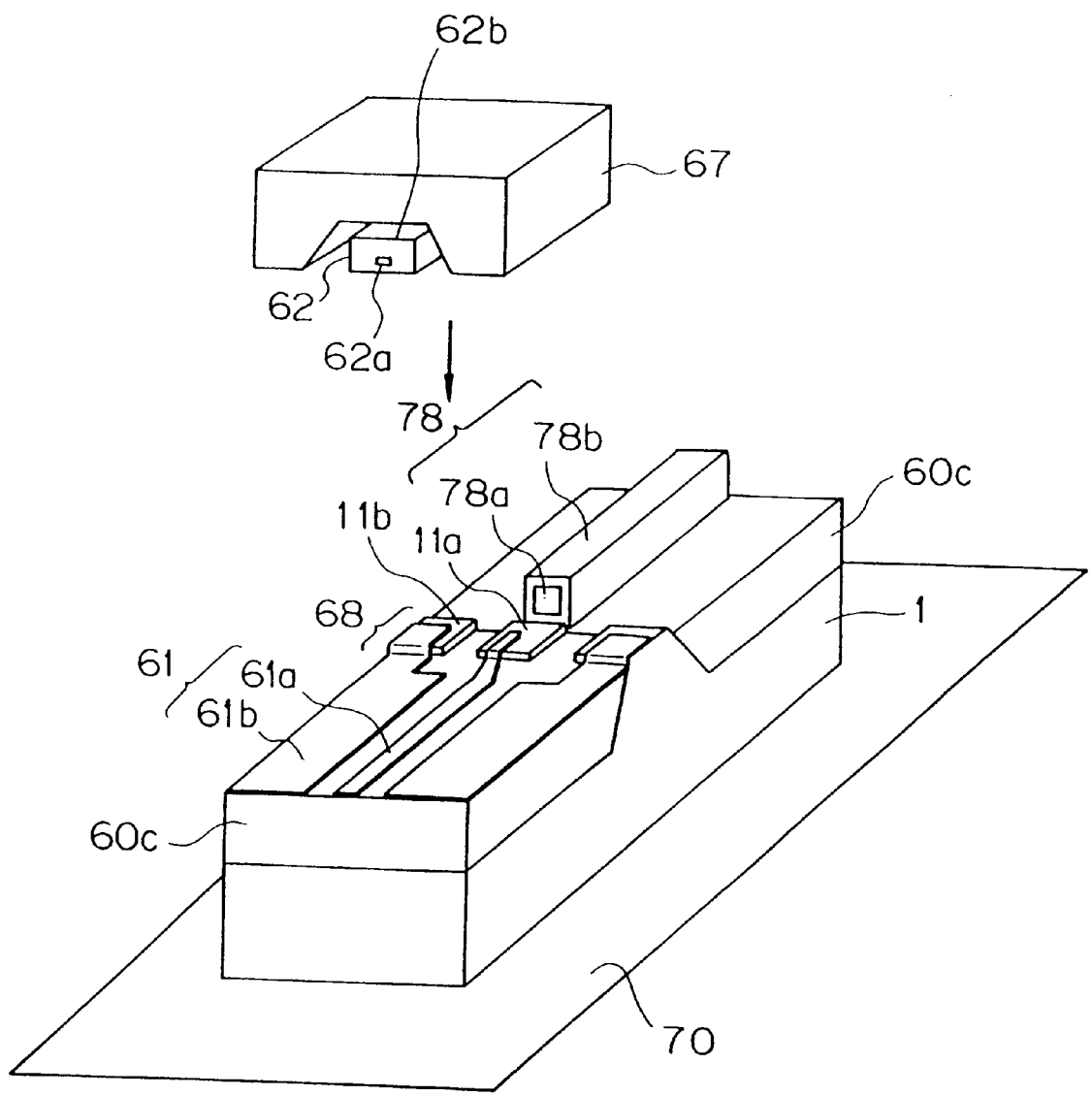
FIG. 35 is a schematic perspective view showing a twelfth embodiment of an opto-electronic hybrid integrated circuit according to the present invention.

FIG. 35 is a schematic perspective view showing a twelfth embodiment of the hybrid optical integrated circuit of the present invention.

The present embodiment is the same in structure as Embodiment 6 shown in FIG. 27 except that the silica-based optical waveguide 60, and the embedded type optical waveguide 60 are changed to ridge type optical waveguide 78. As previously described, the ridge type optical waveguide is slightly inferior to the embedded type optical waveguide in optical waveguide characteristics, but Embodiment 12 functions as a good packaged substrate for hybrid integration as in Embodiment 6 in terms of the high-frequency electrical wiring function and the optical bench function.

As described above, in the hybrid optical integrated packaged substrate of the above embodiment, the disadvantage of high dielectric loss at high frequencies of the silicon substrate proven as a low loss silica-based optical waveguide substrate is solved by using a silica-based buffer layer with an appropriate thickness and, in view of the high precision optical bench function, the thickness of the silica-based optical waveguide is optimized so that warping of the substrate is reduced to the extent that coupling loss is not increased due to axis deviation relative to the optical waveguide even when an arrayed optical device is mounted. Therefore, an active device can be mounted to the optical waveguide with good precision, and it can be used as an opto-electronic packaged substrate or a platform which operates with improved high-frequency characteristics.

The high-frequency electrical characteristics are even further improved by enhancing the resistivity of the silicon substrate, and sufficiently good high-frequency characteristics can be maintained even through the thickness of silica layer between the coplanar line and the silicon substrate. Therefore, it is also possible to use the under-cladding layer of about 30 μm in thickness which is proven as an optical waveguide, and use a structure where the coplanar line is lower than the core layer, thereby expanding the application.

Further, by using the silicon substrate with protrusion and recess, forming the under-cladding layer of the silica-based optical waveguide is formed in the recess, and the protrusion is exposed in the optical device mounting part and used as a height reference surface, thereby providing an even higher precision optical bench function. In this structure, the highly heat conductive silicon substrate can be utilized as a heat dissipation plate for the optical device and its driving IC through the silicon terrace.

By forming a fiber guide groove in the silicon substrate, it is possible to connect the fiber to the silica-based optical waveguide without core adjustment.

Embodiment 13

Figure 36:
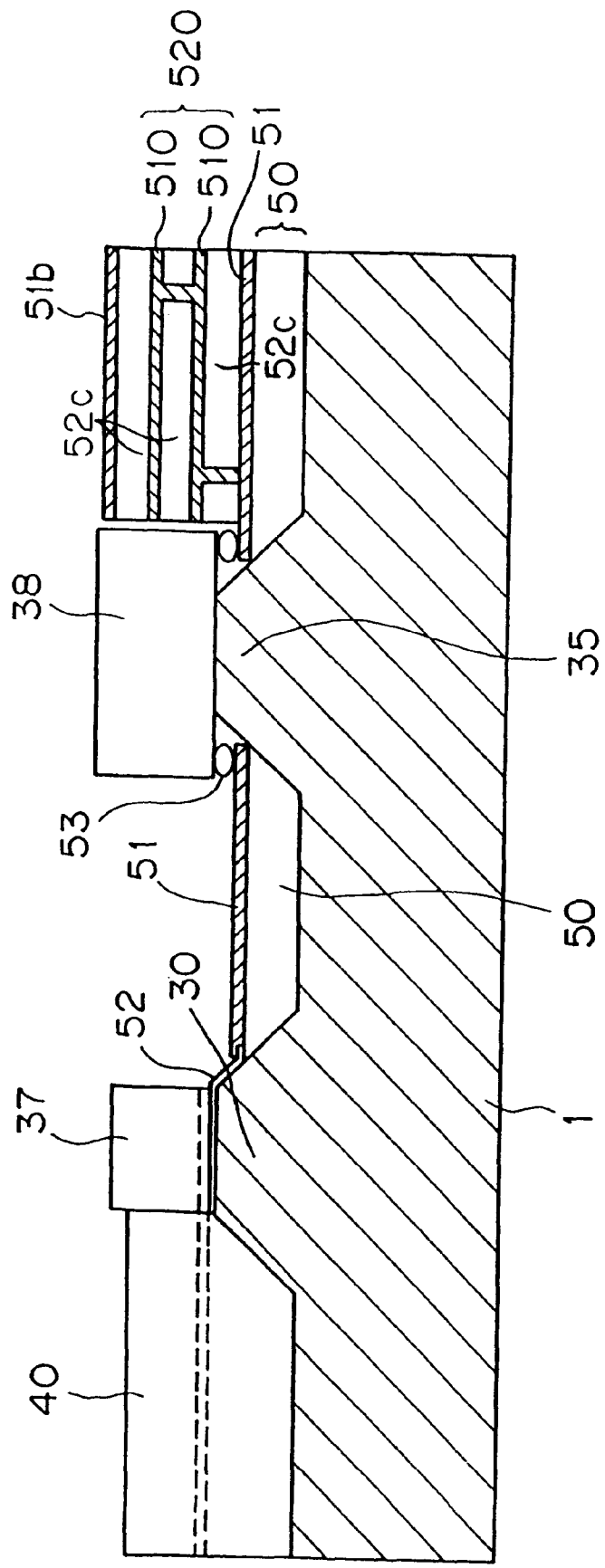
FIG. 36 is a schematic perspective view showing a thirteenth embodiment of an opto-electronic hybrid integrated circuit according to the present invention.

FIG. 36 is a schematic cross sectional view showing a thirteenth embodiment of the opto-electronic hybrid optical integrated circuit of the present invention. The reference numeral 1 indicates a silicon substrate having a resistivity of 100 ohm-cm. In the optical waveguide section, a silica-based optical waveguide 40 is formed in the recess provided on the substrate surface. The under clad has a thickness of 30 μm, the core is 6 μm thick, and the over-clad is 30 μm thick. A dielectric layer 50 comprising the same material as the silica-based under-cladding layer is formed in the silicon recess of the electrical wiring part. Thickness of the dielectric layer 50 between the optical device silicon terrace 30 and the electronic circuit terrace 35 is 20 μm, and a 5 μm thick conductor pattern 51 is formed on top. Thin film electrodes 52 are formed on the upper surface of the optical device silicon terrace 30 and the inclined side surface, and electrically connected to the conductor pattern 51. The optical active device 37 is mounted upside down on the silicon terrace 30 while maintaining electrical connection with the thin film electrode 52. The electronic circuit 38 is mounted on the silicon terrace 35 with the device surface facing down, and fixed with the conductor pattern 51 with a 5 μm high solder bump 53. In the electrical wiring part on the right of the electronic circuit, a second dielectric layer 52c is stacked on the dielectric layer 50 comprising the silica-based optical waveguide under-cladding layer. A multilayered conductor pattern 520, comprising conductors 510, is provided in the second dielectric layer 52c, and a conductor pattern 51b is provided on the surface.

In the present embodiment, the dielectric layer of the electric wiring part is the dielectric layer 50 comprising the same material as the silica-based optical waveguide, the second dielectric layer 52c comprising polyimide is provided in part of the dielectric layer, and the multilayered electrical wiring 510 is provided inside. With this construction, the optical device of low wiring density and the electronic circuit are connected with the high-speed coplanar line, and the electronic circuit of high wiring density can be wired using a multilayered microstrip wiring. Further, in the present embodiment, the coplanar wiring area and the microstrip wiring area use the under-clad layer of the optical waveguide for the first dielectric layer. As a result, compared with Embodiment 2 for achieving the same object as the present embodiment, fabrication process of the packaged substrate can be simplified.

Embodiment 14

Figure 37:
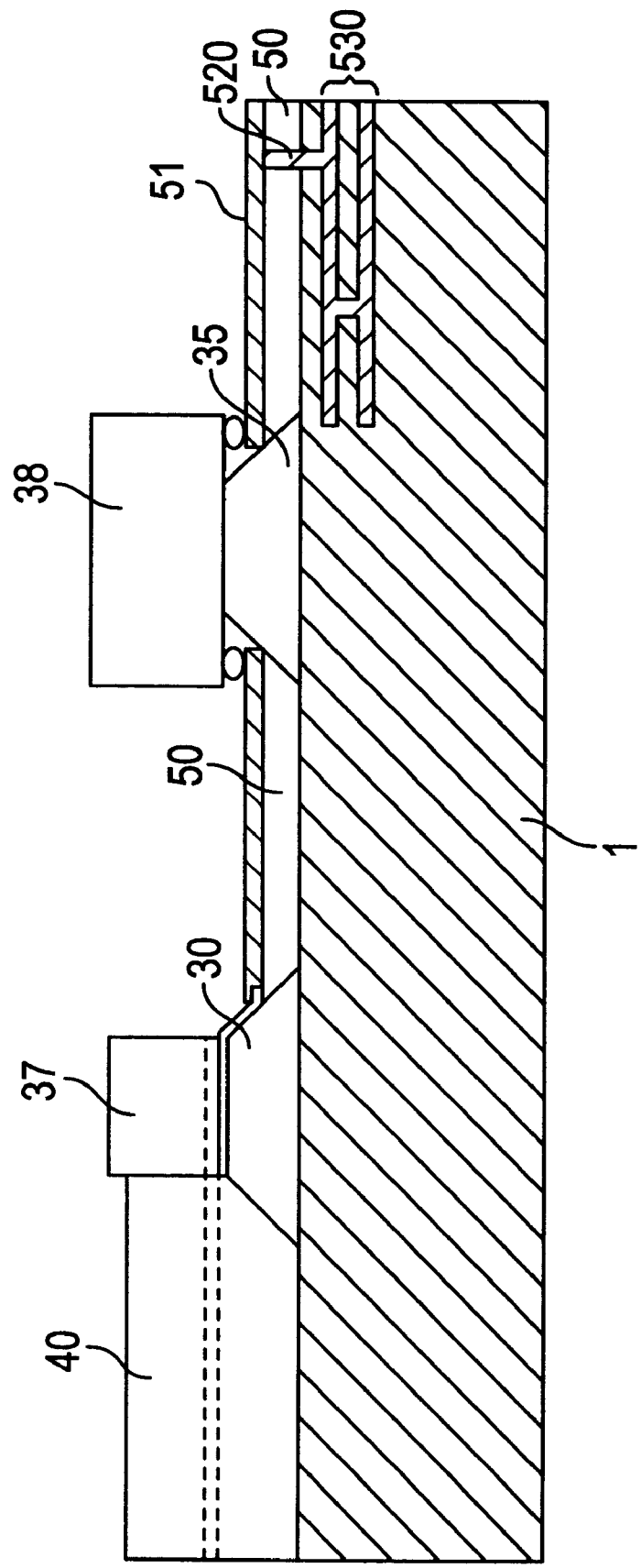
FIG. 37 is a schematic perspective view showing a fourteenth embodiment of an opto-electronic hybrid integrated circuit according to the present invention.

FIG. 37 is a schematic cross-sectional view showing a fourteenth embodiment of the hybrid optical integrated circuit of the present invention. The substrate 1 in the present embodiment is a ceramic substrate, and the optical device silicon terrace 30 and the electronic circuit silicon terrace 35 are provided on top. The optical waveguide 40 is a silica-based optical waveguide. The dielectric layer 50 of the electrical wiring part is formed of polyimide. The present embodiment is characterized in that not only the conductor pattern 51 is provided on the surface and inside the dielectric layer 50 of the electrical wiring part, but also an electrical wiring 530 is provided in the ceramic substrate.

In the present embodiment, a silicon terrace with high thermal conductivity is used for the device mounting part, a silica-based optical waveguide is used as the optical waveguide, in the electrical wiring part, conductor patterns are provided inside and on the surface of the dielectric layer on the substrate, and a conductor pattern is provided also in the ceramic substrate which is easy to provide a multilayered electrical wiring. As a result, the packaged substrate of the present embodiment has a high-performance optical waveguide function, the silicon bench function, and the high-frequency electrical wiring function, and a very high density electrical wiring can be formed.

To provide a silicon terrace on a substrate of different material such as ceramic, for example, an anodic bonding technique can be used. In this technique, a thin $SiO_2$ film is previously formed on the surface of the ceramic substrate and backside of the silicon terrace, and both are heated to join.

Embodiment 15

Figure 38:
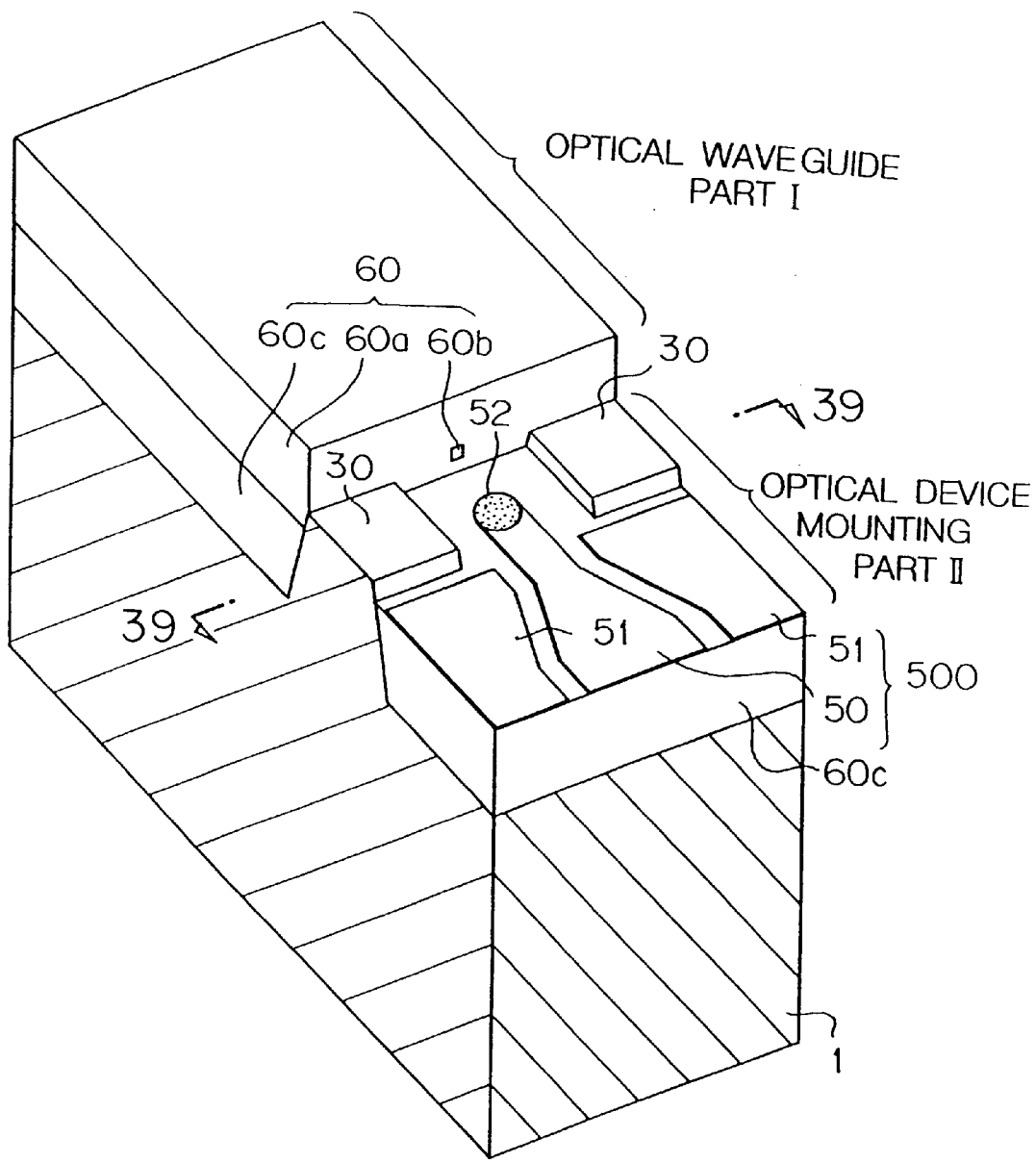
FIG. 38 is a schematic perspective view showing a platform used in a fifteenth embodiment of an opto-electronic hybrid integrated circuit according to the present invention.

FIG. 38 is a schematic perspective view showing an optical packaged substrate in a fifteenth embodiment of the hybrid optical integrated circuit of the present invention. In the Figure, the reference numeral 1 indicates a silicon substrate, on the surface of which are formed protrusion and recess structures. An optical waveguide part I is formed on the silicon substrate recess, and 60b indicates a silica-based optical waveguide core (6×6 μm), which is embedded in the 30 μm thick over-cladding layer 60a. In an optical device mounting part II, the silicon substrate protrusion is exposed, which is the height reference surface 30 when mounting the optical device. The height reference surface 30 is divided into two parts about the position corresponding to the waveguide core 60b, and the volume around the two parts of the surface is filled with the silica-based optical waveguide under-cladding layer 60c. The under-cladding layer 60c in the optical waveguide mounting part II is 35 μm in thickness, an electrical wiring layer 500 of coplanar structure comprising the central conductor pattern 50 and the ground conductor pattern 51 is formed on the surface thereof, and the solder pattern 52 is formed at one end of the central conductor pattern, that is, in the gap of the divided height reference 30. The thickness 35 μm of the silica-based optical waveguide under-cladding layer 60c is sufficient for the electrical wiring formed on the surface to provide superior high-frequency characteristics without being affected by the silicon substrate. The electrical wiring layer 500 and the solder pattern 52 are both 5 μm in thickness. In the present embodiment, the electrical wiring layer 500 is formed of gold, and the solder pattern 52 is formed of a gold-tin alloy.

Figure 39:
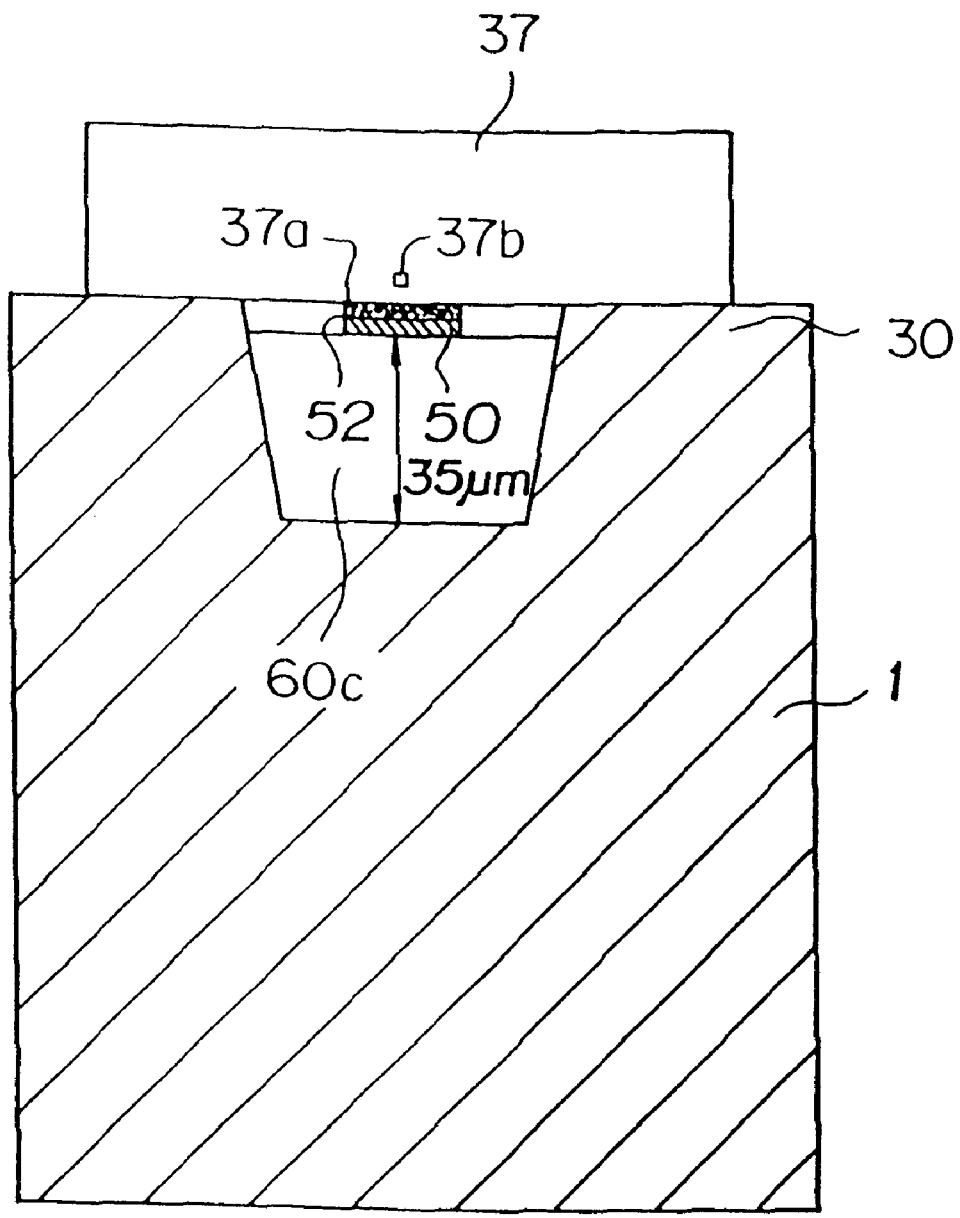
FIG. 39 is a cross-sectional view taken on line 39—39 of FIG. 38.

FIG. 39 is a cross-sectional view taken on line 39—39 of FIG. 38 when the semiconductor device is mounted on the hybrid optical integrated substrate of FIG. 38. In the present embodiment, the height reference surface 30 comprising the silicon protrusion is divided into two parts, the gap is filled with the under-cladding layer 60c of the silica-based optical waveguide, and the central conductor 50 as the electrical wiring and a solder pattern 52 are formed on the surface. Therefore, in mounting the semiconductor optical device 37, all the electrical wiring layers, including the connection with an electrode pad 37a of the semiconductor optical device, can be formed on the surface of the under-cladding layer 60c of the silica-based optical waveguide having a sufficient thickness. As a result, effects of the low resistivity and the high dielectric constant of the silicon substrate on the electrical wiring can be neglected. Since the silica-based optical waveguide is better as an electrical wiring substrate than silicon substrate in terms of the resistivity and dielectric constant, the electrical wiring of the present embodiment can provide improved high-frequency characteristics.

The height from the protrusion surface 30 as the height reference surface of the silicon substrate 1 to the center of the optical waveguide core 60b is set equal to the height from the active layer 37b of the semiconductor optical device 37 to the device surface. Therefore, in mounting the optical semiconductor device 37, it is possible to set the height of the silica-based optical waveguide core 60b in line with the height of the active layer 37b of the semiconductor optical device, merely by mounting the semiconductor optical device upside down on the height reference surface 30 of the protrusion of the silicon substrate 1. At the same time, the protrusion of the silicon substrate also functions as a heat sink of the semiconductor optical device. Further, the optical device mounting part is formed by removing an unnecessary silica-based optical waveguide layer by etching and, in this case, the silicon substrate functions as an etching stop layer. Therefore, the height of the positioning height reference surface 30 is determined with very high precision.

The transmission loss of the optical waveguide of the hybrid optical integrated circuit was less than 0.1 dB/cm. Further, the positioning precision of the semiconductor optical device with the Silica-based optical waveguide is about 1 $\mu$m, and the semiconductor optical device showed good characteristics even in high-speed modulation at 10 GHz.

As described above, the present embodiment has the low-loss optical waveguide function, the optical bench function, and the high-frequency electrical wiring function.

Embodiment 16

Figure 40:
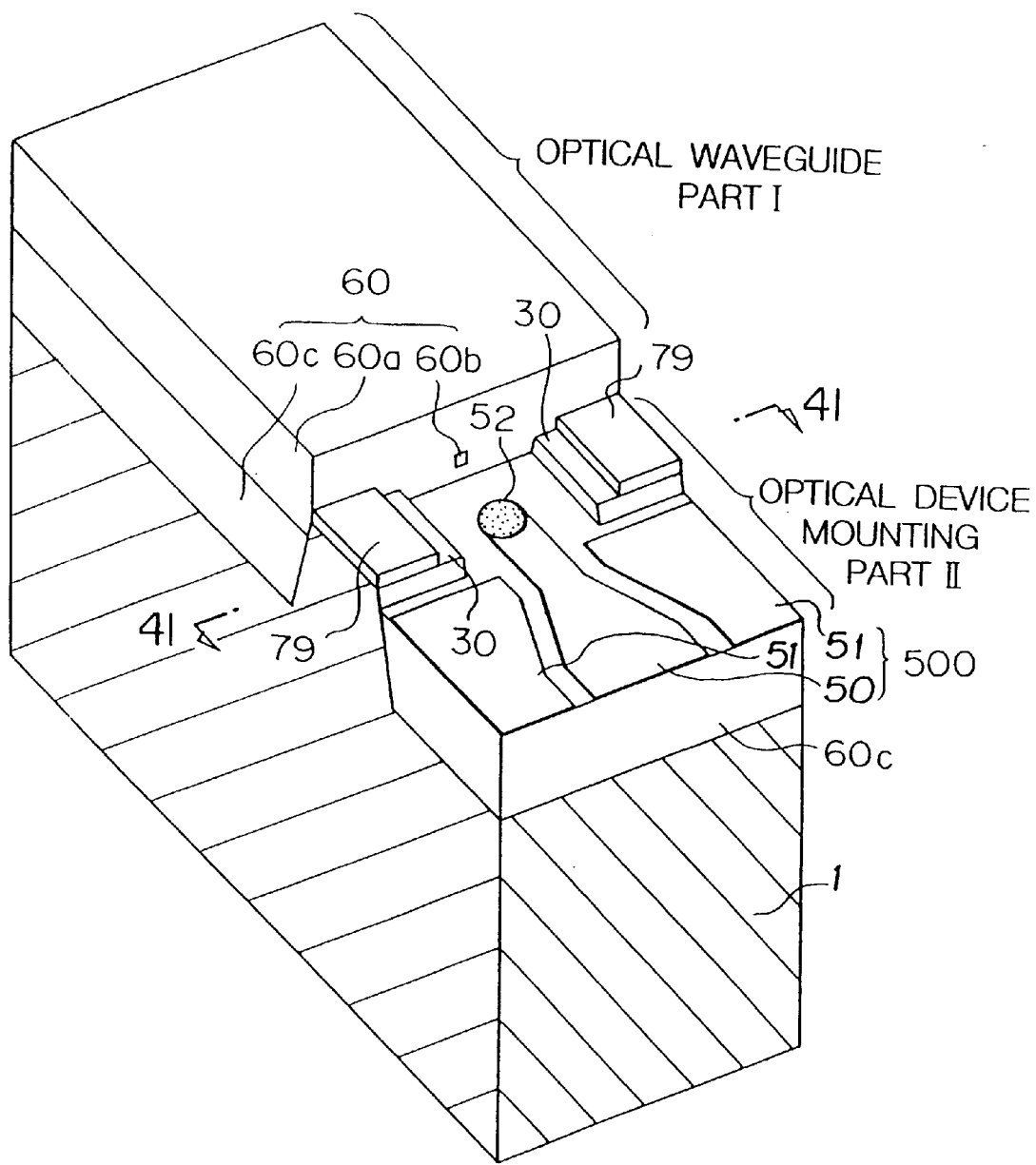
FIG. 40 is a schematic perspective view showing a platform used in a sixteenth embodiment of an opto-electronic hybrid integrated circuit according to the present invention.

FIG. 40 is a schematic perspective view showing an optical packaged substrate in a sixteenth embodiment of the hybrid optical integrated circuit of the present invention. A difference of the present embodiment from Embodiment 15 is that in the optical device mounting part II, an in-plane direction positioning guide 79 of the semiconductor device is provided, the other construction features being the same as Embodiment 15. In the present embodiment, the guide 79 is formed on the same material as the optical waveguide 60, that is, silica-based glass.

Figure 41:
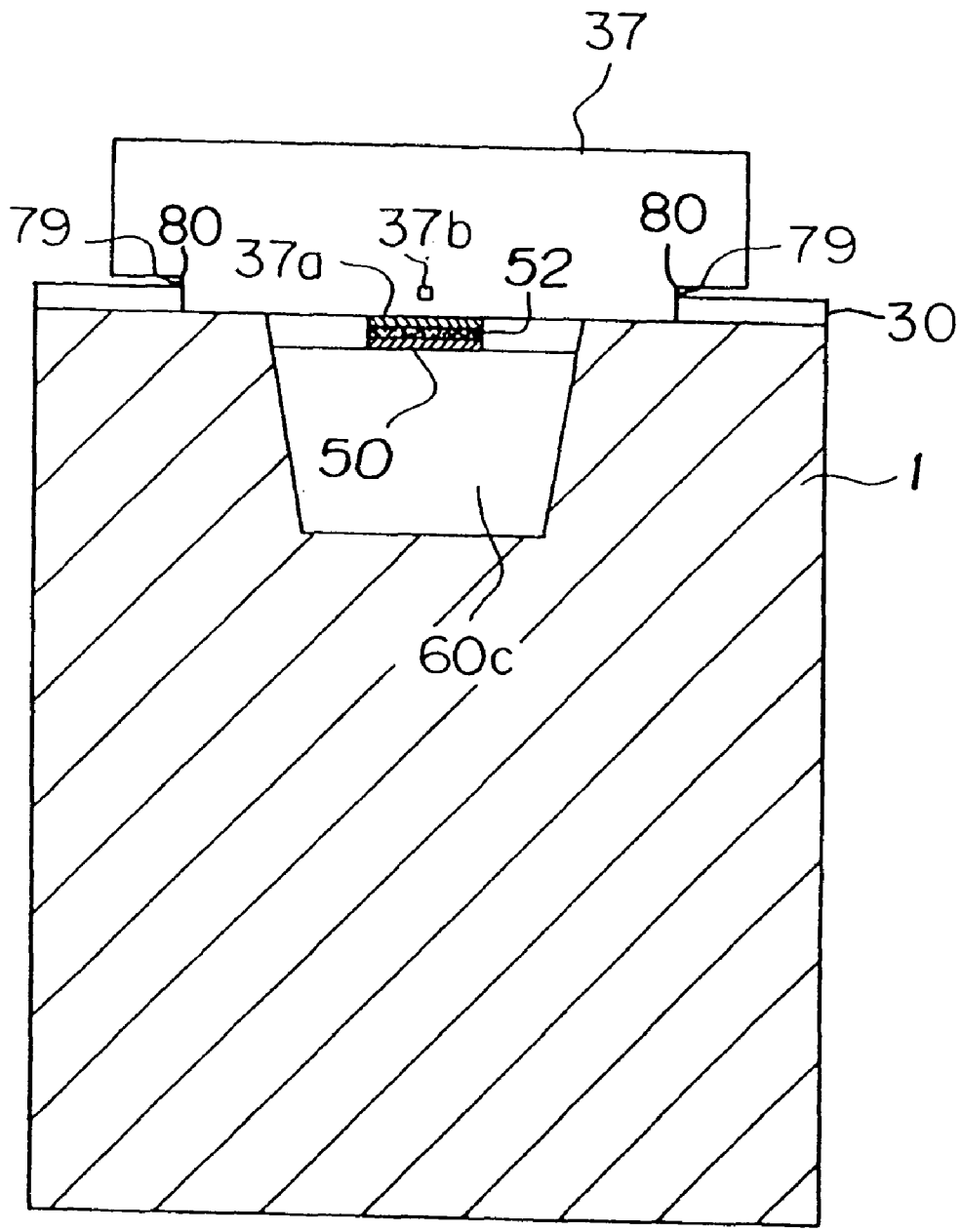
FIG. 41 is a cross-sectional view taken on line 41—41 of FIG. 40.

FIG. 41 is a schematic cross sectional view along line 41—41 of FIG. 40 when the semiconductor optical device 37 is mounted on the substrate 1 of FIG. 40. The guide 79 provided on the substrate 1 is 5 $\mu$m in height and, corresponding to this, a 6 $\mu$m deep positioning groove 80 is provided in the semiconductor optical device 37. Therefore, the positioning groove 80 and the guide 79 on the substrate contact the semiconductor optical device 37 which is mounted upside down, and merely by mounting the optical device 37 on the device mounting part so that the upper surface of the optical device contacts the silicon protrusion surface 30, positioning of the optical waveguide with the optical semiconductor device is completed without core adjustment.

Embodiment 17

Figure 42:
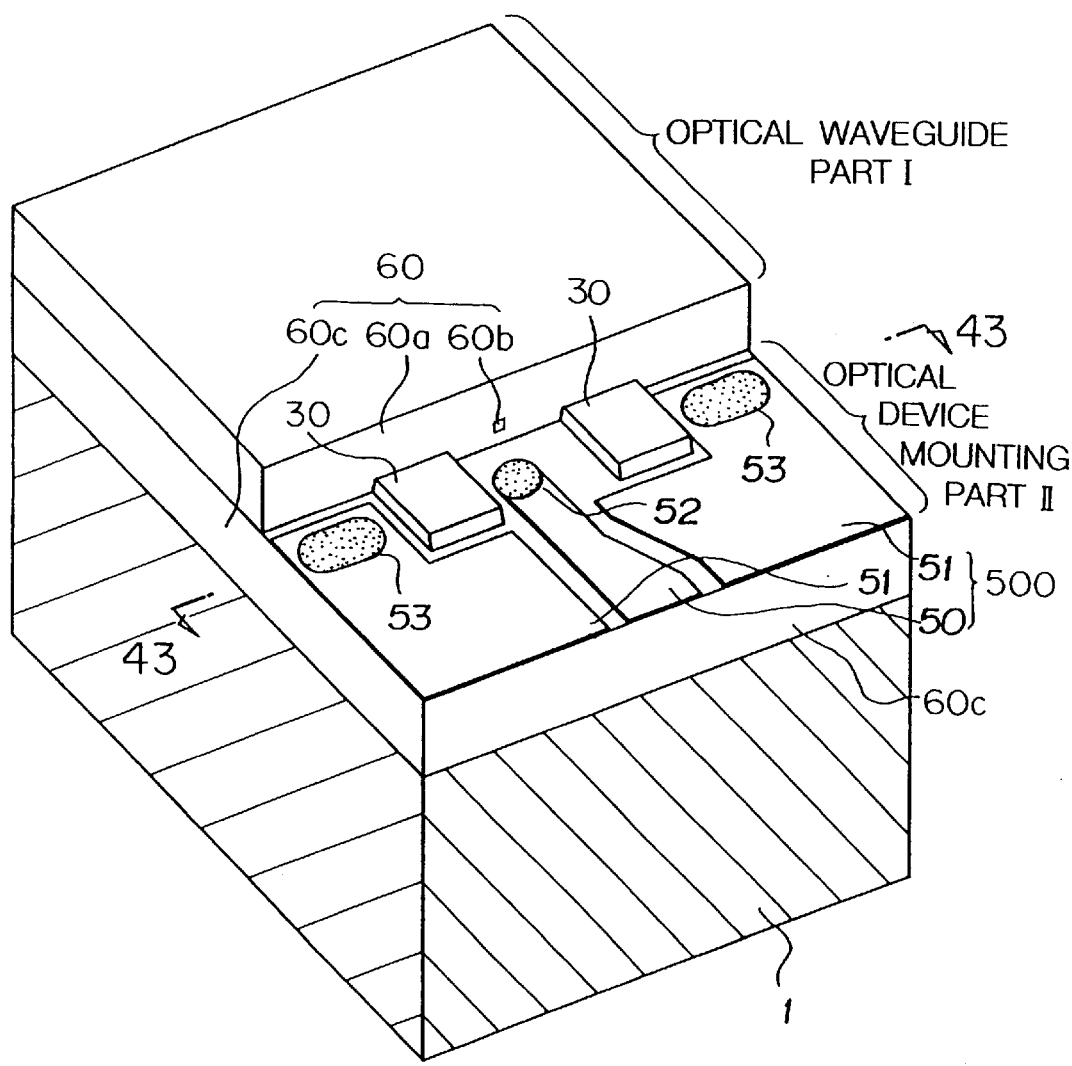
FIG. 42 is a schematic perspective view showing a seventeenth embodiment of an opto-electronic hybrid integrated circuit according to the present invention.

FIG. 42 is a schematic perspective view showing an optical packaged substrate in a seventeenth embodiment of the hybrid optical integrated circuit of the present invention. A difference of the present embodiment from Embodiments 15 and 16 is that the optical device 37 held by the sub-carrier is mounted on the optical device mounting part II, and the other construction is basically the same as Embodiment 1 or 2.

Figure 43:
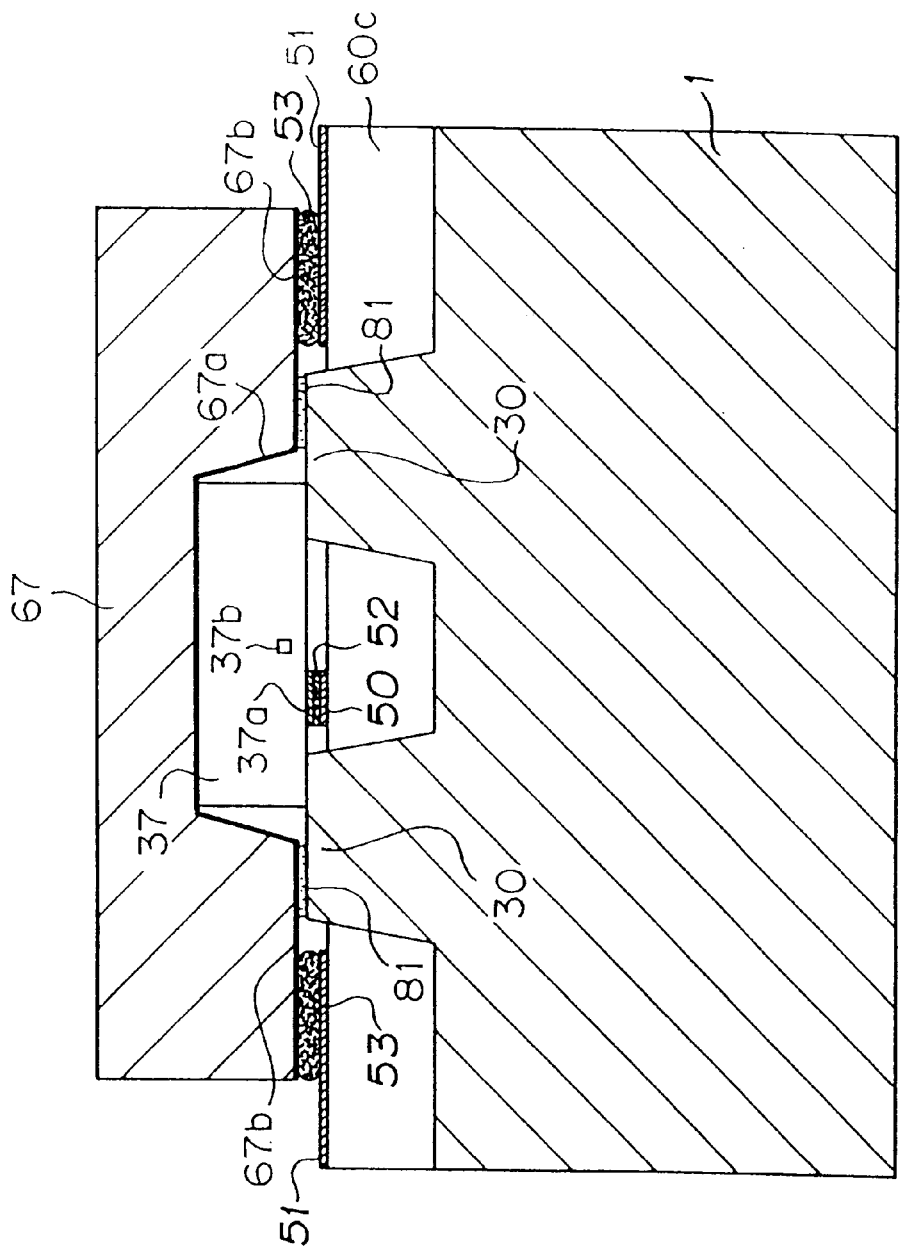
FIG. 43 is a cross-sectional view taken on line 43—43 of FIG. 42.

Referring to FIG. 42, the solder pattern 52 for the optical device active layer is formed on the central conductor pattern 50 of the electrical wiring layer 500 of the optical device mounting part II, and a solder pattern 53 for the sub-carrier is formed on the ground conductor pattern 51. A condition where the optical device held on the sub-carrier 67 is mounted on the substrate 1 is shown in FIG. 43. FIG. 43 is a 43—43 cross sectional view of FIG. 42. In FIG. 43, the sub-carrier 67 is formed of the same material as the substrate 1, and the optical device 37 is held on the recess 67*a*. A conductive layer is formed on the surface of the recess 67*a* to be conductive to the backside of the optical device 37. The protrusion surface 67*b* of the sub-carrier 67 is in line with the surface (lower surface in FIG. 43) of the optical device 37, or set lower than the height of the surface of the optical device 37. Therefore, when the sub-carrier 67 is mounted on the device mounting part of the hybrid optical integrated substrate, the optical device 37 surface is contacted with the silicon protrusion 30 to complete the height adjustment. The electrode 37*a* at the active layer 37*b* side of the optical device 37 is electrically connected with the central conductor pattern 50 on the substrate through the solder pattern 52. In the present embodiment, the positions of the electrode 37*a* of the optical device 37 and the solder pattern 52 are shifted to the side from directly beneath the optical device active layer 37*b*. This prevents a stress associated with mounting the optical device from acting directly upon the active layer. Further, the electrode (not shown) on the optical device backside passes through the conductive layer formed on the recess 67*a* surface of the sub-carrier 67, and is connected to the ground conductor pattern 51 on the substrate through the solder pattern 53. Further, the surface of the sub-carrier 67 and the silicon protrusion 30 are thermally connected through a thermal conductive material 81 to complete mounting of the optical device 37 on the substrate.

In the present embodiment with the above construction, since the optical device backside electric can be taken out from the same surface as the active layer side electrode through the sub-carrier 67, wireless surface packaging of the optical device is possible. Therefore, by combining with the substrate structure of the present invention, superior high-frequency characteristics can be provided. Further, as a heat sink of the optical device, a path for directly heat dissipating from the optical device surface to the protrusion of the silicon substrate 1 and a path for heat dissipating to the protrusion of the silicon substrate 1 from the optical device backside through the sub-carrier are formed, thereby providing improved heat dissipation.

Embodiment 18

Figure 44A:
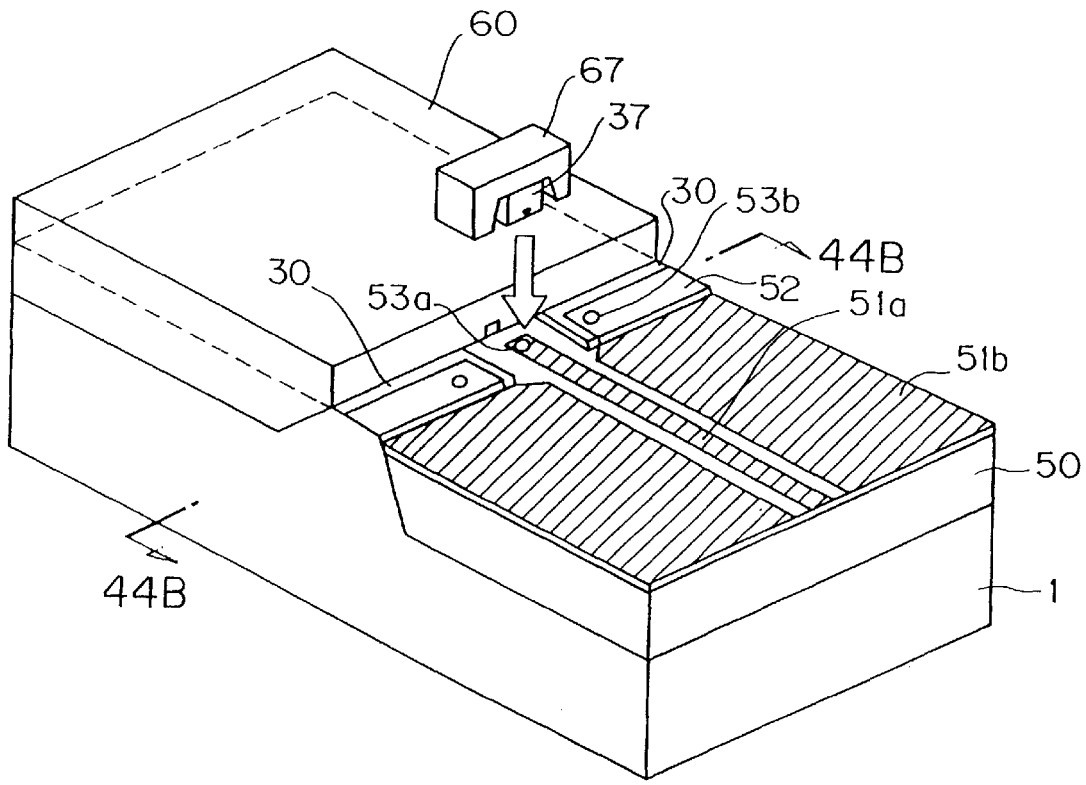
FIG. 44A is a schematic perspective view showing an eighteenth embodiment of an opto-electronic hybrid integrated circuit according to the present invention.
Figure 44B:
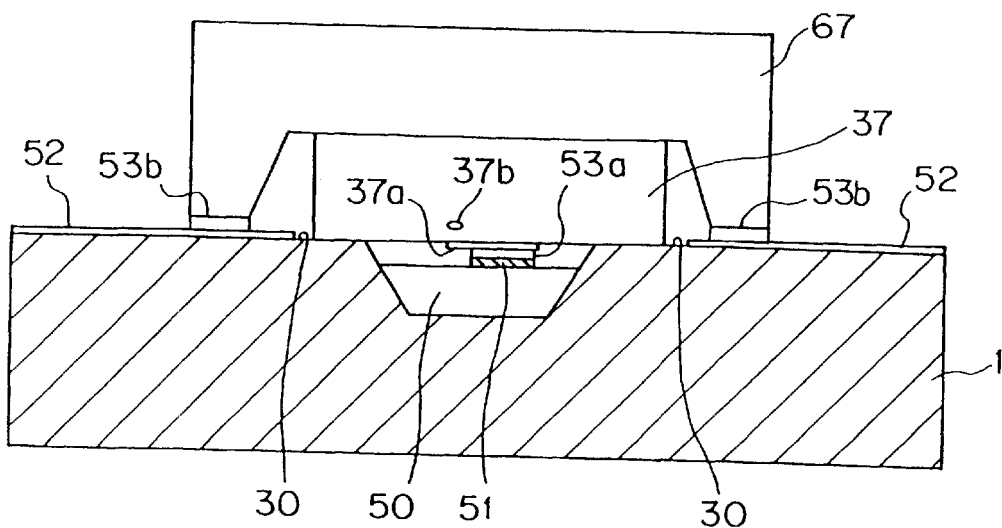
FIG. 44B is a cross-sectional view taken on line B—B' of FIG. 44A.

FIGS. 44A and 44B are schematic views showing an eighteenth embodiment of the opto-electronic hybrid integrated circuit of the present invention. FIG. 44A being a perspective view, and FIG. 44B being a cross-sectional view taken on line 44B—44B of FIG. 14A. A difference of the present embodiment from Embodiment 17 is in the structure of connection of the sub-carrier 67 for holding the optical functional device with the silicon terrace 30. That is, the active layer side surface electrode 37*a* of the optical functional device 37 is connected and mounted through the conductor pattern 51*a* provided on the dielectric layer 50 and a solder bump 53*a* which is an electroconductive bonding material. On the other hand, the device backside electrode is connected through the conductor pattern on the sub-carrier 67 surface, the thin film electrode 52 provided on the silicon terrace 30, and a solder bump 53b provided on the electrode 52.

In previous Embodiment 17, when mounting the sub-carrier 67 to the solder bump 53, the conductor pattern connecting to the sub-carrier 67 is provided on the dielectric layer 60*c*. Therefore, it is required to coat a thermal conductive material between the sub-carrier 67 and the silicon terrace 30 in order to enhance the heat dissipation effect of the device, which results in a complex packaging process. On the other hand, in the present embodiment, since the sub-carrier 67 is mounted on the silicon terrace 30 through the solder bump 53b, and the solder bump 53b can also be utilized as a thermal conductive material. As a result, the packaging process can be simplified.

Embodiment 19

Figure 45A:
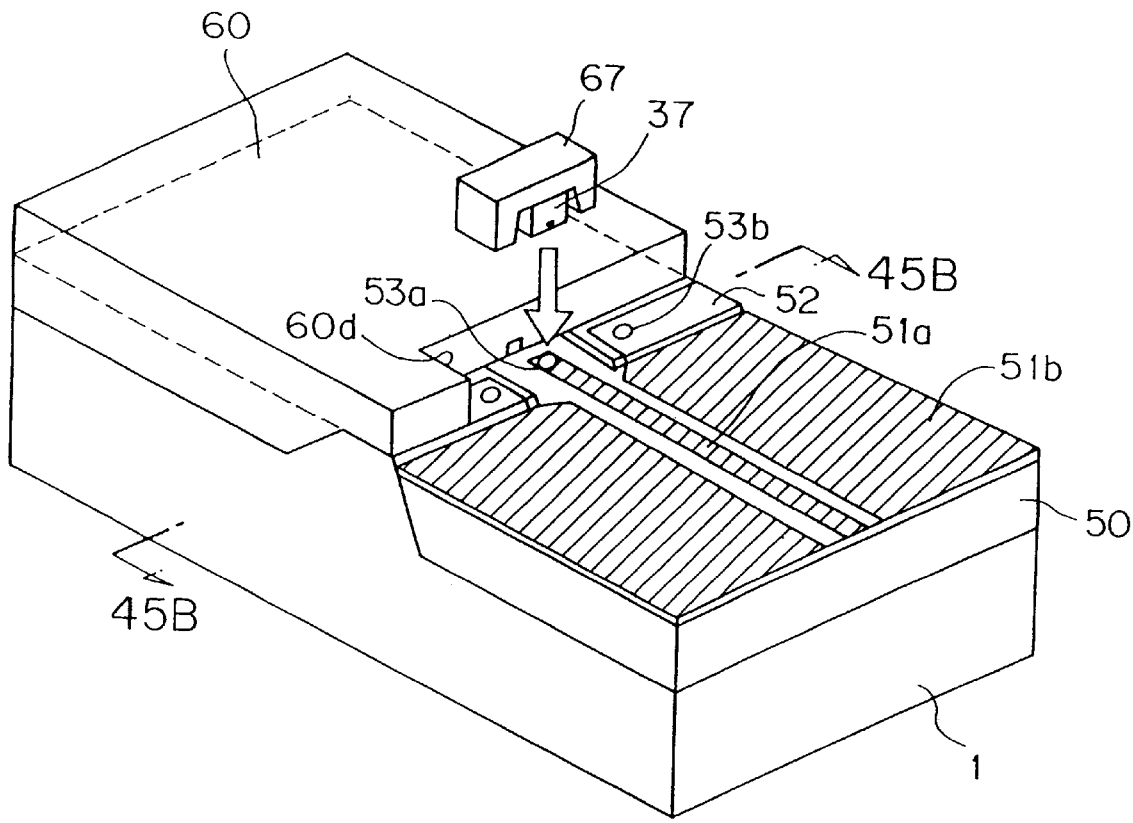
FIG. 45A is a schematic perspective view showing a nineteenth embodiment of an opto-electronic hybrid integrated circuit according to the present invention.
Figure 45B:
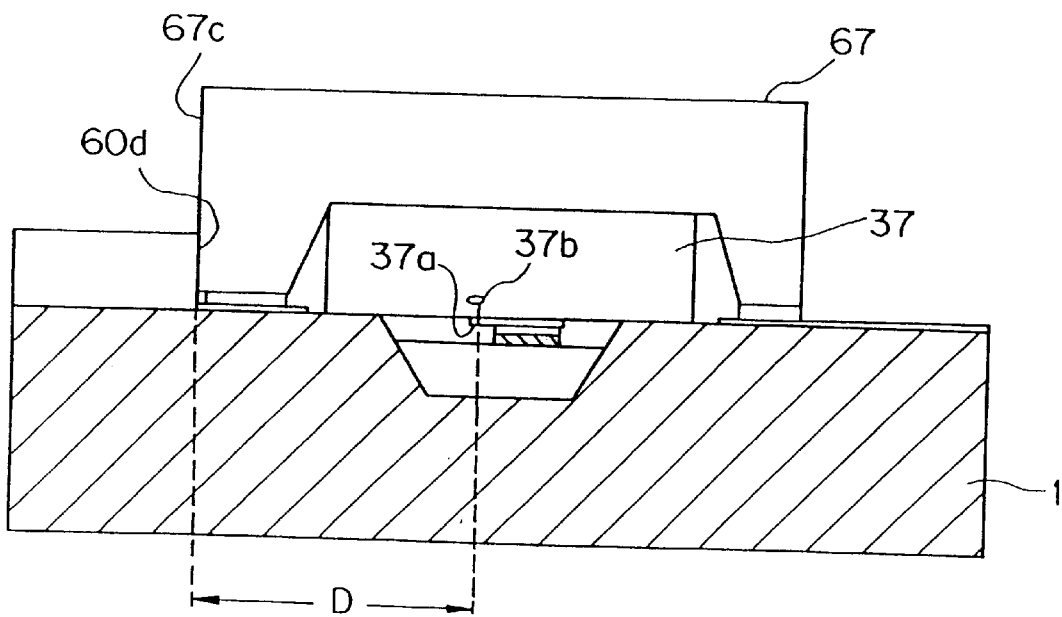
FIG. 45B is a cross-sectional view taken on line 45B—45B of FIG. 45A.

FIGS. 45A and 45B are schematic views showing a nineteenth embodiment of the opto-electronic hybrid integrated circuit of the present invention, FIG. 45A being a perspective view, and FIG. 45B being a cross-sectional view taken on line 45B—45B of FIG. 45A. Differences of the present embodiment from Embodiment 18 are that the packaged substrate 1 is provided with a guide for directional positioning in plane of the optical functional device 37a and, in the sub-carrier holding the optical functional device, the distance from the outer side surface 67c of the sub-carrier 67 to the active layer 37b is set equal to a distance D from a guide inner wall 60d of the packaged substrate 1 to the optical waveguide core center. With this construction, alignment-free optical device hybrid integration is possible while using the sub-carrier.

Figure 46:
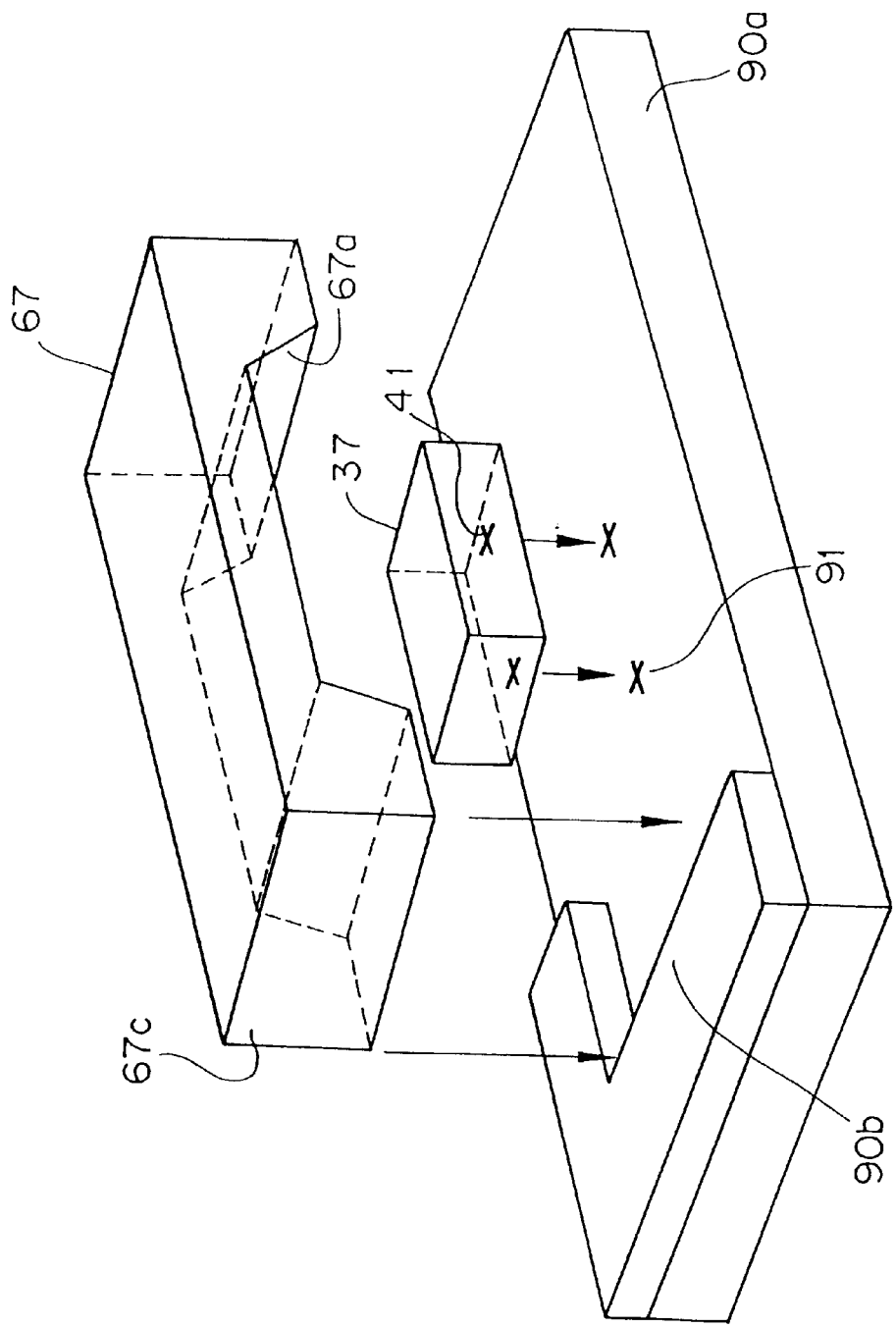
FIG. 46 is a schematic perspective view showing a process for mounting an optical functional device on a sub-carrier of the circuit as shown in FIGS. 45A and 45B.

To set the distance from the outer side surface 67c of the sub-carrier 67 to the active layer 37b of the optical functional device 37 to the desired value D, for example, the optical functional device can be mounted on the sub-carrier as shown in FIG. 46. That is, the reference numeral 90a indicates a device holding tool, on which surface are provided a guide 90b for setting the sub-carrier at the desired position, and a marker 91 for setting the optical functional device at the desired position. Therefore, first the optical device 37 is placed on the tool 90a so that the marker 41 formed on the surface at the active layer side of the optical device 37, with the active layer side surface facing down, is in line with the marker 91 on the tool 90a, and the optical functional device 37 can be mounted on the sub-carrier 67 with the outer side surface 67c of the sub-carrier contacted against the guide 90b on the tool 90a.

A device mounting method in which the positioning reference surface provided on the optical device is contacted directly against the guide surface on the packaged substrate had a problem in view of reliability of the optical device because a lattice defect may be generated in the optical device. On the other hand, in the present embodiment, the outer side surface 67c of the sub-carrier 67 is contacted against the positioning guide 90b, thereby achieving alignment-free device mounting without contacting the optical functional device side surface against the guide. Therefore, packaging is possible without deteriorating the reliability of the device even in device mounting using a guide structure.

Embodiment 20

Figure 47:
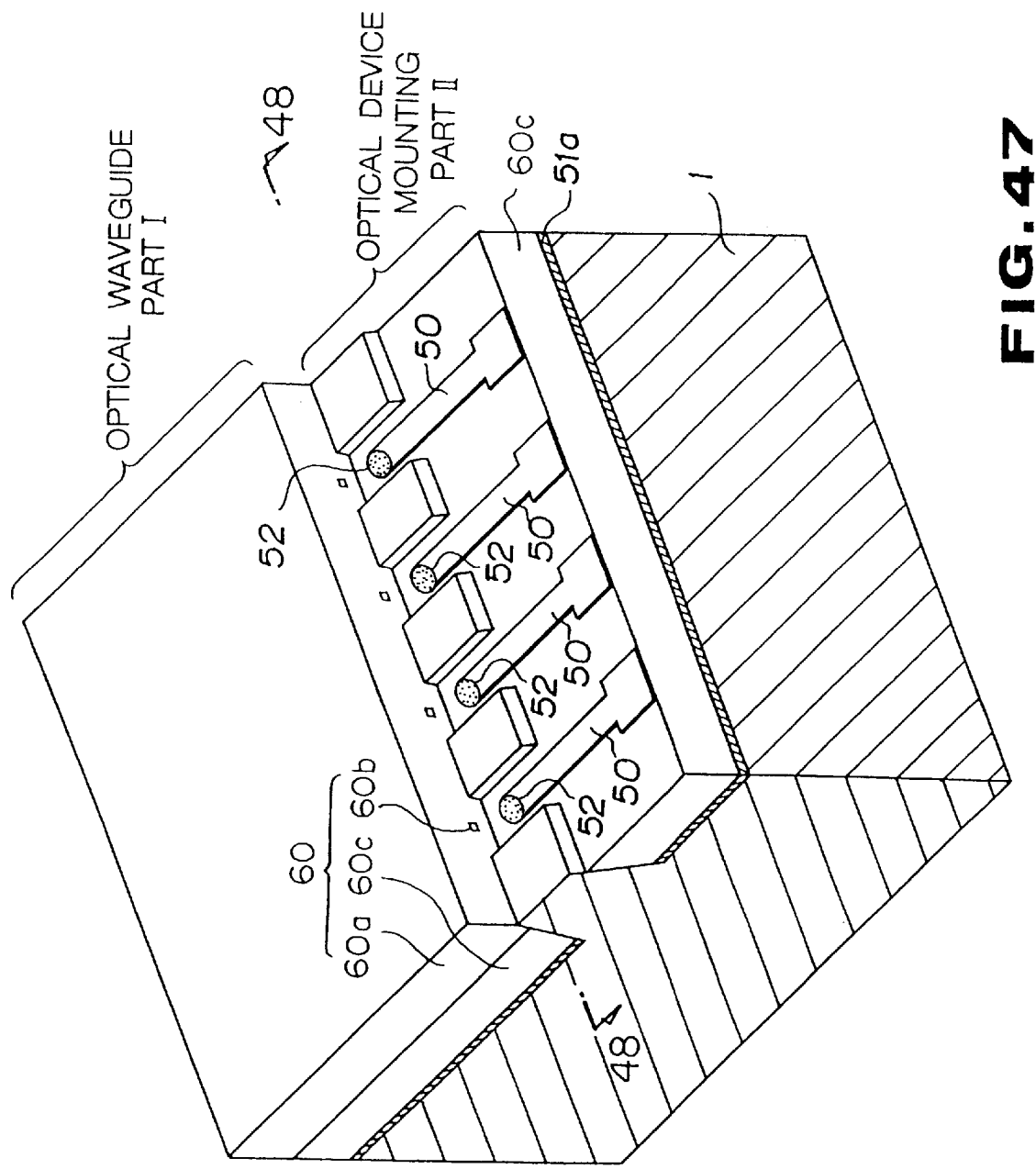
FIG. 47 is a schematic perspective view showing a twentieth embodiment of an opto-electronic hybrid integrated circuit according to the present invention.

FIG. 47 is a schematic perspective view showing an optical packaged substrate in a twentieth embodiment of the hybrid optical integrated circuit of the present invention. The present embodiment features that in the optical device mounting part II, the ground conductor layer 51a is embedded between the recess of the silicon substrate 1 and the under-cladding layer 60c, and other subject matters are almost the same as Embodiments 15 to 17. With the construction, in the optical device mounting part II, the under-clad 60c, the electrical wiring 50 provided on the surface, and the embedded ground conductor 51a form a microstrip like arrangement, thereby providing improved high-frequency characteristics. Using the microstrip line, the electrical wiring density can be easily enhanced compared to the coplanar line as used in Embodiments 15 to 17.

Figure 48:
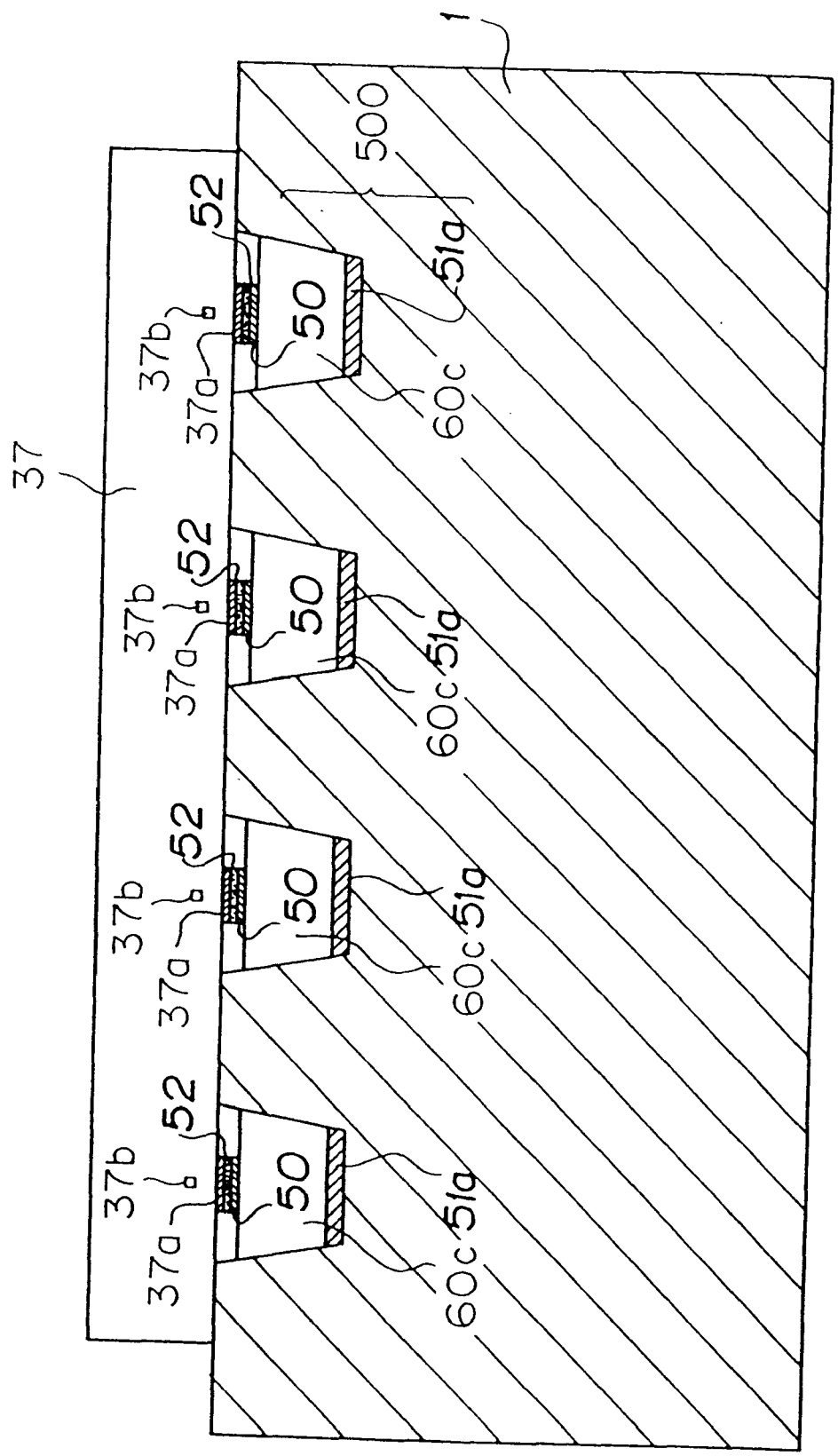
FIG. 48 is a cross-sectional view taken on line 48—48 of FIG. 47.

FIG. 48 is a schematic cross sectional view along line 48—48 in FIG. 47 when the LD array 37 is mounted on the hybrid optical integrated substrate shown in FIG. 47. The electrical wiring part 500 is formed on the recess of the silicon substrate 1 including the electrode connection part with the optical device. Further, the protrusion surface of the silicon substrate 1 is the height reference surface of the LD array, and also functions as a heat sink.

Thus, the present embodiment can simultaneously provide the low-loss function, the high-frequency electrical wiring function, and the optical bench function.

Embodiment 21

Figure 49:
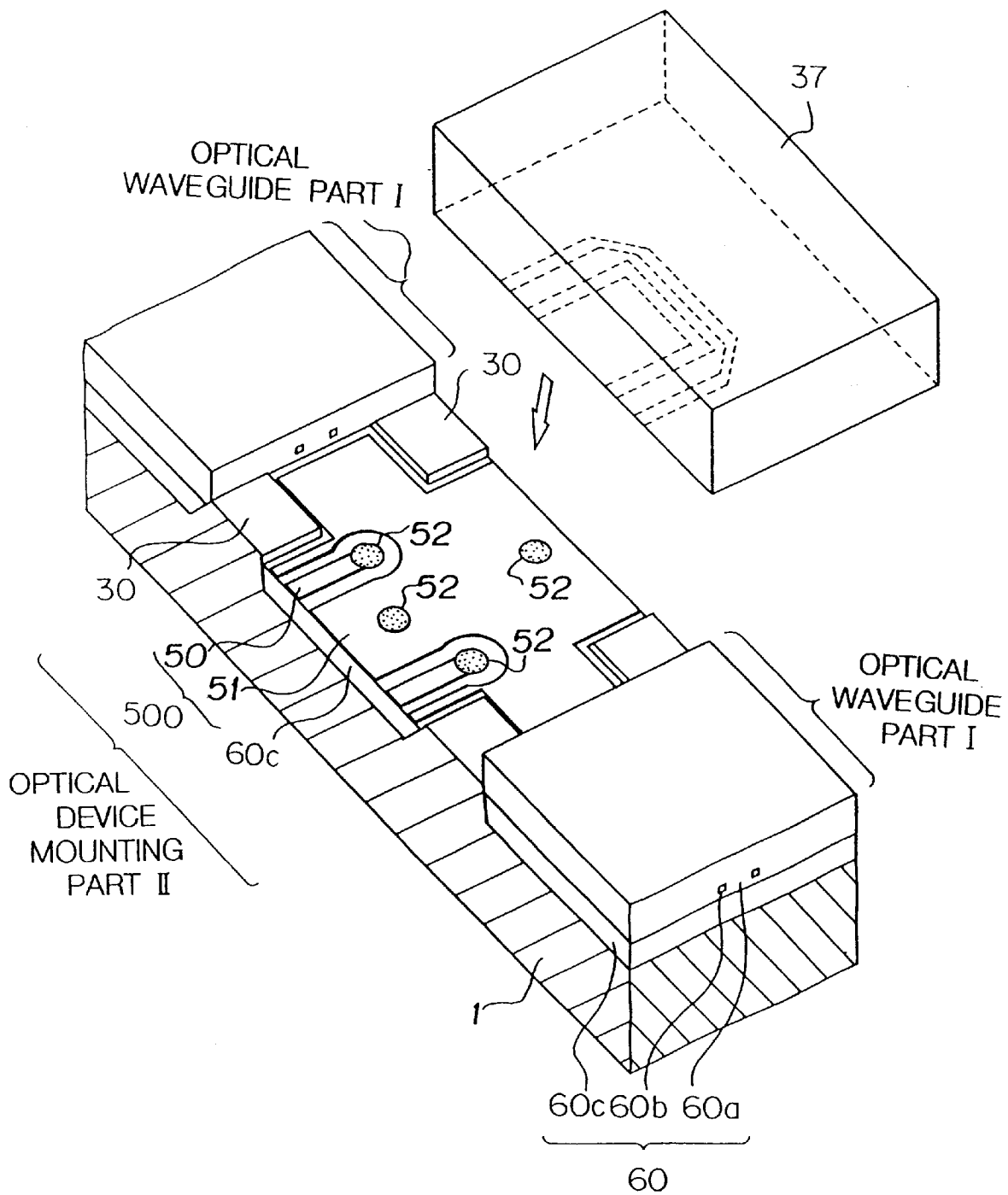
FIG. 49 is a schematic perspective view showing a platform used in a twenty-first embodiment of an opto-electronic hybrid integrated circuit according to the present invention.
Figure 50:
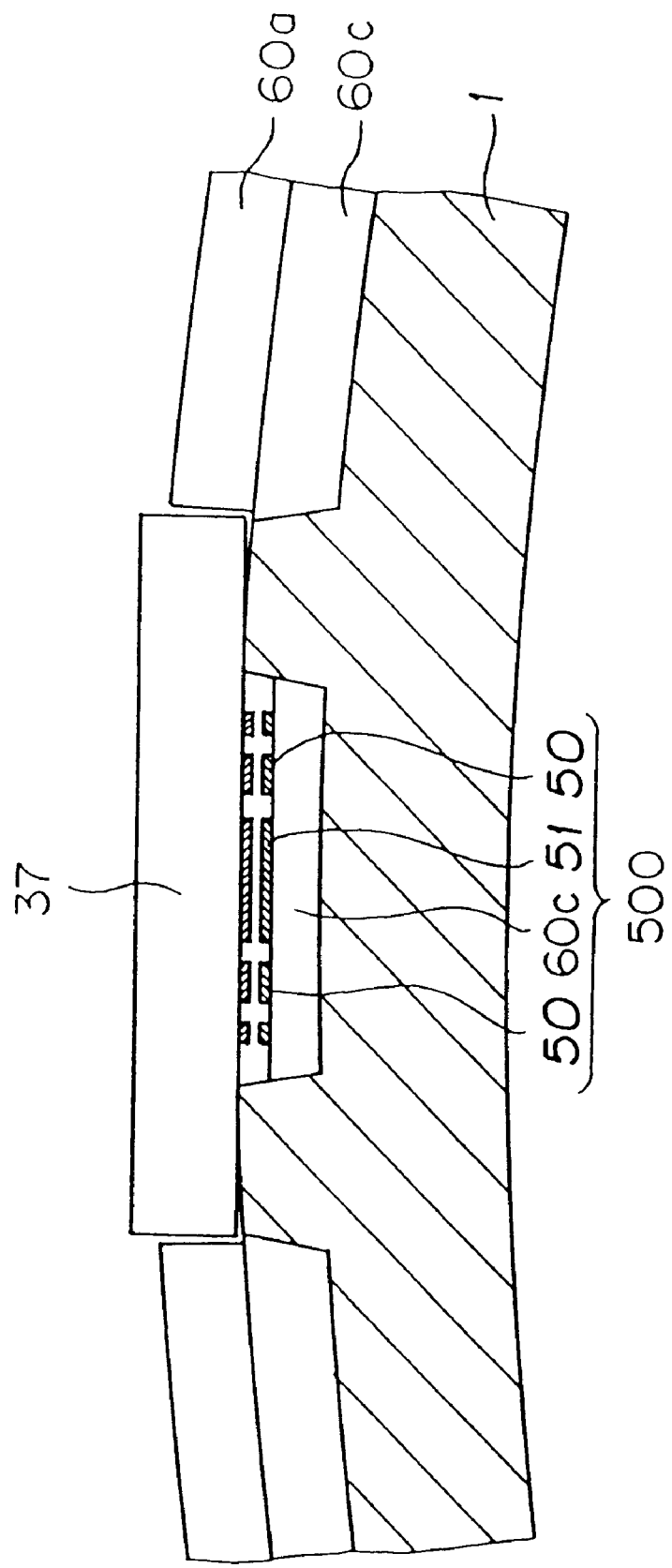
FIG. 50 is a cross-sectional view showing the platform with a warping of FIG. 49.

FIG. 49 is a schematic perspective view showing an optical packaged substrate in a twenty-first embodiment of the hybrid optical integrated circuit of the present invention, showing a construction where the length of the optical device is increased. The optical device 37 is a 15 mm long LiNbO$_3$ (LN) waveguide. The present embodiment is formed of the silica-based optical waveguide on the silicon substrate as in other Embodiments. When the optical device length is increased as in the present embodiment, longitudinal warping of the substrate and optical device cannot be neglected. In the present embodiment, the silicon protrusion is divided into four parts, and the individual parts are provided close to the optical waveguide so that the silicon protrusion surface 30 functions as a good height reference surface even with a warping in the substrate and the LN chip as shown in FIG. 50. Further, the electrical wiring 500 is formed as a coplanar line on the surface of the silica-based optical waveguide under-cladding layer 60c formed in an area between the four-divided silicon protrusion.

As a result, as shown in FIG. 50, the silicon protrusion functions as a height reference surface even when unnegligible warping exists in the substrate and LN waveguide. Further, the electrical wiring part shows improved high-frequency characteristics as in other Embodiments.

Construction of the hybrid optical integrated substrate of the present invention has been described above with reference to a case of a silica-based optical waveguide formed on the silicon substrate, however, the present invention can also be applied to other materials. The substrate of the optical waveguide has a sufficient difference in etching speed to an etchant used in etching to form the device mounting part in the optical waveguide, and a combination of the substrate and dielectric optical waveguide can be used so that the substrate functions as an etching stop layer to achieve the present invention. When such a combination of the substrate and the dielectric optical waveguide is used, the substrate protrusion functions as a high precision height reference surface. Further, in view of the high-frequency characteristics of electrical wiring, it is preferable to use an optical waveguide of a material having a lower dielectric constant than the substrate material.

Examples of such combination of the substrate and the dielectric optical waveguide, in addition to the silica-based optical waveguide/silicon substrate, include a silica-based optical waveguide/alumina ceramic substrate, a silica-based optical waveguide/nitride alumina ceramic substrate, and use of a polymer-based dielectric optical waveguide such as a polyimide optical waveguide or the like in place of the silica-based optical waveguide. However, when a substrate of poor thermal conductivity such as alumina ceramic is used, it is necessary to provide a heat sink of the optical device on a separate substrate as shown in Embodiment 20 (FIG. 46).

Further, examples of mounting the optical device have been shown in the above individual embodiments, it is of course possible to integrate an optical device driving electronic circuit, or a signal processing electronic circuit in addition to the optical device.

As described above, in the hybrid optical integrated substrate of the above embodiment, the basic structure is that the dielectric optical waveguide is formed on the recess on the substrate having a protrusion and a recess, and the protrusion is used as an optical device mounting part to form an optical waveguide substrate having a terrace, and the electrical wiring layer is formed on the dielectric optical waveguide formed on the recess of the substrate. As a result, even when a substrate having a relatively low resistivity (e.g. silicon substrate) is used, or even with a substrate having a relatively high dielectric constant (e.g. alumina ceramic substrate), the electrical characteristics are not affected by the substrate, and improved high-frequency characteristics can be obtained.

Further, in the hybrid optical integrated substrate of the present invention in which the substrate protrusion of the optical device mounting part is divided into two or more parts, the dielectric optical waveguide layer is formed in the area there between, and the electrode pad part for connecting the optical device to the electrical wiring on the substrate is provided on the dielectric optical waveguide layer, since all of the electrical wiring part can be formed on the dielectric optical waveguide layer, the high-frequency characteristics are remarkably improved and, at the same time, the upper surface of the substrate protrusion can be used as a height reference surface for mounting the optical device, thereby achieving precision optical device mounting.

Embodiment 22

Figure 51:
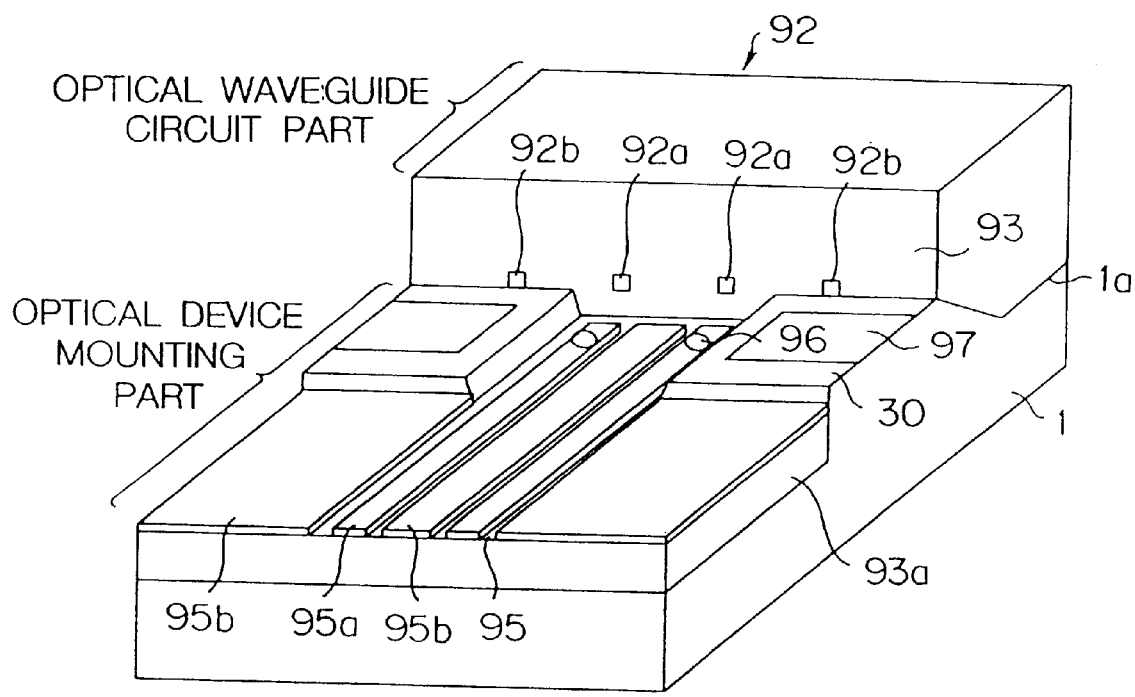
FIG. 51 is a schematic perspective view showing a platform used in a twenty-second embodiment of an opto-electronic hybrid integrated circuit according to the present invention.

FIG. 51 is a schematic perspective view showing construction of an optical packaged substrate in a twenty-second embodiment of the hybrid optical integrated circuit of the present invention. In FIG. 21, the reference numeral 1 indicates a substrate, 1a is a substrate recess, and 30 is a substrate protrusion. The reference numeral 92 indicates a dielectric optical waveguide, 92a is a signal optical waveguide, 92b is a monitor optical waveguide, and 93 and 93a are cladding layers. This reference numeral 95 indicates an electrical wiring surface of the optical device mounting part, 95a and 95b are a central conductor and a ground conductor as an electrical wiring layer, and 96 is a fixing material. The surface of the substrate protrusion functions as a height reference surface of the optical device mounting part. Further, the surface is provided with a monitor thin electrode 97.

The optical packaged substrate shown in FIG. 51 uses a silicon substrate as the substrate 1, and a silica-based optical waveguide as the optical waveguide circuit 92. The silicon substrate is provided with a protrusion and recess of 40 μm step. An under-cladding layer comprising a 42 μm thick silica-based glass is provided on the recess, a core of 6×6 μm, a signal optical waveguide 92a with a refractive index difference D=0.75%, and a monitor optical waveguide 92b are formed on top. The distance between the protrusion of the silicon substrate 1 and the waveguide core center is set to 5 μm in line with the size of the optical functional device which will be described later. An end of the monitor optical waveguide 92b is disposed at a position corresponding to the height reference surface comprising the protrusion of the silicon substrate 1, and an end of the signal optical waveguide 92a is disposed at a position corresponding to the electrical wiring surface 95. A 0.5 μm thick thin film gold electrode is formed on the height reference surface 30. There is a 10 μm step between the protrusion surface of the silicon substrate 1 as the height reference surface and the electrical wiring surface 95, and the under-cladding layer 93a of 30 μm thick silica-based optical waveguide is provided under the electrical wiring surface 95. The electrical wirings 95a and 95b are 4 μm thick gold plating pattern, and a 4 μm thick solder bump is formed as the fixing material at the end.

Figure 52:
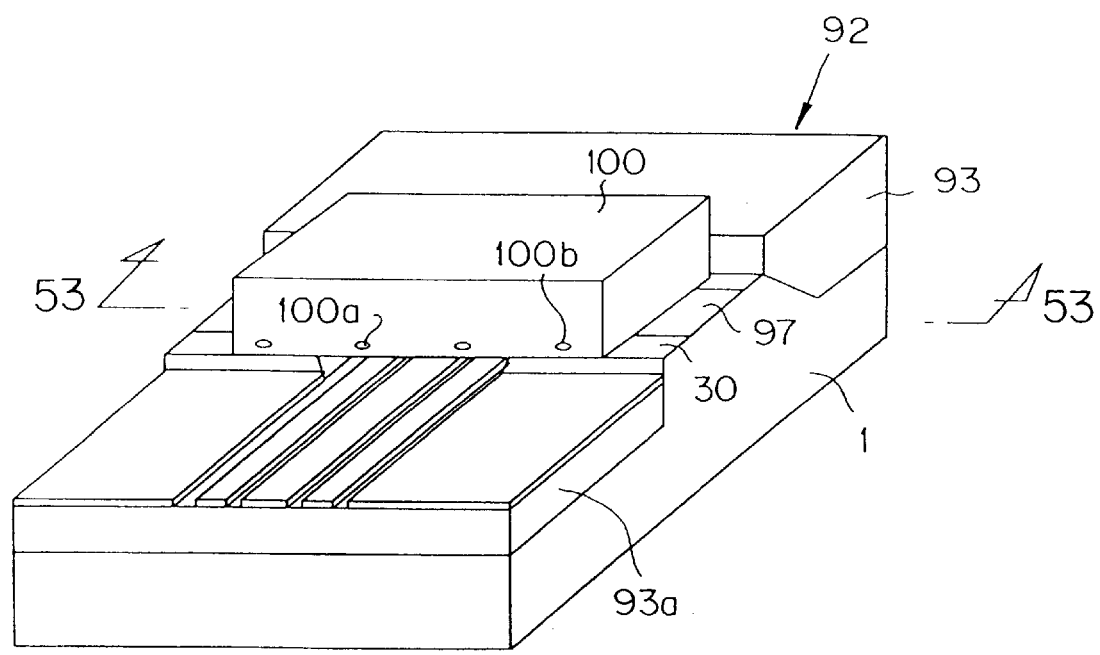
FIG. 52 is a schematic perspective view showing the twenty-second embodiment of an opto-electronic hybrid integrated circuit according to the present invention.

By mounting a desired optical functional device on the optical device mounting part on the optical packaged substrate of the above construction, a hybrid optical integrated circuit as shown in FIG. 52 can be formed. An optical functional device 100 in the present embodiment is a semiconductor laser, which has a signal port 100a and a monitor port 100b. Arrangement order and pitch of the individual ports correspond to the input/output end pitch of the optical waveguides 92a and 92b of the optical waveguide circuit. When the optical functional device 100 is mounted upside down on the optical device mounting part, the monitor port 100b of the optical functional device is disposed on the height reference surface 30 of the protrusion of the silicon substrate 1, and the signal port 100a is disposed on the electrical wiring surface.

Figure 53:
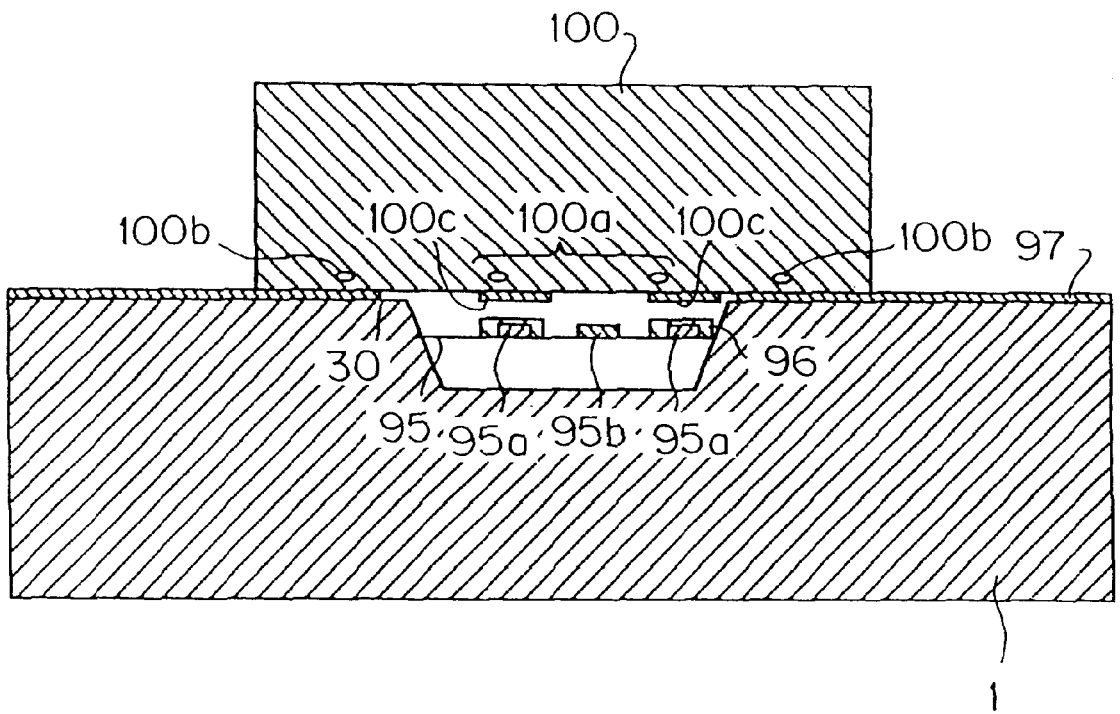
FIG. 53 is a cross-sectional view taken on line 53—53 of FIG. 52.

FIG. 53 is a schematic cross sectional view taken along line 53—53 in FIG. 52. The active layers 100a and 100b of the semiconductor laser 100 are located at positions of 4.54 μm from the device surface. On the other hand, in the hybrid optical integrated substrate, the distance from the surface of the thin film electrode 97 on the height reference surface (silicon protrusion) to the optical waveguide core center is set to 4.5 μm. Therefore, by merely mounting the semiconductor laser on the height reference surface as shown, positioning in the height direction of the optical waveguide and the semiconductor laser can be completed.

To achieve in-plane direction positioning, positioning must be carried out by monitoring the optical coupling efficiency of the semiconductor laser and the optical waveguide. Since the surface electrode 100c under the optical signal port 100a of the semiconductor laser does not contact the electrical wiring 95 on the substrate 1 and the solder bump 96, core adjustment cannot be performed utilizing the optical signal port 100a. However, in the present embodiment, the monitor optical waveguide 92b and the monitor port 100b are provided on the hybrid optical integrated circuit and the optical functional device, and the surface electrode 100c under the monitor port 100b is contacted with the thin film electrode 97 on the height reference surface 30, core adjustment utilizing the monitor port is possible.

The core adjustment can be carried out by functioning the semiconductor laser as a light-receiving device. That is, monitor light is transmitted in the monitor optical waveguide, the light-receiving current of the monitor port relative to the monitor light is monitored to find a position where the current is a maximum.

Further, as active alignment, it is possible to use a method in which the LD 100 is caused to emit light, and a position where the optical output from the monitor optical waveguide is a maximum.

Figure 54:
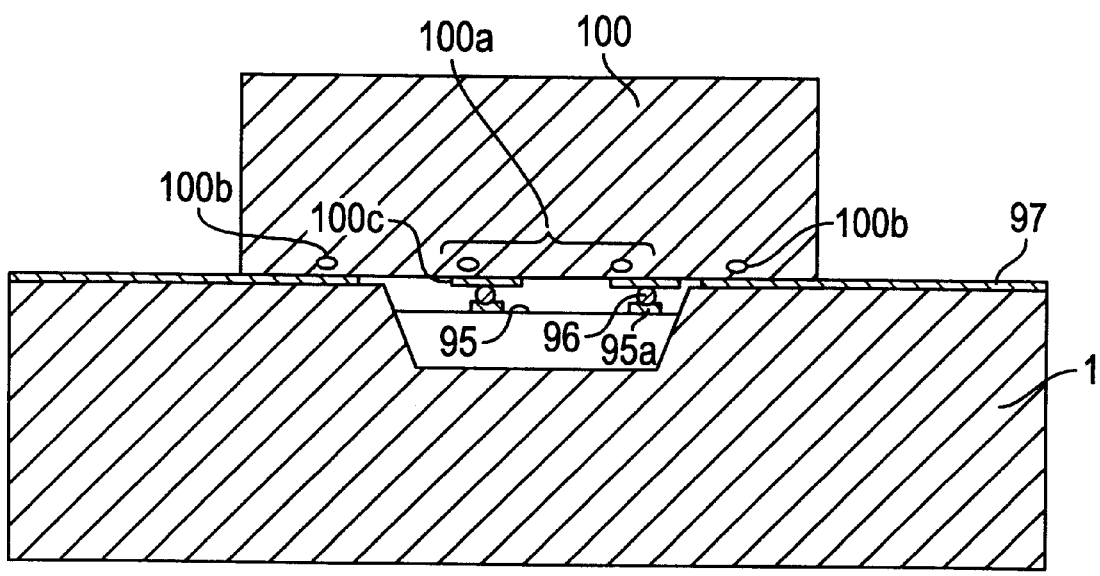
FIG. 54 is a cross-sectional view showing the circuit of FIG. 53 after reflow of a solder bump.

Then, as shown in FIG. 54, after core adjustment, by heating to reflow the solder bump 96, since the solder bump contacts the signal port upper electrode 100c of the semiconductor laser, electrical connection and device fixing between the semiconductor laser and the hybrid optical integrated substrate can be achieved. In this case, the contact position between the solder and the optical functional device is set slightly shifted from immediately beneath the port (active layer), thereby preventing a stress associated with solidification shrinkage of solder from directly acting upon the optical signal port of the optical functional device.

Excessive coupling loss by position deviation in the hybrid optical integrated circuit was less than 0.5 dB. This indicates that in the hybrid optical integrated circuit of the present embodiment, LD surface packaging can be achieved with a precision within 1 μm. This becomes possible first by using the silicon protrusion surface as the height reference surface, and secondly by active alignment for in-plane direction positioning.

As described above, in the present embodiment, it is possible to make active alignment for core adjustment in the in-plane direction while functioning the optical functional device, and optical device mounting by a solder bump. Therefore, compared with prior art device mounting by passive alignment, optical device hybrid integration can be achieved with higher precision, and problems of reduction in mounting strength and large stress to the optical functional device due to the use of thin film solder, which was a problem in prior art active alignment, can be solved.

Further, the present embodiment uses a highly heat conductive silicon substrate, protrusion and recess are provided thereon, and the protrusion is used as a height reference surface for optical functional device mounting. With this construction, heat evolution of the optical functional device can be efficiently dissipated through the silicon protrusion.

Figure 1:
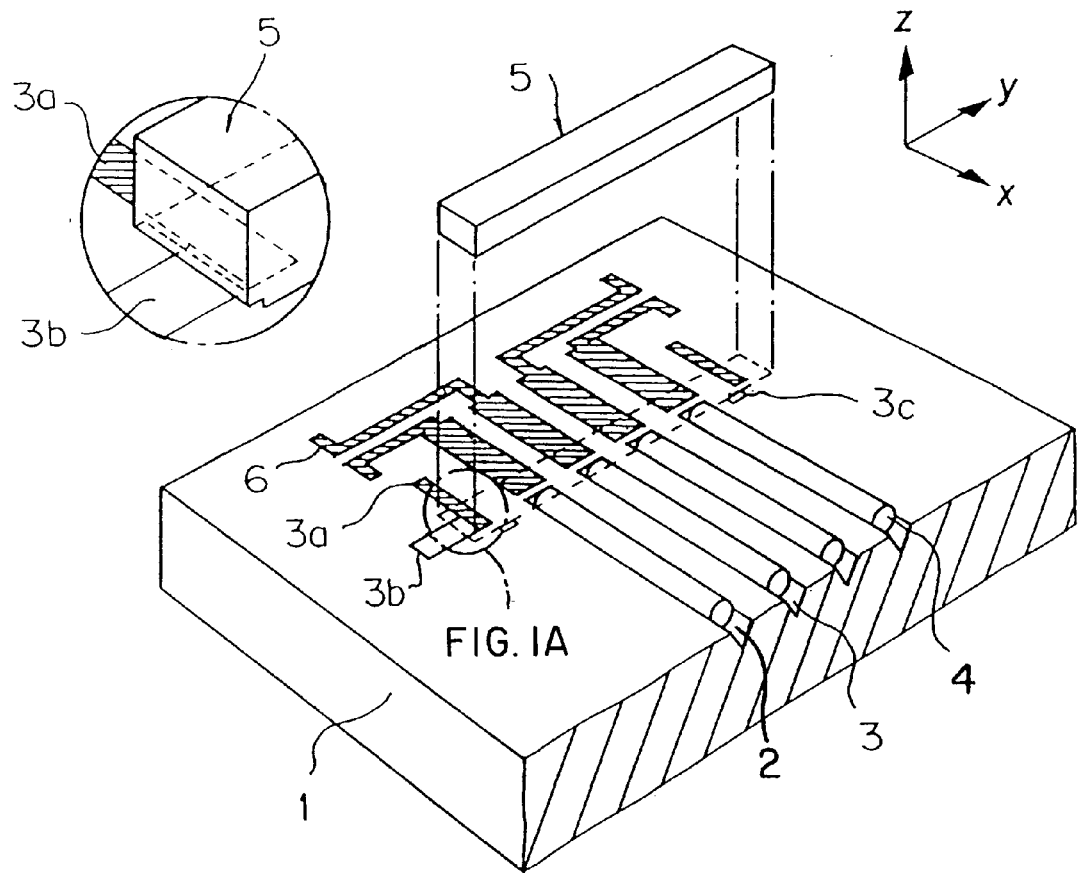
FIG. 1 is a schematic perspective view showing a construction called a "silicon optical bench"
Figure 2:
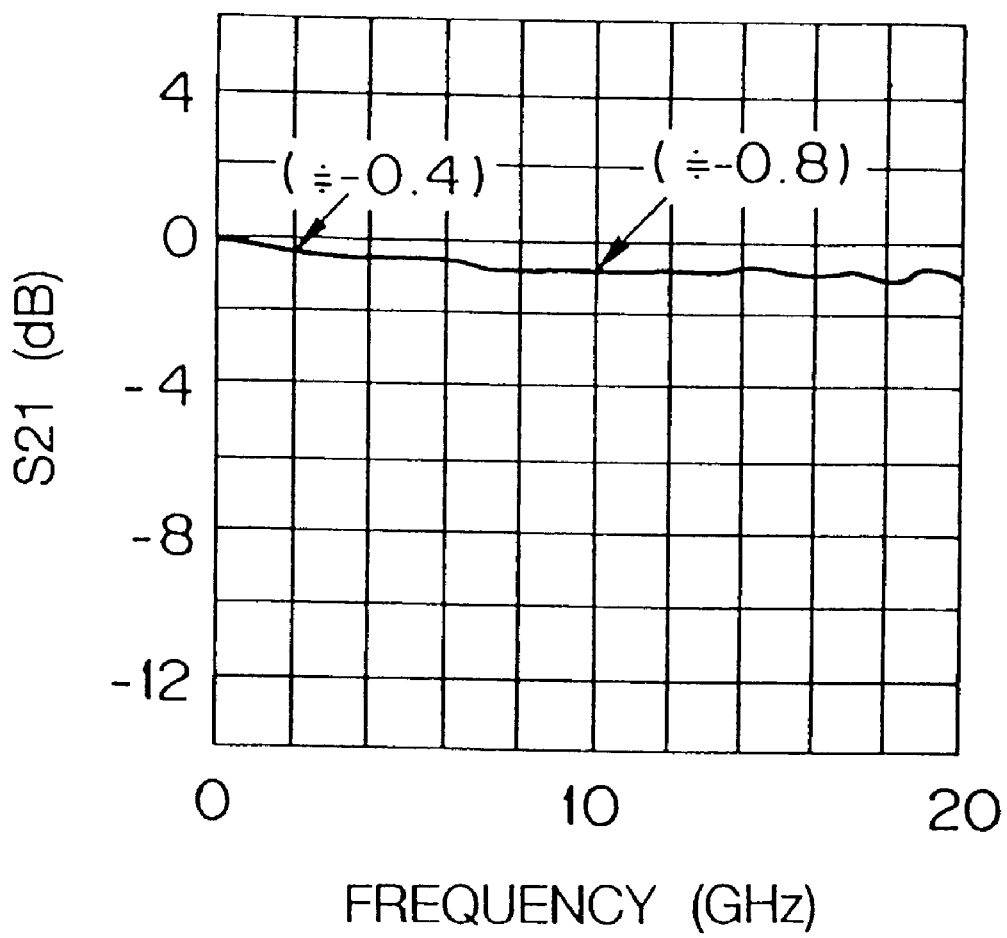
FIG. 2 is a graph illustrating high-frequency characteristics of a 0.6 mm long coplanar wiring formed directly on the silicon substrate.
Figure 3:
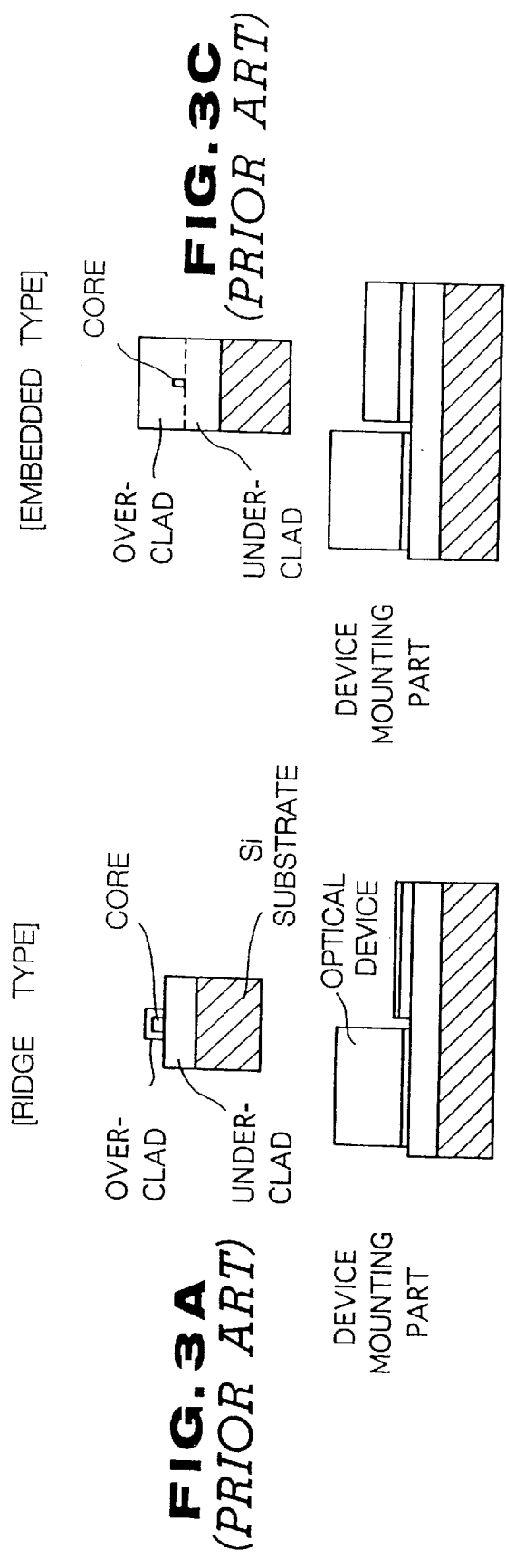
FIG. 3A is a cross-sectional view showing a platform having a structure of a ridge type optical waveguide.
FIG. 3B is a cross-sectional view showing an optical device mounting part of the platform shown in FIG. 3A.
FIG. 3C is a cross-sectional view showing a platform having a structure of an embedded type optical waveguide.
FIG. 3D is a cross-sectional view showing an optical device mounting part of the platform shown in FIG. 3D.

In the present embodiment, the electrical wiring surface of the optical device mounting part is provided on the silica-based optical waveguide cladding layer with a sufficient thickness. With such a construction, a hybrid optical integrated circuit with superior high-frequency characteristics can be achieved. That is, in the prior art as shown in FIG. 1, in general, electrical wiring is formed directly on the silicon substrate, or on a very thin oxide film having a thickness of about 0.5 $\mu$m. However, such a prior art construction had a problem in that the high-frequency characteristics of the electrical wiring part are considerably deteriorated by an influence of the silicon substrate as a semiconductor. In the present embodiment, this problem is solved by providing a dielectric layer of a sufficient thickness between the silicon substrate and the electrical wiring surface. In practice, it was confirmed that the electrical wiring part in the hybrid optical integrated circuit of the present embodiment had a band of about 10 GHz.

Embodiment 23

Figure 55:
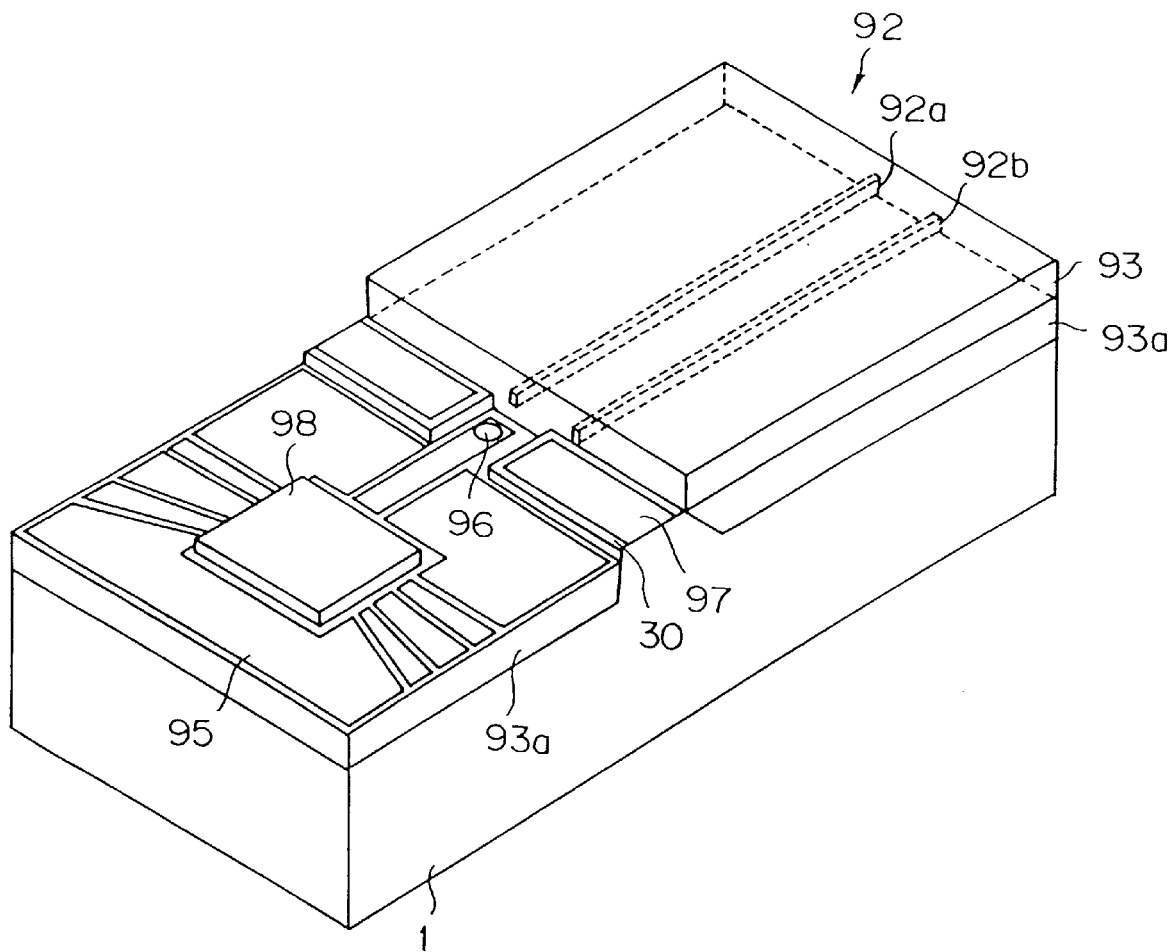
FIG. 55 is a schematic perspective view showing a platform used in a twenty-third embodiment of an opto-electronic hybrid integrated circuit according to the present invention.

FIG. 55 is a schematic perspective view showing construction of a twenty-third embodiment of the hybrid optical integrated circuit of the present invention. The present embodiment features that, unlike Embodiment 22 , in addition to the height reference surface for optical functional device, a protrusion is provided on the silicon substrate 1 as the optical device mounting part, an electronic circuit mounting surface 98 is provided on the silicon protrusion, and not only the electrical wiring for optical functional device but also electrical wiring for the electronic circuit are provided on the electrical wiring surface 98. Other components are similar to Embodiment 22. Similar components as those used in Embodiment 22 are indicated by similar reference symbols, and detailed description thereof is omitted.

With this construction, similar effects to those obtained in Embodiment 22 can be provided and, in addition, since the silicon substrate protrusion is also used as the electronic circuit mounting surface 98, heat evolution of the electronic circuit mounted thereon can be efficiently dissipated. That is, the optical packaged substrate used in the hybrid optical integrated circuit of the present invention can provide functions as an opto-electronic hybrid packaged substrate.

Embodiment 24

In previous Embodiment 22, the silicon substrate having protrusion and recess is used as the substrate, and the silica-based optical waveguide as the dielectric optical waveguide. However, to achieve both optical functional device positioning by active alignment, which is the object of the present invention, and device mounting by a thick film solder such as solder bump, other combinations than the material system can naturally be used. Such combination examples are shown below.

First, it is needless to say that the optical waveguide in Embodiment 22 is not limited to a silica-based optical waveguide. For example, when a polymer-based optical waveguide such as polyimide waveguide is used, all of the effects as obtained in Embodiment 22 can be provided.

Secondly, the substrate in Embodiment 22 can also be other than silicon substrate. For example, a ceramic substrate such as alumina substrate, which is proven as a packaged substrate of an electronic circuit, provided on the surface with a protrusion and a recess can also be used. Further, for the optical waveguide in this case, a silica-based optical waveguide, a polymer-based waveguide, and other materials can be used. When an alumina substrate is used as the substrate, the heat dissipation effect is inferior to Embodiment 22, but other functions are almost similar to Embodiment 22. Especially, it is sometimes superior to Embodiment 22 in terms of the high-frequency characteristics of the electrical wiring and expendability of wiring size.

Figure 56:
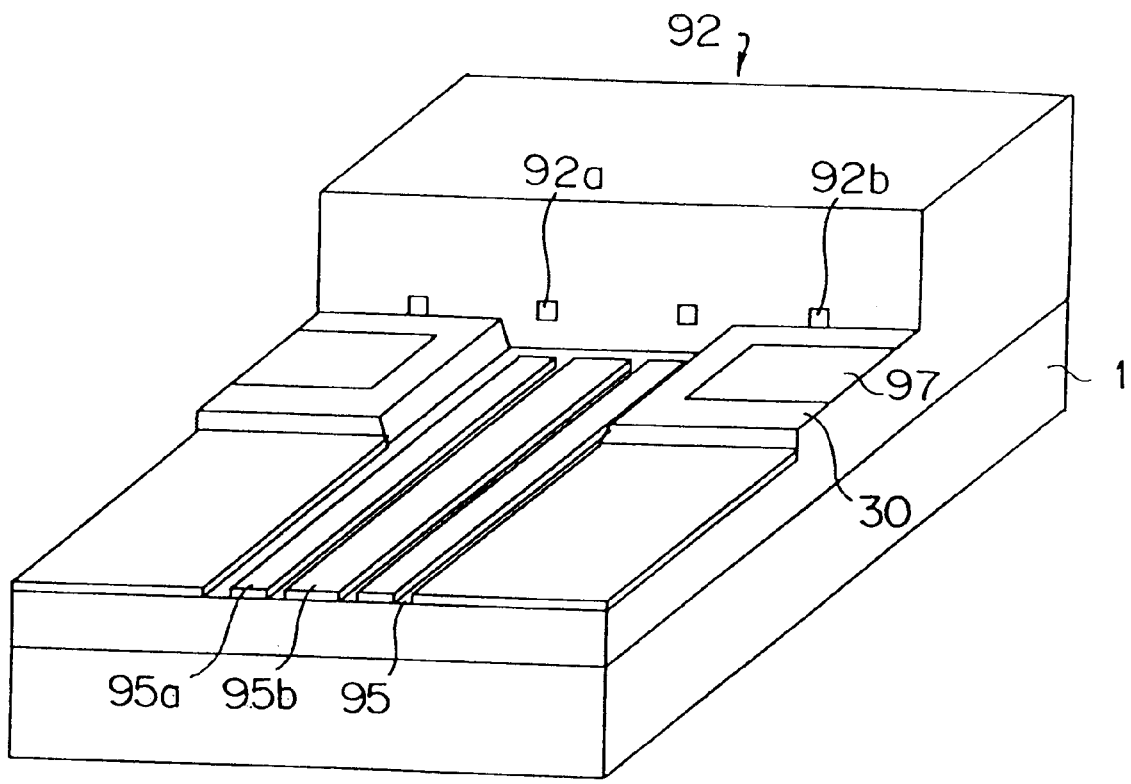
FIG. 56 is a schematic perspective view showing a structure of the platform of FIG. 55 when flat-surface alumina substrate is used as a substrate for the platform and silica-based optical waveguide is used as an optical waveguide for the platform.

Thirdly, Embodiment 22 uses a substrate having a protrusion and a recess formed on the surface but, instead, it is of course possible to use a substrate having a flat surface. FIG. 56 is a perspective view showing a substrate structure, as an example of this configuration, in which an alumina substrate having a flat surface and a silica-based optical waveguide are used. The height reference surface 30 of the optical device mounting part can be formed of an optical waveguide cladding layer.

In this case, height precision between the height reference surface 30 and the center of the optical waveguide cores 92$a$ and 92$b$ may be inferior to Embodiment 22. Further, when a ceramic substrate is used as the substrate, the heat dissipation effect may also be deteriorated.

However, also in the present embodiment, both the active alignment and thick film solder mounting, which are the object of the present invention, can be simultaneously achieved. Further, it is of course possible to use a silicon substrate as the flat surface substrate. A silica substrate can also be used as the substrate.

Figure 4:
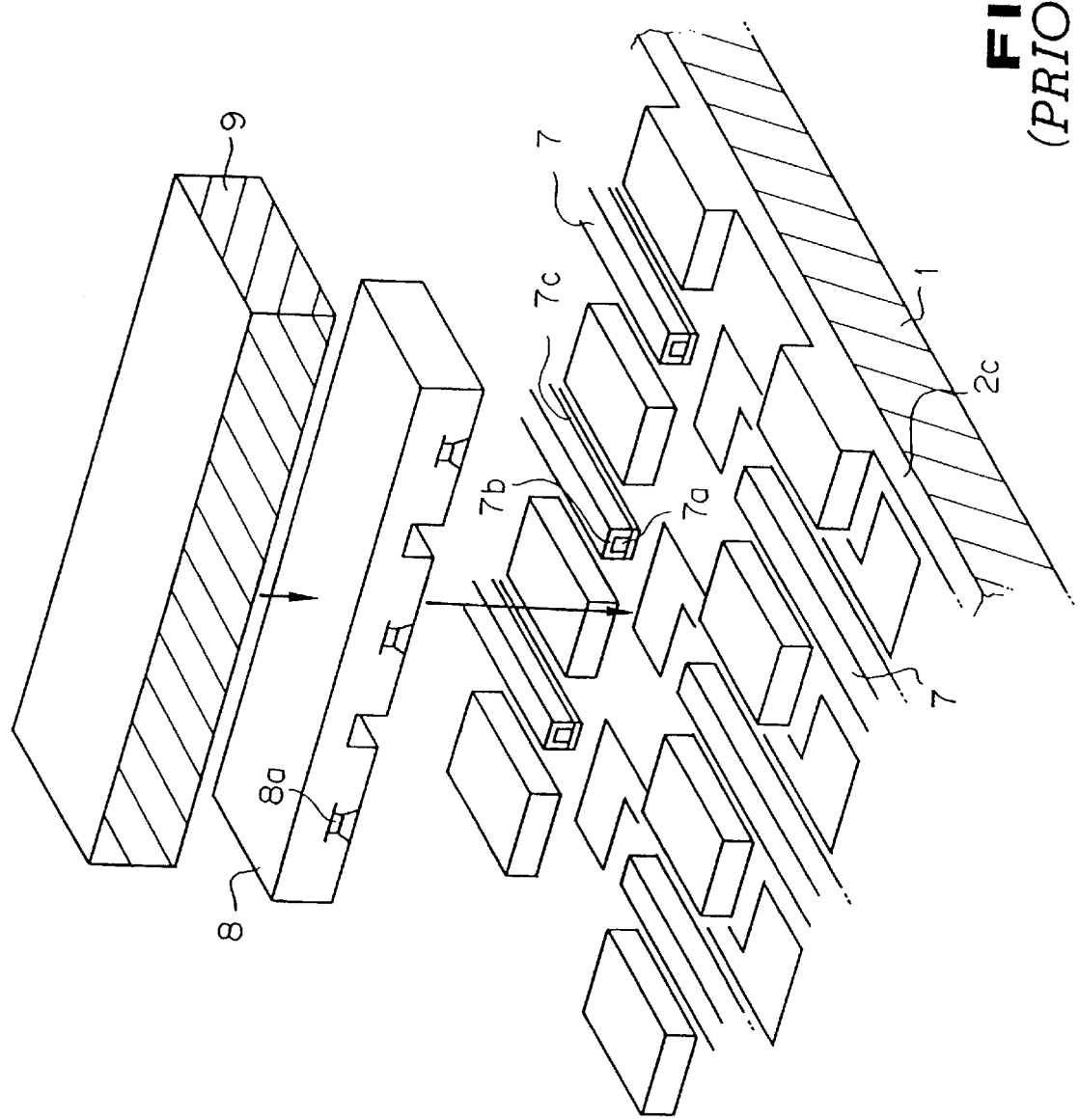
FIG. 4 is a schematic perspective view showing a platform having a ridge type optical waveguide.
Figure 5:
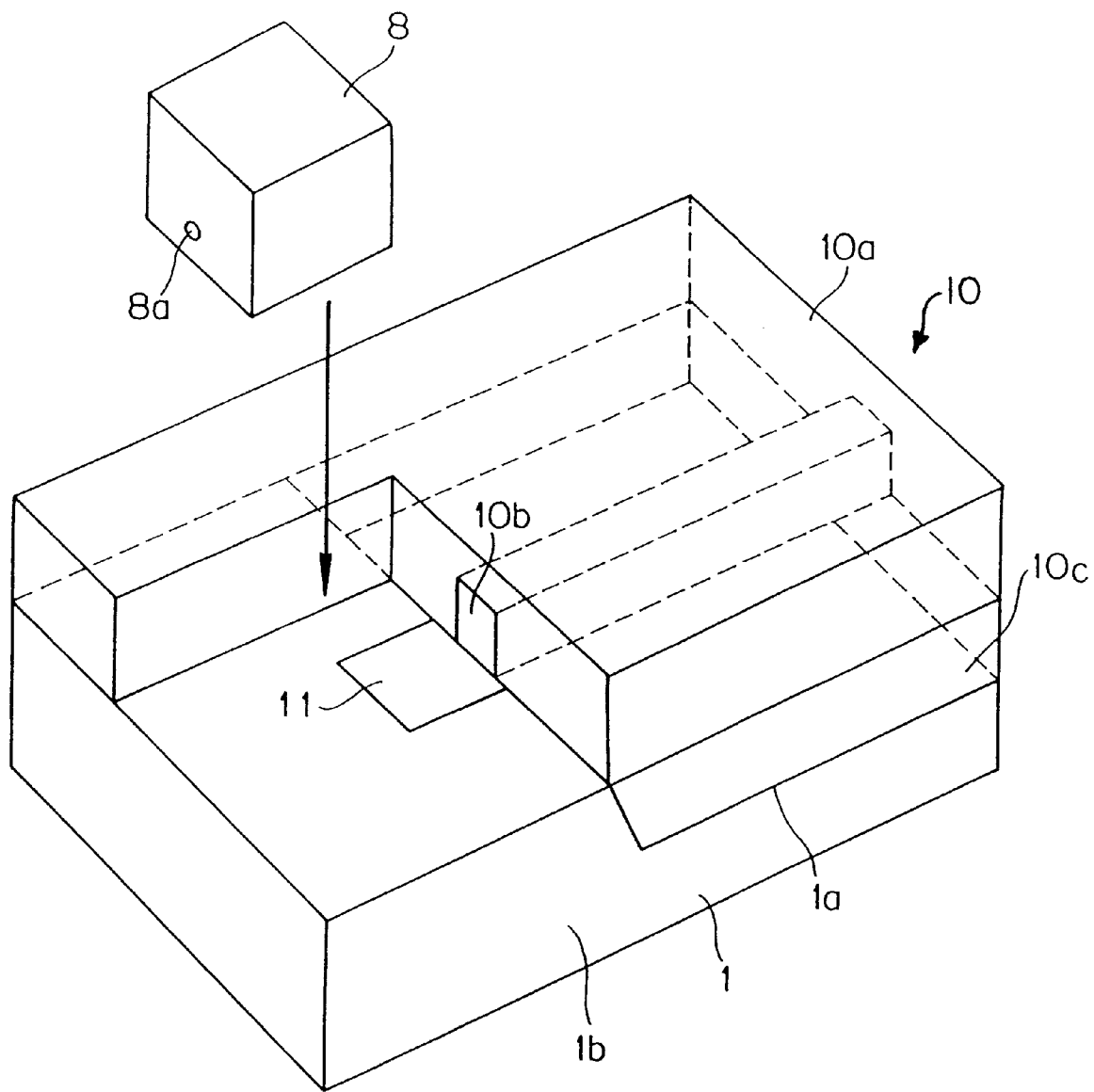
FIG. 5 is a schematic perspective view showing a platform having an embedded type optical waveguide.
Figure 6:
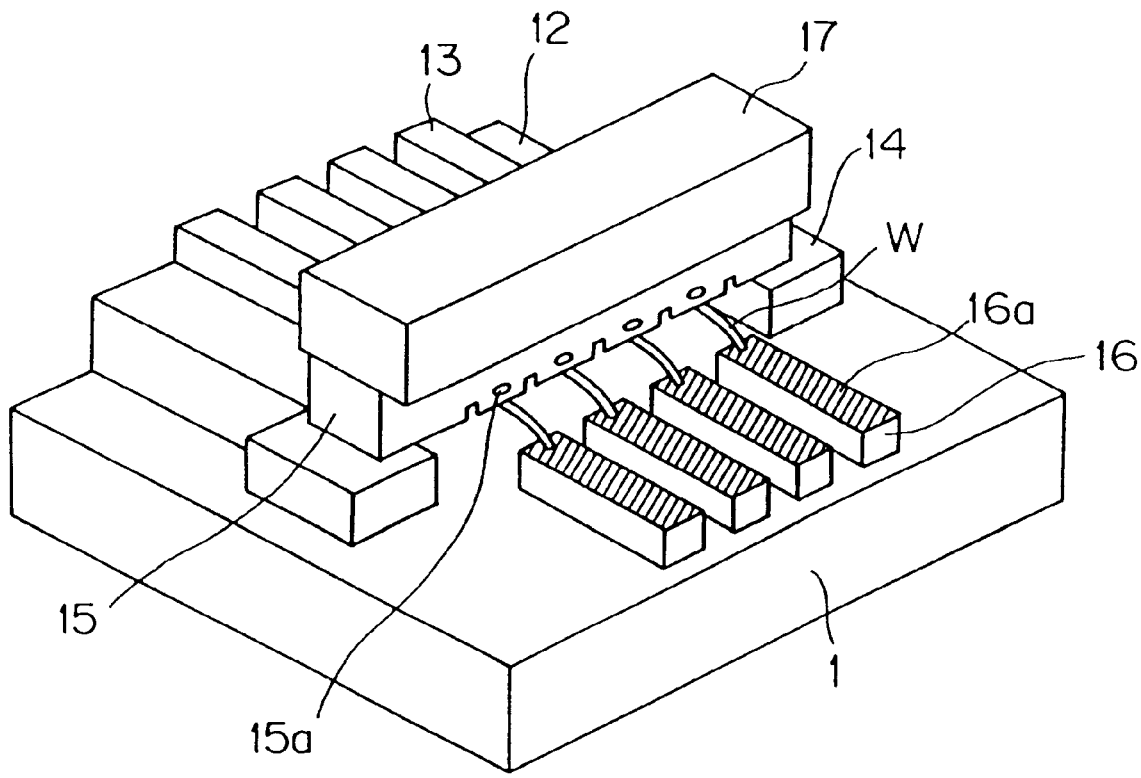
FIG. 6 is a schematic perspective view showing construction of a hybrid optical integrated circuit disclosed in Japanese Patent Application Laying-open No. 62-242362.
Figure 7:
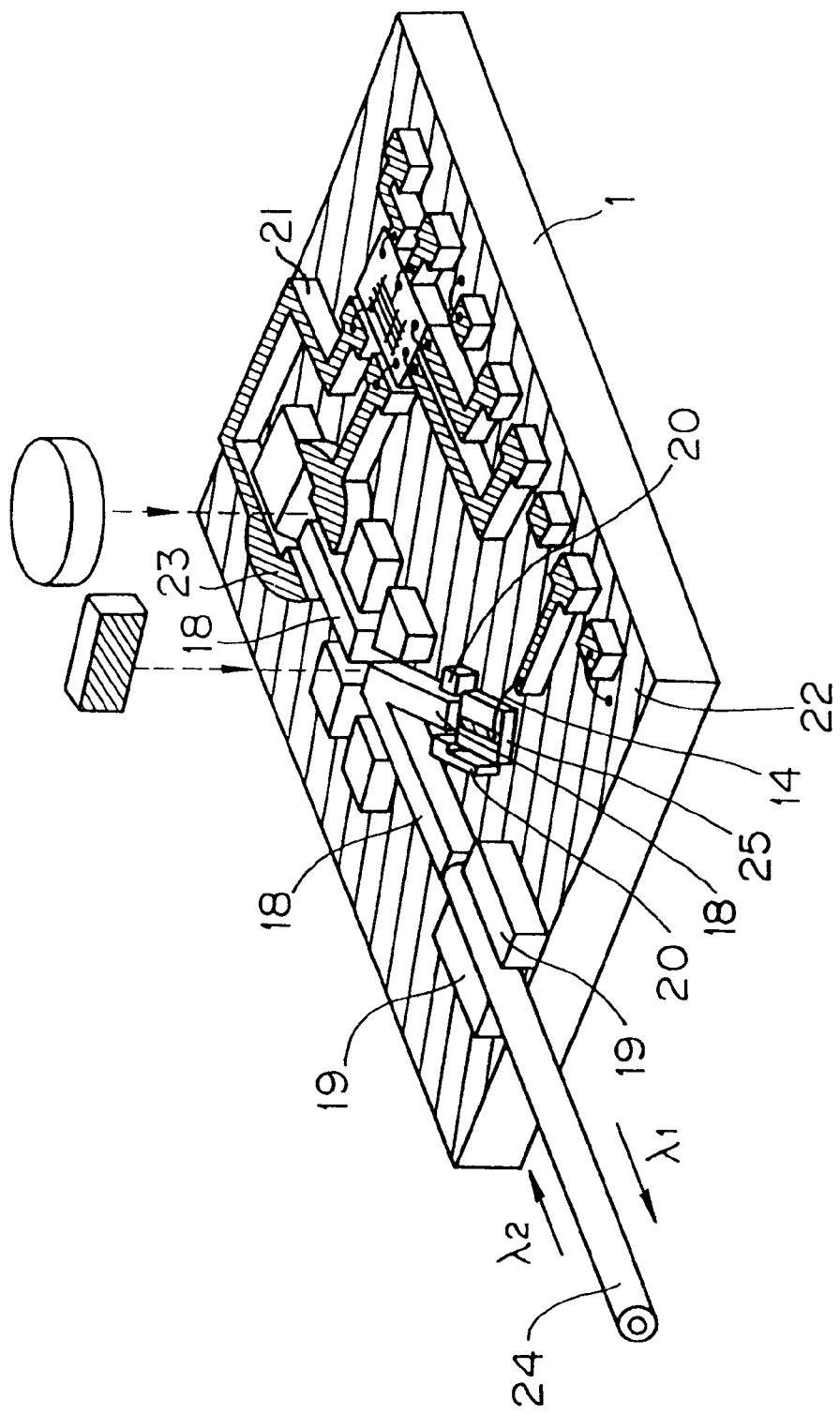
FIG. 7 is a schematic perspective view showing construction of a hybrid optical integrated circuit disclosed in Japanese Patent Application Publication 5-3748.
Figure 8:
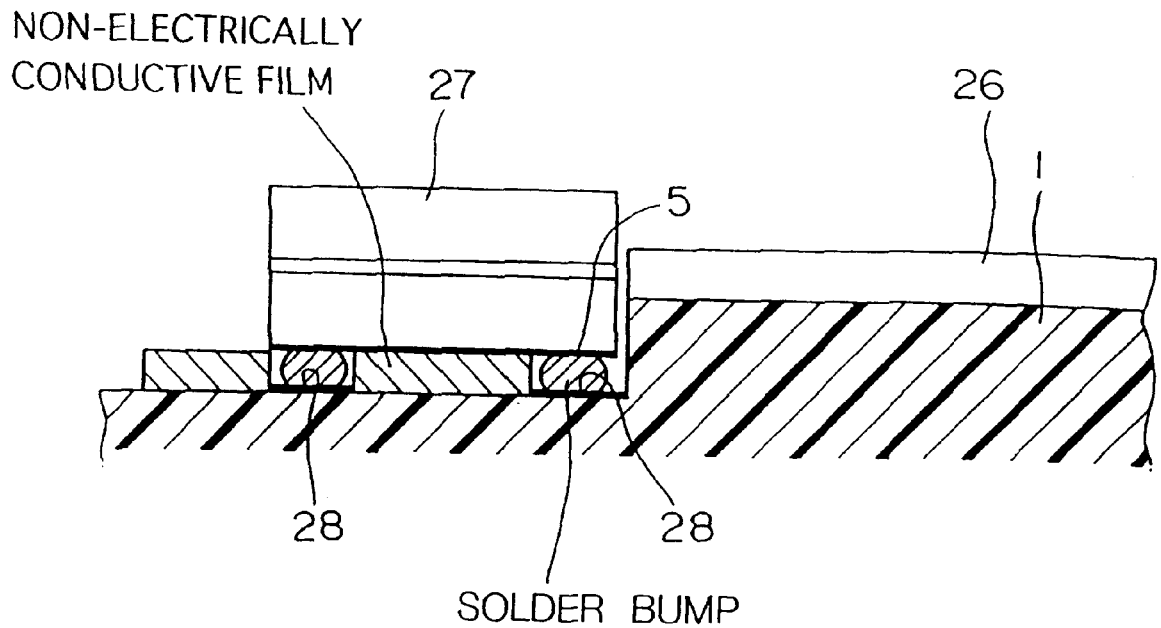
FIG. 8 is a schematic perspective view showing an example of a conventional optical semi-conductor device.

Fourthly, Embodiment 22 shows an example of "embedded structured optical waveguide" in which the optical waveguide core is embedded in the cladding layer having a sufficient thickness, but configuration of the optical waveguide is not limited to this. For example, as in FIG. 4 showing the prior art, the present embodiment can also be applied to a "ridge type optical waveguide" in which the core is exposed, or coated with a thin cladding layer.

Fifthly, other materials than the dielectric material can be used as the optical waveguide to achieve the main object of the present invention. Such materials include a silicon waveguide.

Further, Embodiment 22 uses a solder bump as the fixing material 96 to achieve electrical connection and fixing between the optical signal port of the optical functional device and the electrical wiring on the optical waveguide circuit. Instead, it is also possible to use such materials as electroconductive bonding materials or conductive rubber. In this case, as in Embodiment 22, application of a stress associated with device mounting to the optical signal port can be prevented.

Embodiment 25

Figure 57:
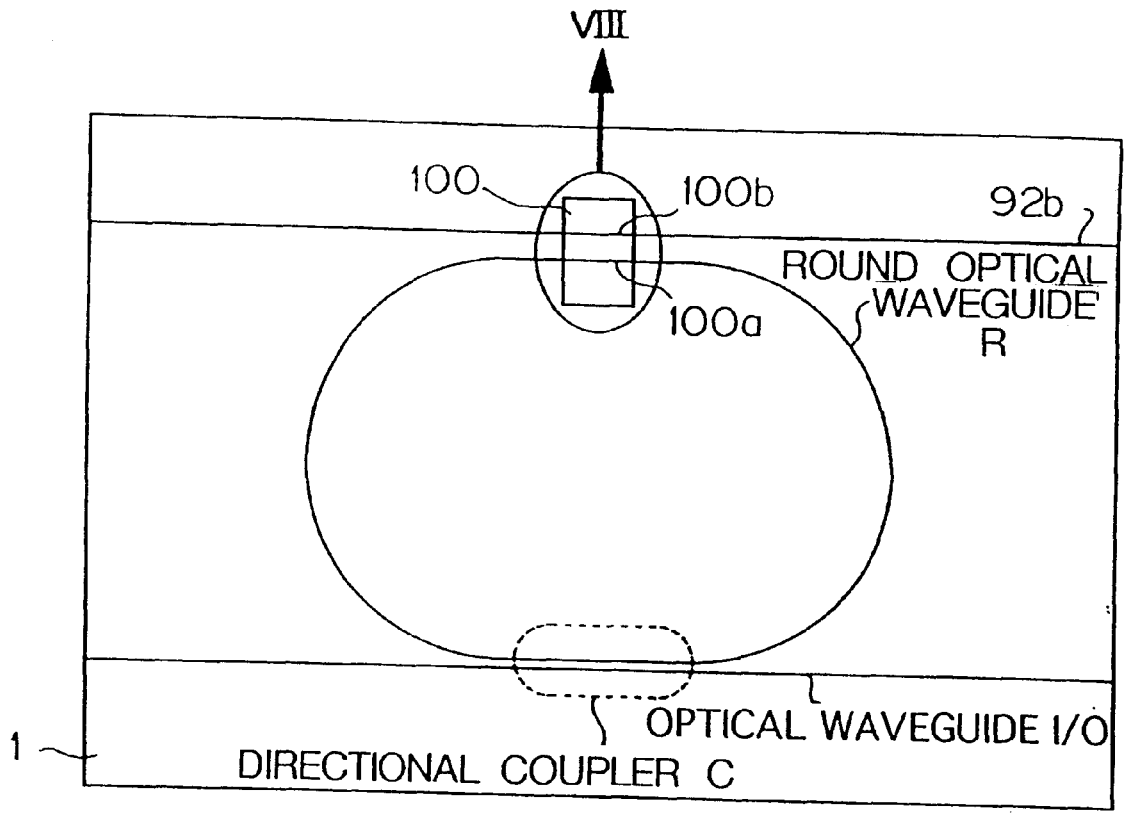
FIG. 57 is a schematic top plan view showing a twenty-fifth embodiment of an opto-electronic hybrid integrated circuit according to the present invention.
Figure 58:
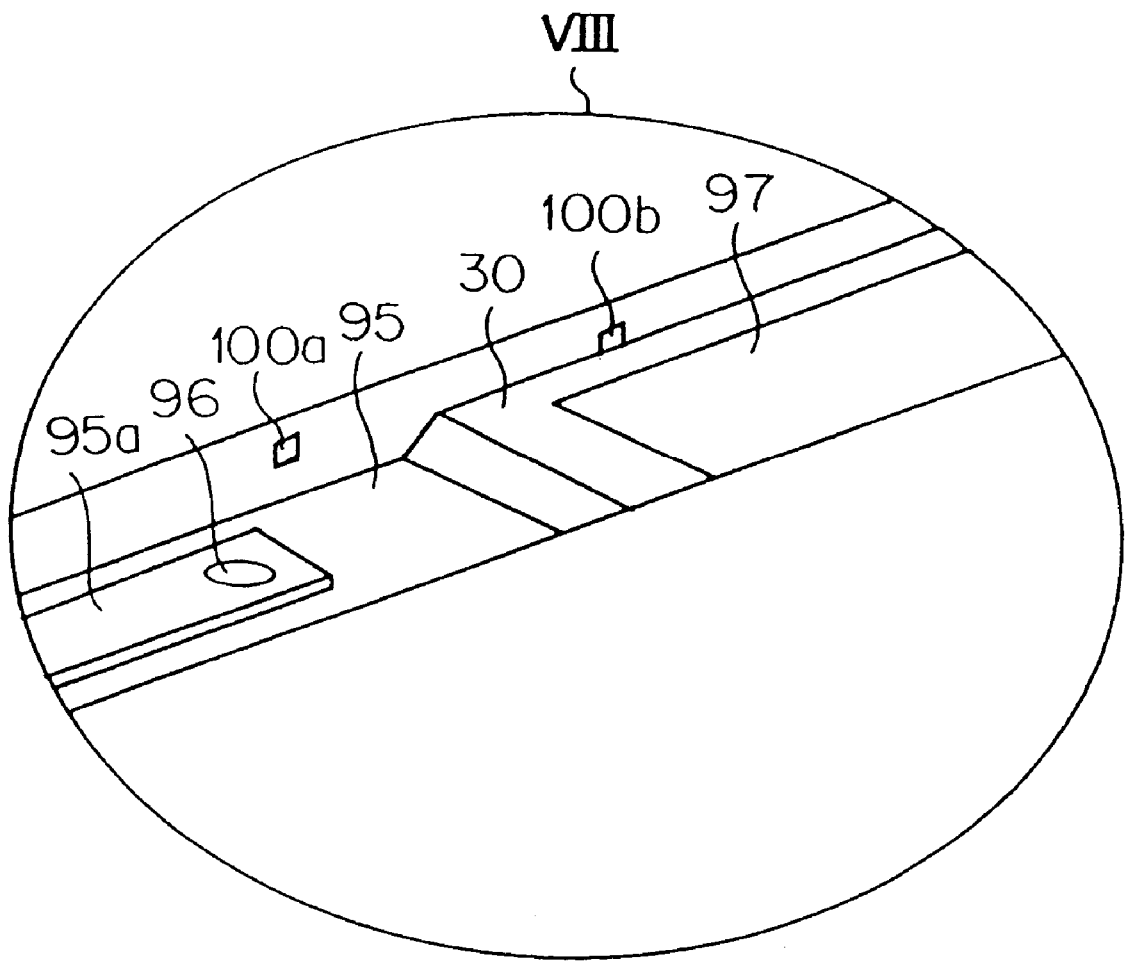
FIG. 58 is an enlarged detailed perspective view showing a part III of FIG. 57.

FIG. 57 is a schematic plan view showing a twenty-fifth embodiment of the hybrid optical integrated circuit of the present invention. FIG. 58 is a schematic enlarged perspective view showing part of FIG. 57. The signal optical waveguide 92$a$ of the optical waveguide circuit comprises an input/output waveguide part I/O, a round waveguide part R, and a directional coupler C for optical coupling between both waveguides, forming a "ring resonance circuit" as a whole. A semiconductor amplifier as the optical functional device 100 is mounted in the course of the round waveguide part R, the signal port 100a of this device and the signal optical waveguide are optically coupled. The hybrid optical integrated circuit functions as a "ring laser" as a whole.

Since the ring resonance circuit of the present embodiment has a sharp optical frequency selectivity, when the semiconductor optical amplifier 100 is attempted to be integrated in the optical waveguide by active alignment using the signal optical waveguide and the signal port, the usable optical frequency of monitor light is limited. To greatly relax limitation of the monitor light frequency, the present embodiment provides the monitor optical waveguide 92b and the monitor port 100b individually in the optical waveguide circuit and the semiconductor optical amplifier, and core adjustment is made using these devices. That is, the monitor optical waveguide 92b is disposed outside the round waveguide R of the optical waveguide circuit, and the monitor port 100b is disposed in juxtaposition with the signal port 100a of the semiconductor amplifier. Therefore, in mounting the semiconductor amplifier, since the monitor optical waveguide with no wavelength selectivity can be used, limitation to the monitor light frequency is remarkably relaxed.

In particular, referring to the optical device mounting part structure of the optical waveguide shown in FIG. 58, when the height reference surface 30 and the lower electrical wiring surface 95 are formed in two layers, as described in detail in Embodiment 22, low stress device mounting is possible using thick film solder or an electroconductive bonding material.

Embodiment 26

Figure 59:
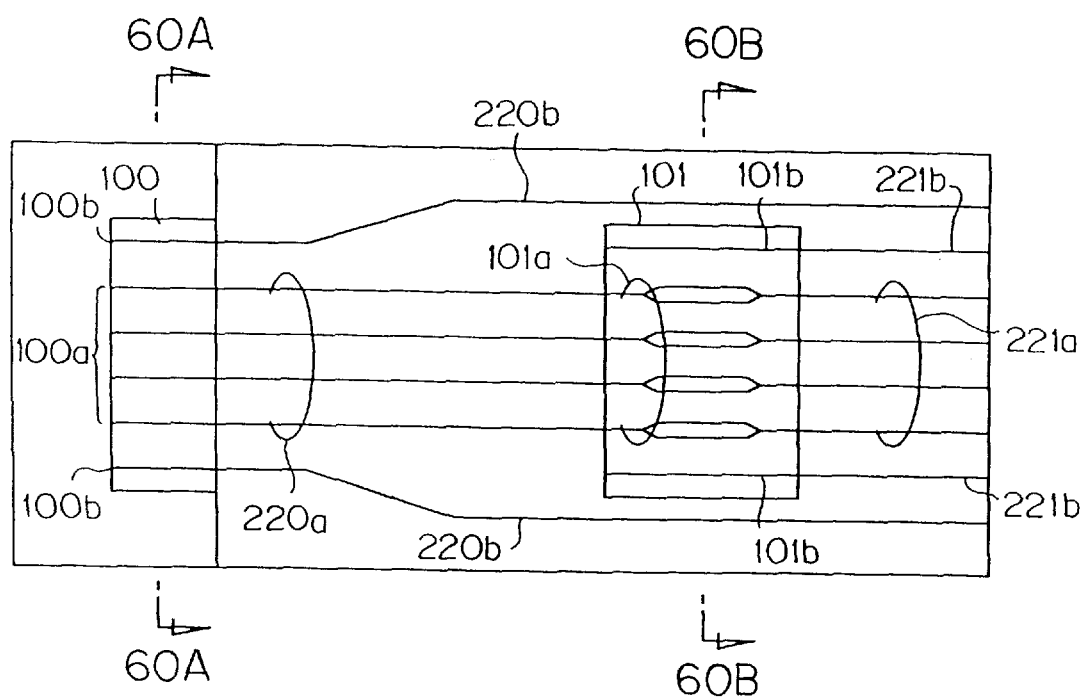
FIG. 59 is a schematic top plan view showing a twenty-sixth embodiment of an opto-electronic hybrid integrated circuit according to the present invention.

FIG. 59 is a schematic plan view showing construction of a twenty-sixth embodiment of the hybrid integrated circuit of the present invention. The present embodiment features that a plurality of optical functional devices arranged in series are mounted in the optical waveguide circuit. In FIG. 59, the reference numeral 100 is an LD array as a first optical functional device, and 101 is a semiconductor modulator array as a second optical functional device. This is a construction where a Mach-Zehnder interference circuit type strength modulation circuit is arrayed. In this optical waveguide circuit, the optical signal output from the LD array 100 is transmitted in a first signal optical waveguide array 220a, modulated by the modulator array 101, and transmitted through a second signal optical waveguide array 221a to the substrate surface.

This hybrid optical integrated circuit functions as an "LD module with an external modulator" in which the optical output from the LD is modulated by the modulator array.

In this construction, the signal optical waveguide is divided into sections to mount the second optical functional device 101, and active alignment is difficult using the waveguide. Further, when the signal port of the modulator array 101 does not pass light when unenergized, core adjustment is difficult using the signal optical waveguide 221a.

Then, in the present embodiment, a monitor optical waveguide 220b connecting the first optical functional device 100 and an end of the optical waveguide circuit substrate, and a monitor optical waveguide 221b connecting the second optical functional device 101 and the substrate end are provided on the optical waveguide circuit.

On the other hand, a monitor port 100b is provided on the LD 100, and the port 100b functions as a semiconductor laser at the signal port 100a. A port that functions as a semiconductor laser can also function as a light receiving device. A monitor port 101b is provided in the modulator array 101, and the port 101b functions as a light receiving device.

In the present embodiment, the optical device mounting part has the same structure as in Embodiment 22.

Figure 60A:
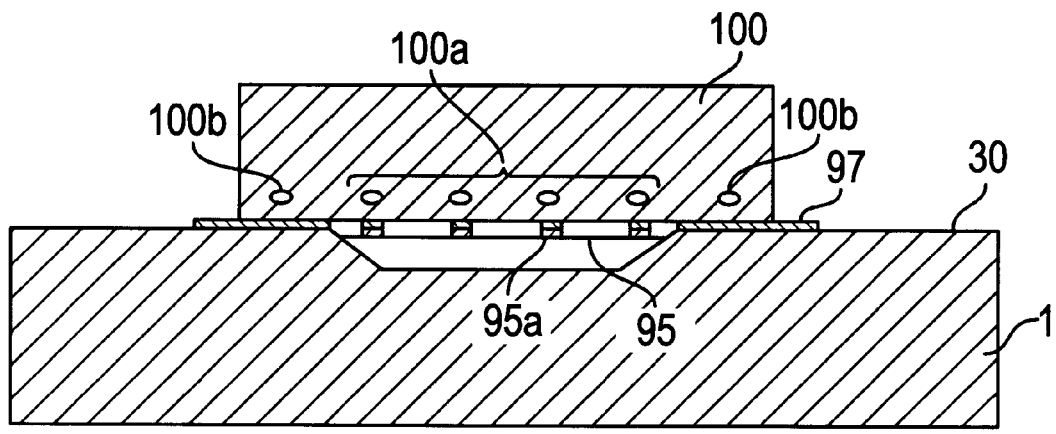
FIG. 60A is a cross-sectional view taken on line 60A—60A of FIG. 59, the view showing a laser diode which is mounted on the platform.
Figure 60B:
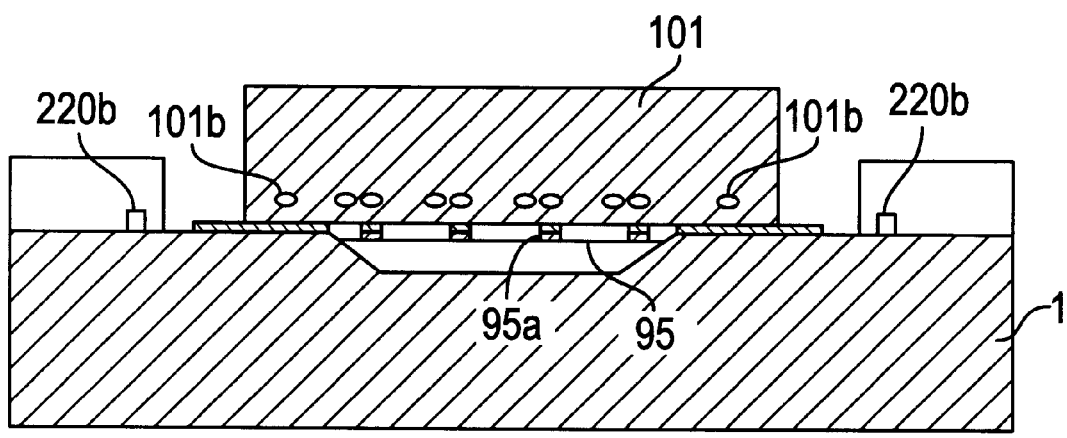
FIG. 60B is a cross-sectional view taken on line 60B—60B of FIG. 59, the view showing a modulation array which is mounted on the platform.

FIG. 60A and 60B are cross-sectional views of the circuit shown in FIG. 59, FIG. 60A is a cross-sectional view taken along line 60A—60A showing an LD mounting configuration, and FIG. 60B is a cross-sectional view taken along line 60B—60B showing a modulation array mounting configuration.

With this construction, it is possible that monitor light is input to the monitor optical waveguide 220b, and the light receiving current: is monitored to achieve active alignment of the LD 100. Quite similarly, alignment of the modulator array 101 is achieved using the monitor optical waveguide 221b.

Further, since the arrangement of the monitor optical waveguide in the present embodiment is on the assumption that the monitor port of the optical functional device has a light receiving function, the application is limited to semiconductor devices.

Embodiment 27

Figure 61:
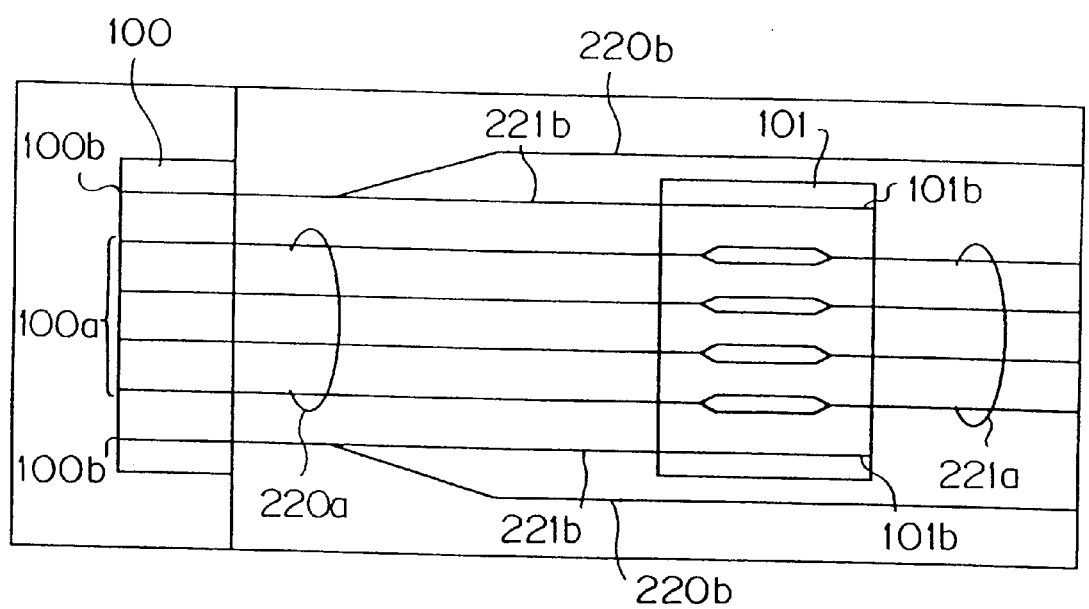
FIG. 61 is a schematic top plan view showing a twenty-seventh embodiment of an opto-electronic hybrid integrated circuit according to the present invention.

FIG. 61 is a schematic plan view showing construction of a twenty-seventh embodiment of the hybrid optical integrated circuit of the present invention. The present embodiment features that, unlike Embodiment 26 shown in FIG. 59, the second optical functional device, that is, the monitor optical waveguide 221b to the modulator array 101 is connected with the first optical functional device, that is, between the LD 100 and the modulator array 101. Since other components are the same as in Embodiment 26, similar components are indicated by similar reference numerals, and detailed description thereof is omitted. That is, the monitor optical waveguide 221b to the modulator 101 is combined with the monitor optical waveguide 220b immediately before the LD 100, and connected to the monitor port 100b of the LD 100.

With this construction, optical device mounting is possible using the following procedure. First, active alignment is made using the monitor optical waveguide 220b. In this case, the LD may be caused to emit light, or the light receiving function may be used. After the completion of device mounting, alignment of the modulator array 101 is made using the monitor optical waveguide 221b. In this case, with the LD monitor port 100b caused to emit light, the monitor port 101 is functioned as a light receiving device, and the light receiving current is monitored.

The features of this method are that, in alignment of the first optical functional device the optical fiber is connected to the monitor optical waveguide, and the monitor light must be input or output. However, since the monitor optical waveguide for connecting the optical functional devices to each other is provided, fiber connection is needless in alignment of the second optical functional device, thereby simplifying the alignment work.

Embodiment 28

Figure 62:
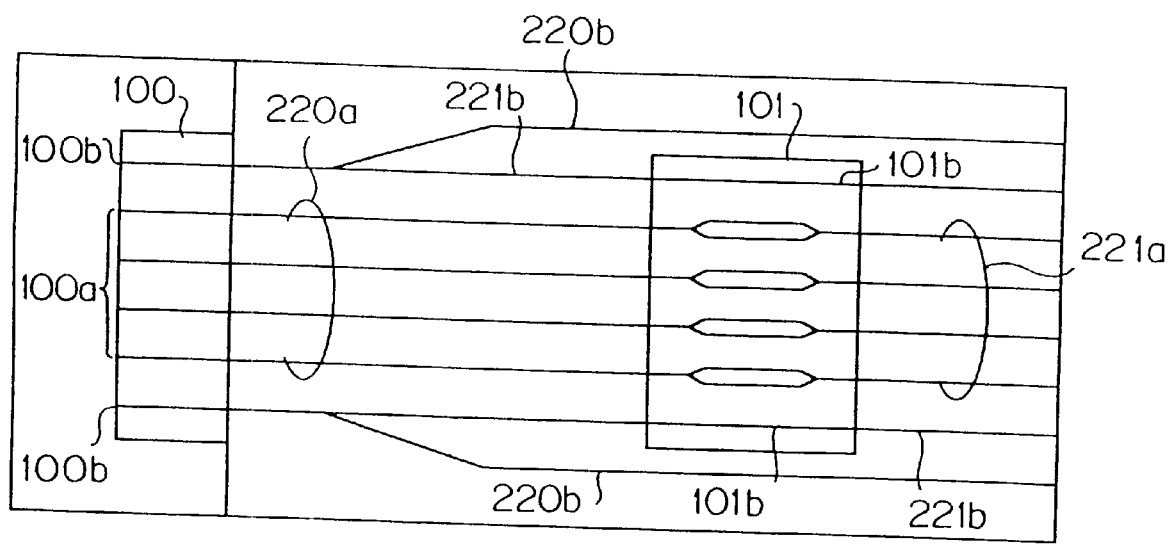
FIG. 62 is a schematic top plan view showing a twenty-eighth embodiment of an opto-electronic hybrid integrated circuit according to the present invention.
Figure 63A:
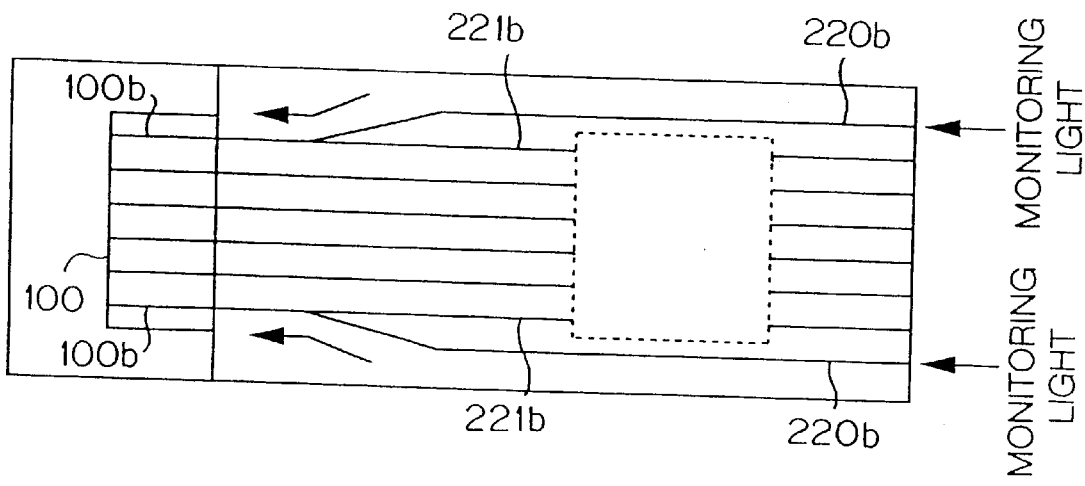
Figure 63B:
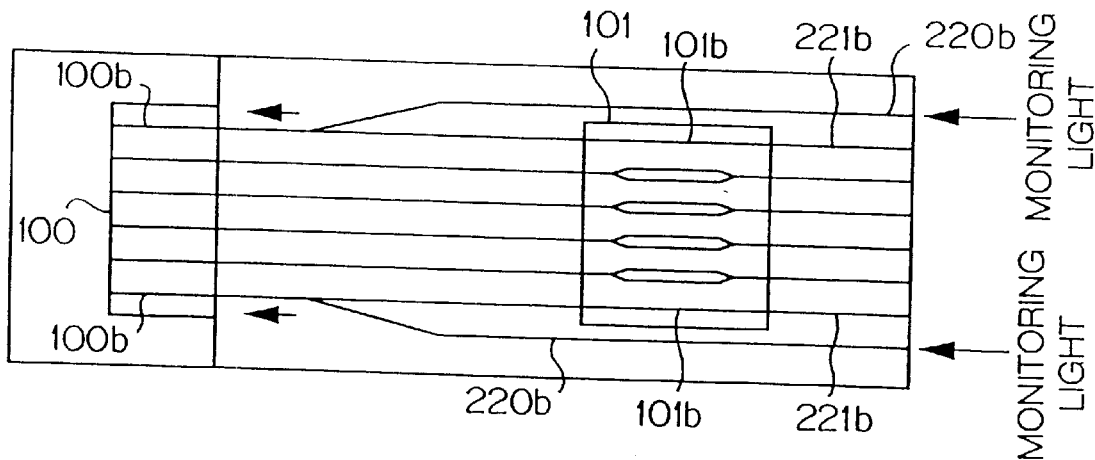

FIG. 62 is a schematic plan view of a twenty-eighth embodiment of the hybrid optical integrated circuit of the present invention. FIGS. 63A and 63B are plan views for explaining the alignment method of the optical functional device to be mounted on the circuit shown in FIG. 62, in which FIG. 63A shows core adjustment and mounting of the LD array, and FIG. 63B shows core adjustment and mounting of the modulator array.

The present embodiment features that, unlike Embodiment 27, as the monitor optical waveguide to modulator 101, in addition to the waveguide connecting to the LD, a waveguide connecting to the end of the optical waveguide circuit substrate is also provided.

With this construction, means for monitoring alignment to the modulator 101 is increased and, as a result, alignment is also possible to the optical functional device comprising a material other than semiconductor devices. The alignment procedure with the construction is described below.

Alignment of the optical integrated circuit of this construction will be described with reference to FIGS. 63A and 63B. First, monitor light is transmitted to the monitor optical waveguide 220b, while monitoring optical coupling with the monitor port 100b of the LD array 100, alignment of the signal optical waveguide 220a and the optical signal port 100a is made, and the LD array 100 is fixed. Then, core adjustment and fixing of the modulator array may be made using the monitor optical waveguide 221b and the monitor port 101b. As a monitoring method in this case, the monitor port 101b is used as a passive waveguide, monitor light incident to the monitor optical waveguide 221b is transmitted to the monitor port 101b and, finally, incident to the monitor port 100b of the LD 100. At this time, the monitor port 100b of the LD 100 may be functioned as a light receiving device to find a position where the light receiving current is a maximum. Further, the light transmission direction is reversed, the monitor port 100b of the LD 100 is caused to emit light, and the output light from the monitor waveguide 221b at this time may be monitored.

Since the monitor port of the modulator array is used as a passive waveguide, this method can be applied of course when the optical functional device 101 is formed of a semiconductor material as in the present embodiment, and even when an optical device other than a semiconductor, for example, electrooptical crystals such as $LiNbO_3$ or magnetooptical crystals are used.

As described above, in the present embodiment, in hybrid integration of a plurality of optical functional devices, since monitor optical waveguides are provided corresponding to the individual devices, and it is possible to mount a plurality of devices in series in the optical waveguide circuit.

Embodiment 29

Figure 64:
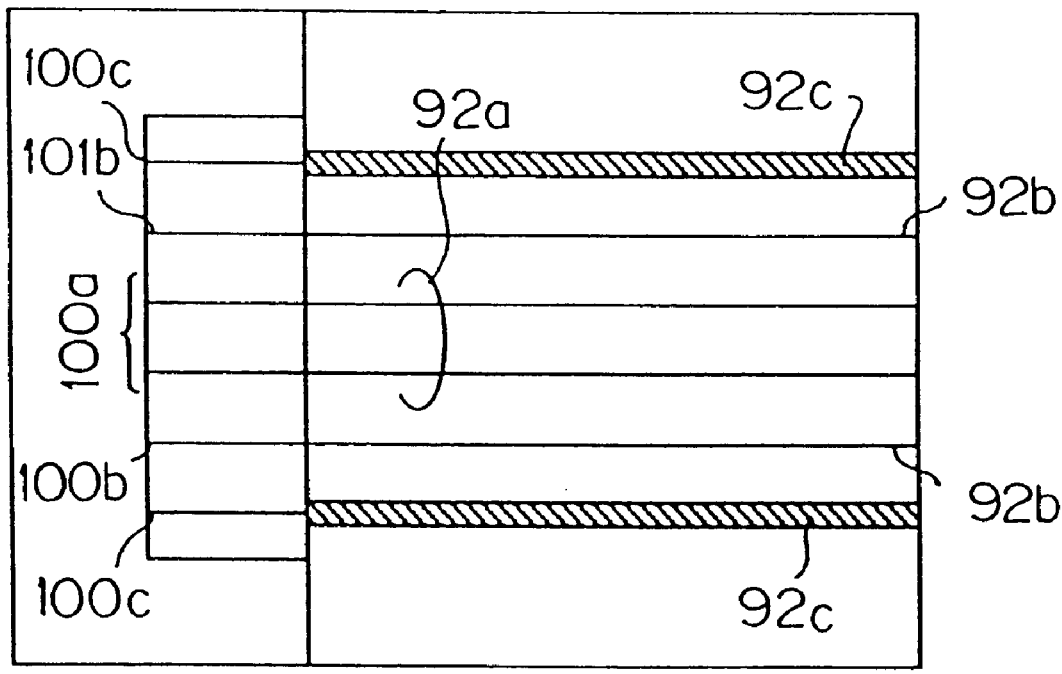
FIG. 64 is a schematic top plan view showing a twenty-ninth embodiment of an opto-electronic hybrid integrated circuit according to the present invention.

FIG. 64 is a schematic plan view showing a twenty-ninth embodiment of the hybrid optical integrated circuit of the present invention. The present embodiment features that as the monitor optical waveguide of the optical waveguide circuit or the monitor port of the optical functional device, a plurality of monitor waveguides 92b and 92c or monitor ports 100b and 100c are provided.

As shown in FIG. 64, the monitor ports 100b and 100c of the optical functional device are formed with the same width, the width of the monitor optical waveguide 92b of the optical waveguide circuit is set equal to the signal optical waveguide 92a, and the monitor optical waveguide 92c is wider in waveguide width than 92b.

With this construction, after rough core adjustment using the monitor optical waveguide 92c and the monitor port 100c, fine adjustment is possible using the monitor optical waveguide 92b and the monitor port 100b. By such two-step core adjustment, it is possible to reduce the time required for active alignment.

Embodiment 30

Figure 65:
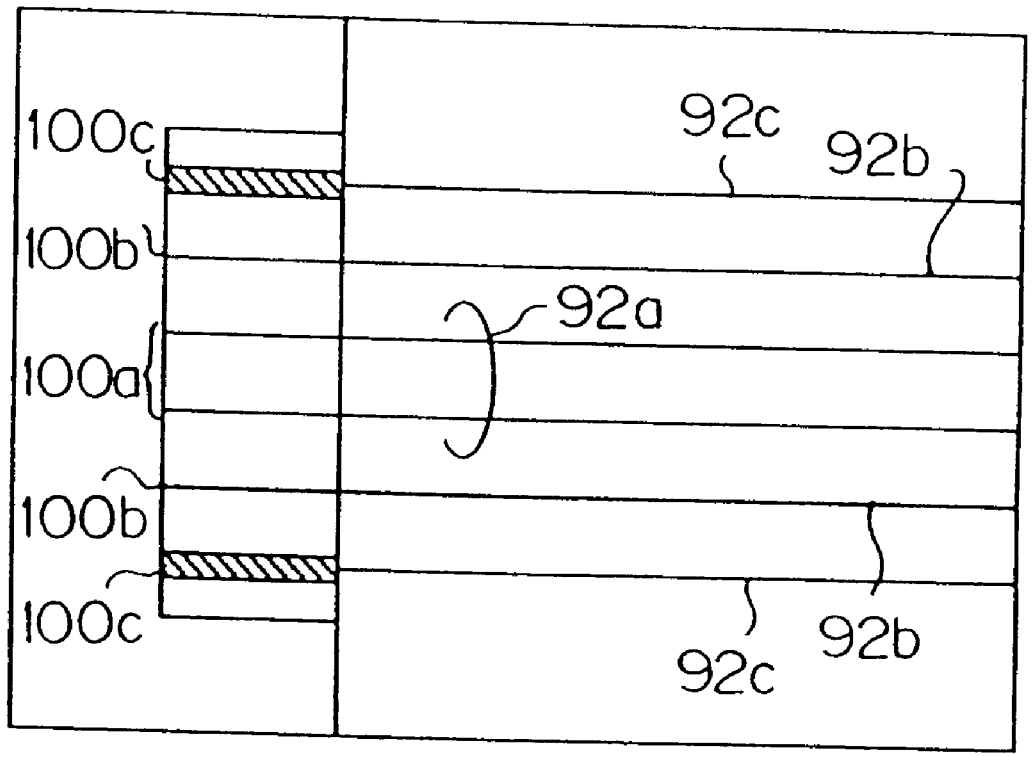
FIG. 65 is a schematic top plan view showing a thirtieth embodiment of an opto-electronic hybrid integrated circuit according to the present invention.

FIG. 65 is a schematic plan view showing a thirtieth embodiment of the hybrid optical integrated circuit of the present invention. The present embodiment features that, contrary to previous Embodiment 29, the monitor port of the optical functional device is set equal in width to the signal port to set the monitor port 100c wider than the signal port.

With this construction, it is also possible to reduce the time required for active alignment by two-step core adjustment of rough adjustment—fine adjustment.

As described above, in the hybrid optical integrated circuit of the present embodiment, the monitor optical waveguide is provided in the optical waveguide circuit along with the signal optical waveguide, the optical functional device is provided with the signal port and the monitor port corresponding to the waveguide arrangement of the optical waveguide circuit, the monitor optical waveguide of the optical waveguide circuit and the monitor port of the optical functional device are optically coupled and, at the same time, the signal optical waveguide and the signal port are optically coupled, and the optical functional device can be disposed on the optical device mounting part on the optical waveguide circuit. Therefore, the signal optical waveguide part has wavelength selectivity/optical frequency selectivity and the like, or the signal port of the optical functional device has various functions, even when active alignment using the signal optical waveguide and the signal port is difficult, active alignment is possible using the monitor optical waveguide and the monitor port.

Further, since the optical device mounting part is provided with the height reference surface formed with a thin film electrode on the surface and the electrical wiring surface which has a lower height. The height reference surface is disposed at a position corresponding to the monitor optical waveguide, and the electrical wiring surface is disposed at a position corresponding to the signal optical waveguide, in mounting the optical functional device on the substrate, it is possible to make active alignment of the optical functional device with the optical waveguide, and device mounting using thick film solder such as solder bump. Therefore, since high positioning precision of the optical waveguide with the optical functional device is achieved, and the upper surface of the signal port of the optical functional device does not contact directly with the substrate, application of a stress associated with device mounting to the signal port is prevented.

Further, when a substrate with a protrusion and a recess is used as the substrate, and a dielectric optical waveguide is used as the optical waveguide circuit, height setting precision of the height reference surface of the optical device mounting part is remarkably improved, and the high-frequency characteristics are remarkably improved.

When a silicon substrate having an excellent thermal conductivity is used as the substrate above, heat dissipation for the optical functional device is remarkably improved, in addition to the advantage above.

Further, when the monitor optical waveguide on the optical waveguide circuit is arranged at a position between the optical functional devices, if desired, in addition to a position between the optical functional device and the optical waveguide circuit, it is possible to mount a plurality of optical functional devices in the optical waveguide, the devices being in line. It is also possible to form a hybrid integrated circuit including optical functional devices which are many kinds of materials including semi-conductive materials, of course.

Embodiment 31

Figure 66:
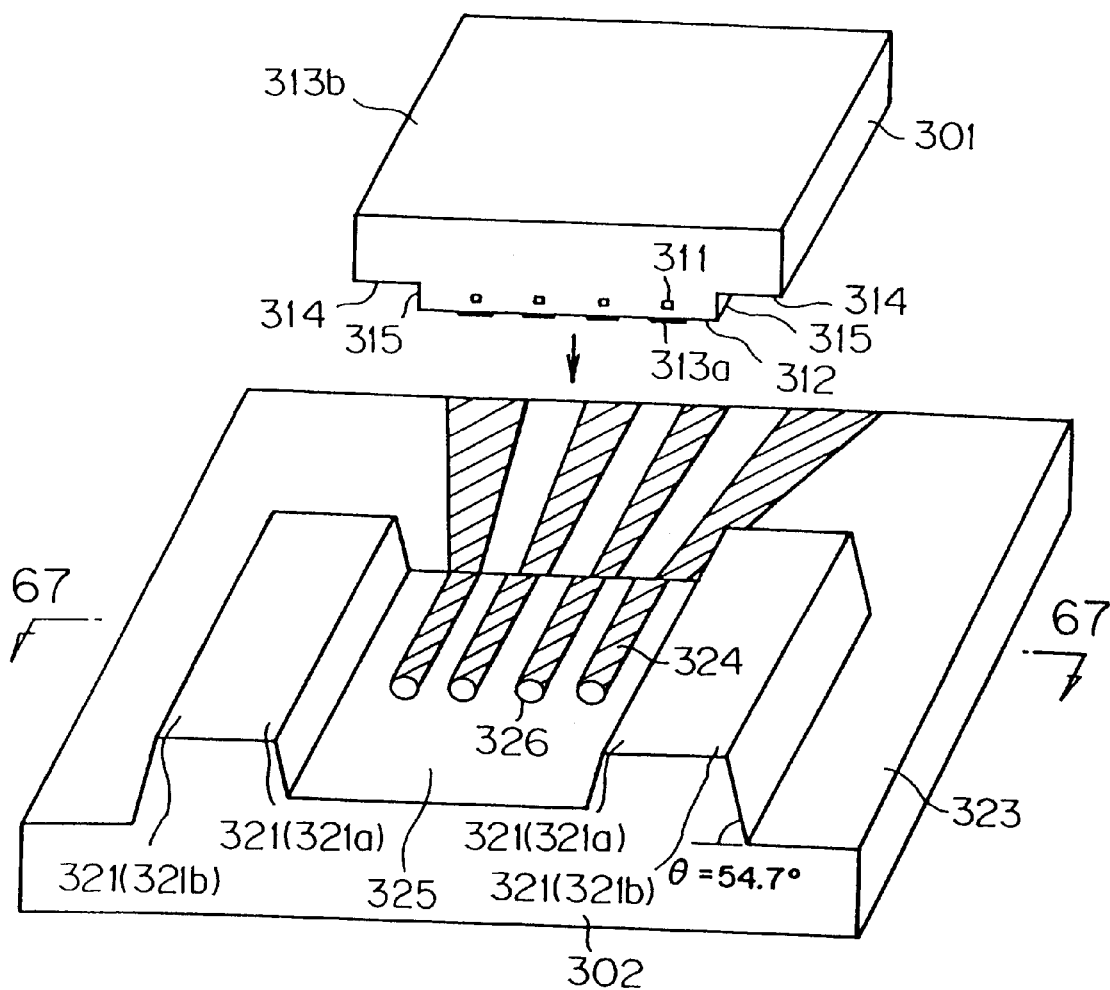
FIG. 66 is a schematic perspective view showing an optical device and a carrier in a thirty-first embodiment of the invention and a first embodiment of an optical sub-module which is possible to mount on a platform of an opto-electronic hybrid integrated circuit according to the present invention.
Figure 67:
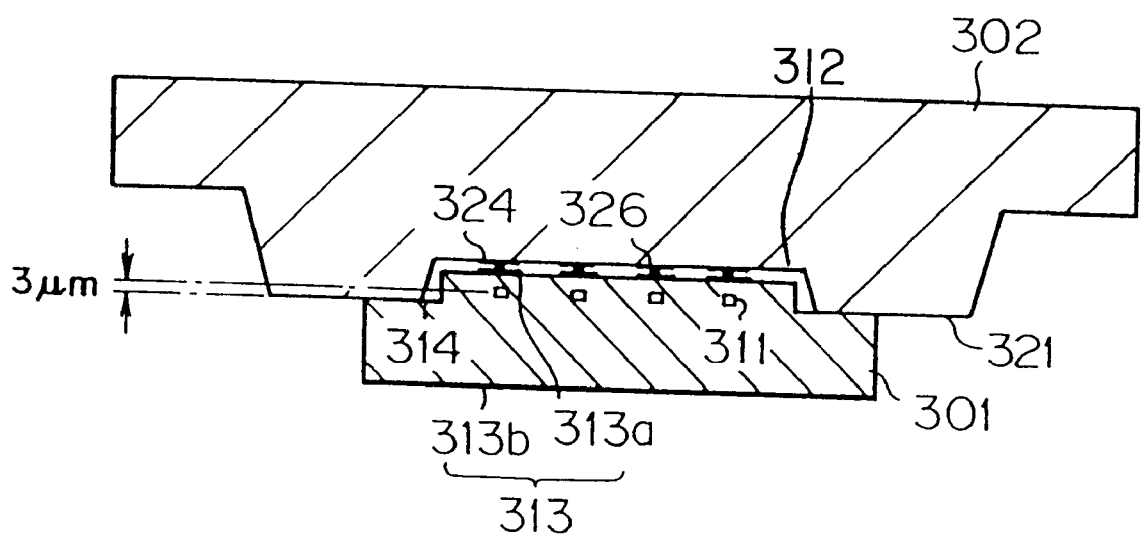
FIG. 67 is a cross-sectional view taken on line 67—67 of FIG. 66.

FIGS. 66 and 67 show the construction of a first embodiment of an optical sub-module which can be mounted on the hybrid optical integrated circuit of the present invention, in which FIG. 66 is a schematic perspective view showing the construction of an optical device 301 and a carrier 302 which are components of the optical sub-module of the present embodiment, and FIG. 67 is a cross sectional view taken along line 67—67 in FIG. 66.

The optical device 301 is an arrayed semiconductor optical amplifier, 311 is its active layer, the active layer 311 has four arrays formed at 400 μm intervals, and the arrays of the active layer 311 are separated from an optical device surface 312 by 6 μm. An active layer side electrode 313a is formed on each array of the active layer 311, and a ground side electrode 313b is formed on the backside opposite the optical device surface 312. 314 is an optical device height reference surface, which is provided at a position 3 μm towards the backside from the active layer 311, that is, 9 μm lower than the optical device surface 312. 315 is a lateral direction reference surface of the optical device, which is formed perpendicular to the optical device surface 312 and the optical device height reference surface 314. The position of the reference surface 315 is 400 μm away from both ends of the outside active layer 311 of the four arrays of the active layer 311. In the present embodiment, the optical device lateral direction reference surfaces 315 are provided on the right and left sides, but their function can be sufficiently achieved by only one side.

The carrier is formed by providing three steps on the surface of the silicon substrate as shown in FIG. 66. A carrier protrusion 321 is an "optical device holding surface 321a" for holding the optical device height reference surface 314 of the optical device 301, which also functions as a "carrier height reference surface 321b" which is a reference surface when mounting on the packaged substrate. That is, in the general case, "the optical device holding surface" and "the carrier height reference surface" are separately formed as surfaces of different heights, however, they are the same surface in the present embodiment. A region or recess 325 surrounded by the carrier protrusions 321 is formed by providing a 15 μm step from the carrier protrusion 321. A carrier electric wiring 324 comprising 2 μm thick gold is formed on the surface of the region 325. A solder pattern 326 is provided at the tip. The region 325 serves the function of an electrode lead of the active layer side electrode 313a of the optical device 301. A peripheral region 323 is formed by providing a 40 μm step from the carrier protrusion 321, and the carrier electrical wiring 324 is continuously formed also on its surface. This region 323 serves to provide an electrical connection with the optical packaged substrate side electrical wiring.

The carrier 302 having multiple steps of the present embodiment was formed by repeating anisotropic etching of the silicon substrate. That is, the protrusion 321 of the silicon substrate was first formed, and then the step of the region 325 was formed. When the steps are formed by anisotropic etching, the side surfaces between the steps are not vertical, but an angle of about 55° can be formed between steps of the region 325 and the region 323 without cutting the electrical wiring 324.

FIG. 67 is a schematic cross-sectional view taken along line 67—67 in FIG. 66 showing an optical sub-module when the optical device 301 (which in this example will be assumed to be a semiconductor amplifier) is mounted on the carrier 302. The optical device height reference surface 314 of the semiconductor amplifier 301 is contacted with the carrier holding surface 321 of the carrier 302. In this condition, the optical device active layer side electrode 313a and the carrier electrical wiring 324 provided on the carrier region 325 are connected by heating the carrier 302 to reflow solder 326. Since the steps between the individual carrier regions and the step between the optical device height reference surface and the active layer are set as above, the active layer is positioned 3 μm above the carrier height reference surface (carrier holding surface) 321b.

With the optical device formed as an optical sub-module, it is easy to previously check the characteristics of the optical device. That is, since the optical device active layer side electrode 313a is already connected to the carrier electrical wiring 324, checking can be carried out without directly contacting the optical device surface.

Embodiment 32

Figure 68:
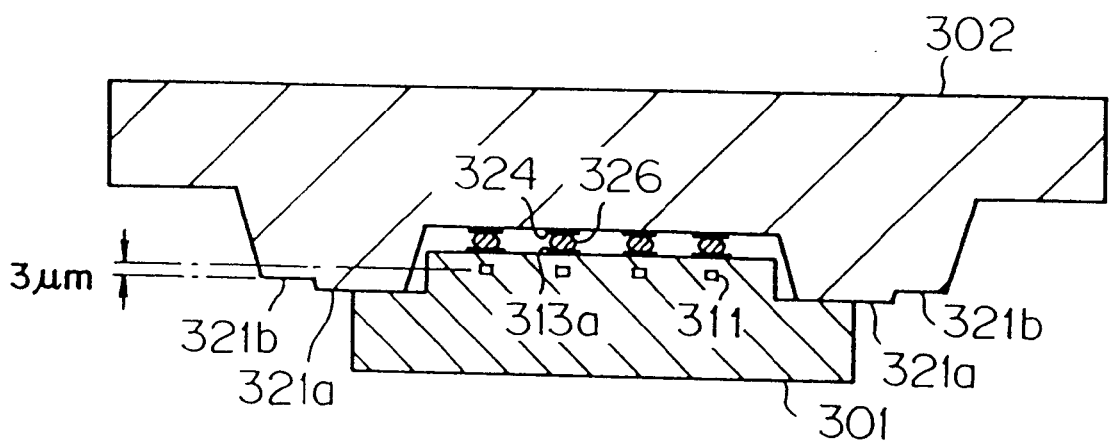
FIG. 68 is a schematic perspective view showing a thirty-second embodiment of the invention and a second embodiment of an optical sub-module which is possible to mount on a platform of an opto-electronic hybrid integrated circuit according to the present invention.

FIG. 68 is a schematic cross-sectional view showing a second embodiment of an optical sub-module which can be mounted on the hybrid optical integrated circuit of the present invention.

In the optical sub-module of the present invention, the distance between the active layer of the optical device and the carrier reference surface can always be unified to a value even when using optical devices of different sizes. In previous Embodiment 31, the step was 3 μm between the optical device height reference surface 314 and the active layer 311, but suppose a case when mounting an optical device where the step is 5 μm. In this case, as shown in FIG. 68, a 2 μm step can be provided between the optical device holding surface 321a of the carrier 302 and the carrier height reference surface 321b.

Embodiment 33

Figure 69:
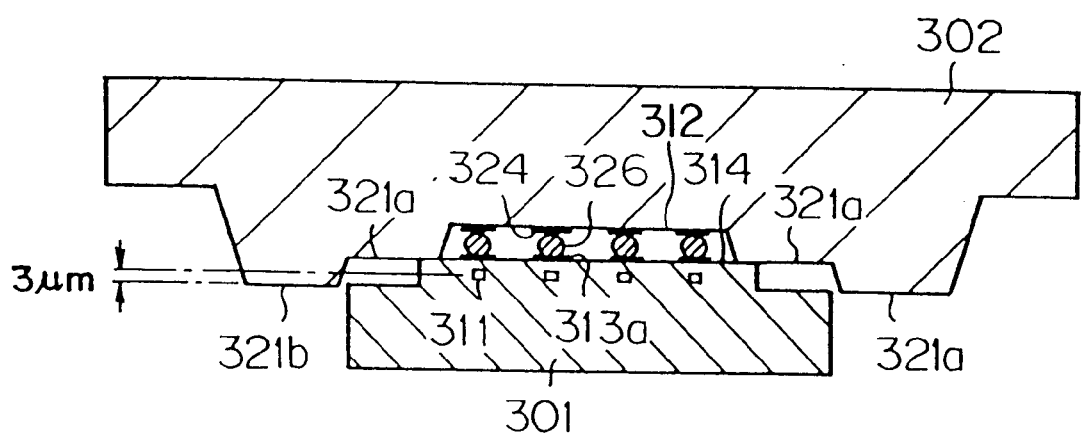
FIG. 69 is a schematic perspective view showing a thirty-third embodiment of the invention and a third embodiment of an optical sub-module which is possible to mount on a platform of an opto-electronic hybrid integrated circuit according to the present invention.

FIG. 69 is a schematic cross-sectional view showing a third embodiment of an optical sub-module which can be mounted on the hybrid optical integrated circuit of the present invention. Even when the optical device surface 312 at a 6 μm height from the active layer 311 is used as the optical device height reference surface 314, as shown in FIG. 69, the optical device height reference surface 314 of the carrier 302 can be set 9 μm higher than the carrier height reference surface 321a.

By setting the size as in Embodiment 31 or 32, the step between the carrier height reference surface 321b and the active layer 311 can be set to 3 μm as in Embodiment 31 shown in FIG. 67.

Embodiment 34

Figure 70:
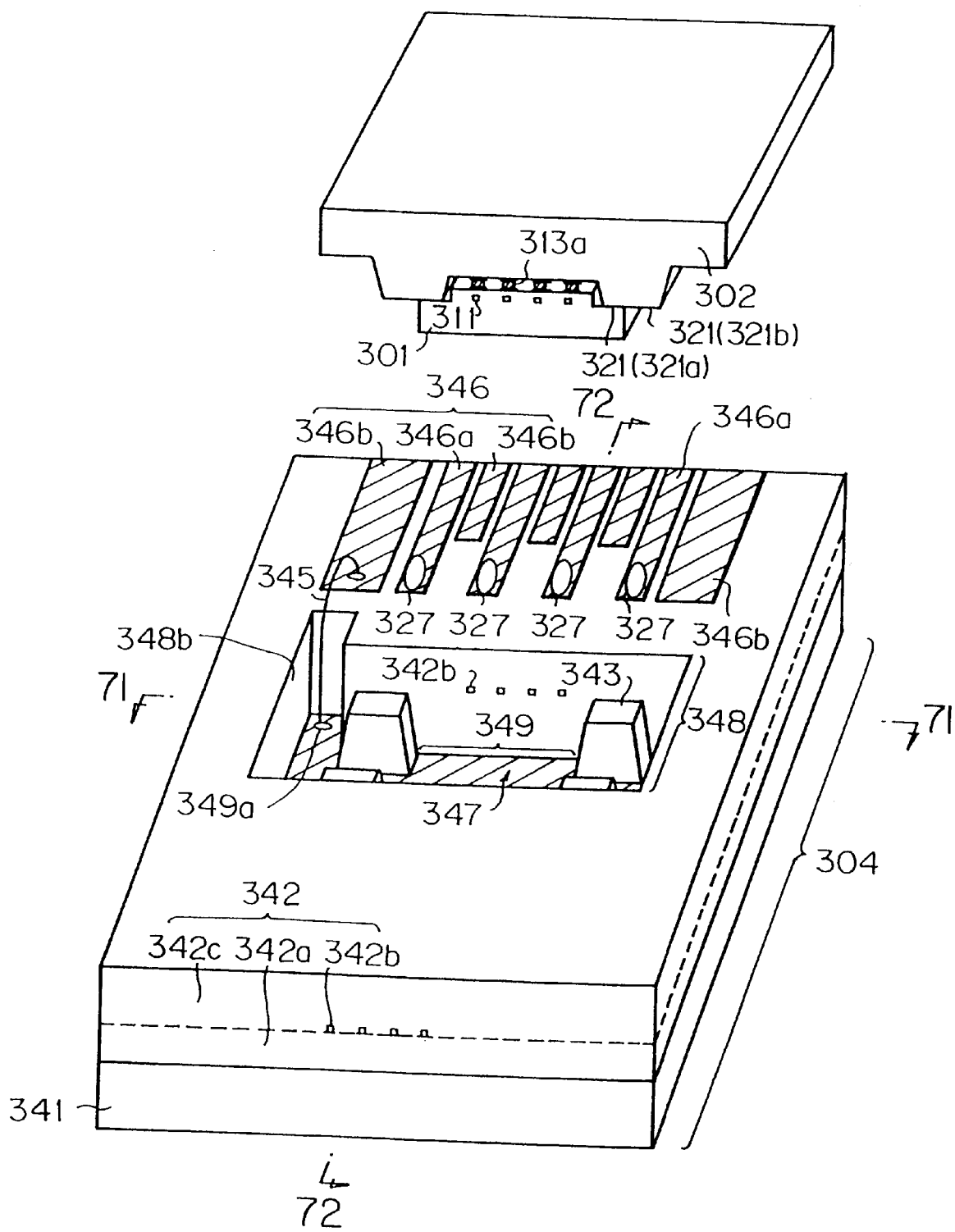
FIG. 70 is a schematic exploded perspective view showing a thirty-fourth embodiment of an opto-electronic hybrid integrated circuit according to the present invention, the circuit using the optical sub-module of FIGS. 66 and 67.

FIG. 70 is a schematic exploded perspective view showing construction of a thirty-fourth embodiment of the hybrid optical integrated circuit using the optical sub-module of Embodiment 31 shown in FIGS. 66 and 67. The reference numeral 304 indicates an optical packaged substrate, in which an optical waveguide part 342, an electrical wiring 346 as a substrate electrical wiring, and an optical device mounting part 348 are formed on a silicon substrate 341 with a step.

The optical waveguide part 342 is formed on the silicon substrate recess, which is a three-layered embedded type silica-based optical waveguide having an under-clad 342a (30 μm thick), a core 342b (6 μm thick×6 μm wide) and an over-clad 342c (30 μm thick).

The substrate electrical wiring 346 is formed on the surface of the over-clad 342c, which uses a coplanar structure comprising a central conductor 346a and a ground conductor 346b so that high-frequency operation is possible. These wirings are formed by depositing and patterning gold (6 μm thick) after the over-clad is formed. This wiring layer has a sufficient thickness (66 μm) and is formed on silica glass having a small dielectric constant, and thus has good electrical characteristics. Further, at the tip of the central conductor 346a in the substrate electrical wiring 346, a solder pattern 327 is deposited and patterned for electrical connection with the optical sub-module.

The optical device mounting part 348 is formed in a region including the silicon protrusion 343. The height of the silicon protrusion 343 surface is in line with the height of the upper surface of the optical waveguide under-clad 342a, which functions as a height reference surface (hereinafter referred to as substrate height reference surface 343) when mounting the optical sub-module. That is, the height from the substrate height reference surface 343 to the center of the optical waveguide core 342b is 3 μm, which is equal to the height from the carrier height reference surface 321b to the active layer 311 of the optical sub-module in Embodiment 31. The silicon recess region, other than the substrate height reference surface 343 includes an optical device inserting groove 349, which has a depth of about 110 μm from the substrate height reference surface 343. On the bottom surface of the groove 349, the ground electrical wiring layer 347 comprising 2 μm thick gold is formed simultaneously with the substrate electrical wiring 346 on the over-clad 342c. Since the ground electrical wiring layer 347 does not require fine patterning, it can be easily formed on such a deep groove bottom. A wiring take-out part 349a is provided at an end of the bottom of the groove 349, and the ground electrical wiring layer 347 and the ground conductor 346b of the optical packaged substrate 304 are connected with a lead 345.

Since in the optical packaged substrate 304 of the present embodiment, the substrate electrical wiring for taking out the electrode 313a of the optical device active layer 311 side can be formed on the optical waveguide surface, even when the arrayed optical device 301 is inserted in the groove 349 of the optical waveguide as described above, a relatively fine electrical wiring pattern can be easily formed. In the prior art optical device upside down configuration, the substrate electrical wiring must be formed on the bottom surface of the stepped substrate, which makes mounting difficult.

Figure 71:
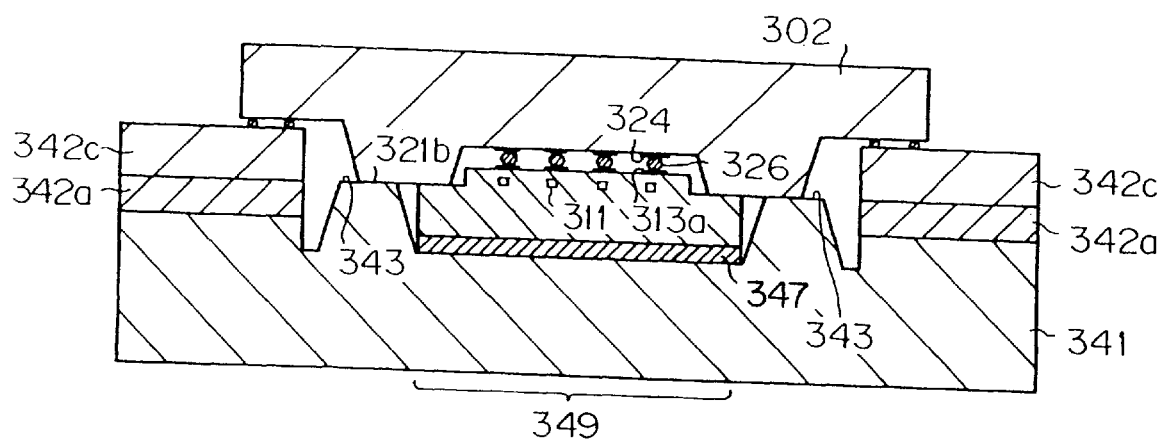
FIG. 71 is a cross-sectional view taken on line 71—71 of FIG. 70.

Accordingly, the process for fabricating a hybrid optical integrated circuit by mounting the optical sub-module including the optical device 301 and the carrier 302 on the optical packaged substrate 304 will now be described with reference to FIGS. 70, 71, and 72. FIG. 71 is a cross-sectional view taken along line 71—71 of FIG. 70, and FIG. 72 is a cross-sectional view taken along line 72—72 of FIG. 70.

Referring to FIGS. 70 and 71, by contacting the carrier height reference surface 321b of the optical sub-module with the substrate height reference surface 343 of the optical packaged substrate, positioning in the height direction of the optical device active layer 311 with the optical waveguide core 342b can be completed. In the present embodiment, as to the lateral direction (plane direction of the silicon substrate and the direction perpendicular to the optical waveguide), an optimum position was set while monitoring the optical coupling rate of the optical waveguide with the optical device. After the completion of positioning, an electroconductive bonding material was dropped on the bottom surface of the optical device inserting groove 349 of the optical packaged substrate 304 to fix the optical sub-module and the optical packaged substrate.

Figure 72:
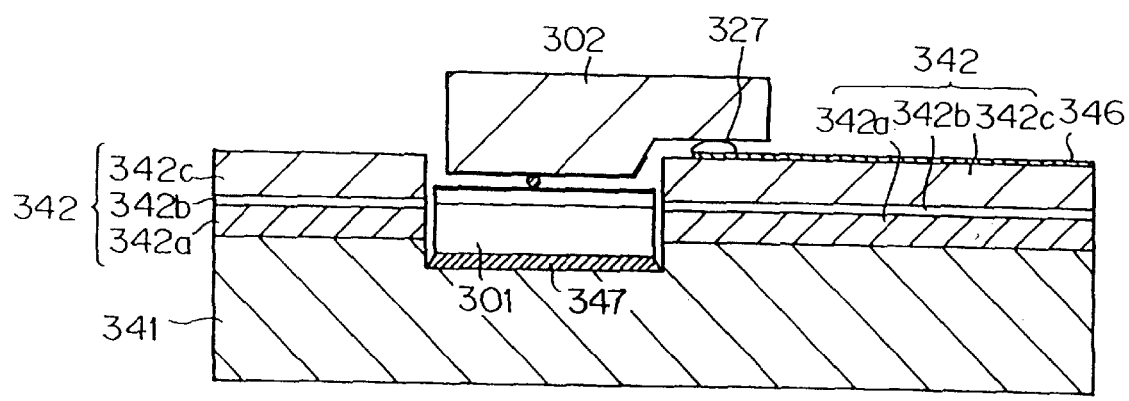
FIG. 72 is a cross-sectional view taken on line 72—72 of FIG. 70.

Finally, as shown in FIG. 72, solder 327 provided at the end of the substrate electrical wiring on the optical packaged substrate is reflowed to achieve electrical connection of the electrical wiring of the optical sub-module and the electrical wiring of the substrate 304, thus completing fabrication of the hybrid optical integrated circuit.

In the present embodiment, reflow of solder is made by heating the entire substrate but, alternatively, this is also possible by locally heating the connection.

In the prior art optical device upside down packaging configuration, optical device mounting and electrical wiring must be processed at the same time. However, in the packaging process of the present embodiment, the core adjustment process of the optical sub-module with the optical packaged substrate, and the electrical wiring process of both can be separated from each other as described above.

Further, for an optical device having a number of electrical wiring terminals, in the prior art method, electrically unconnected terminals tend to occur, leading to a reduced yield. On the other hand, with the present invention, electrical wiring can be carried out after fixing the optical device, and the hybrid optical integrated circuit can be fabricated with an optical device having a number of electrical wiring terminals.

Further, with the optical sub-module and the hybrid optical integrated circuit of the present invention, the size in the height direction is not required to be changed even with an optical device having a different size in the height direction. By appropriately setting the height between the individual reference surfaces of the optical sub-module as shown in FIGS. 67 and 68, and setting the height between the carrier reference surfaces 321, 321a, and 321b and the optical device active layer 311, the optical packaged substrate of the present embodiment can be applied to any type of optical device.

As described above, with the present invention, difficulties in 1) mounting multiple devices of multiple types, 2) electrical wiring formation on the substrate, and 3) previous inspection of the optical device, which have been problems with the prior art hybrid optical integrated circuit having an upside down configuration, can be simultaneously eliminated.

Embodiment 35

Figure 73:
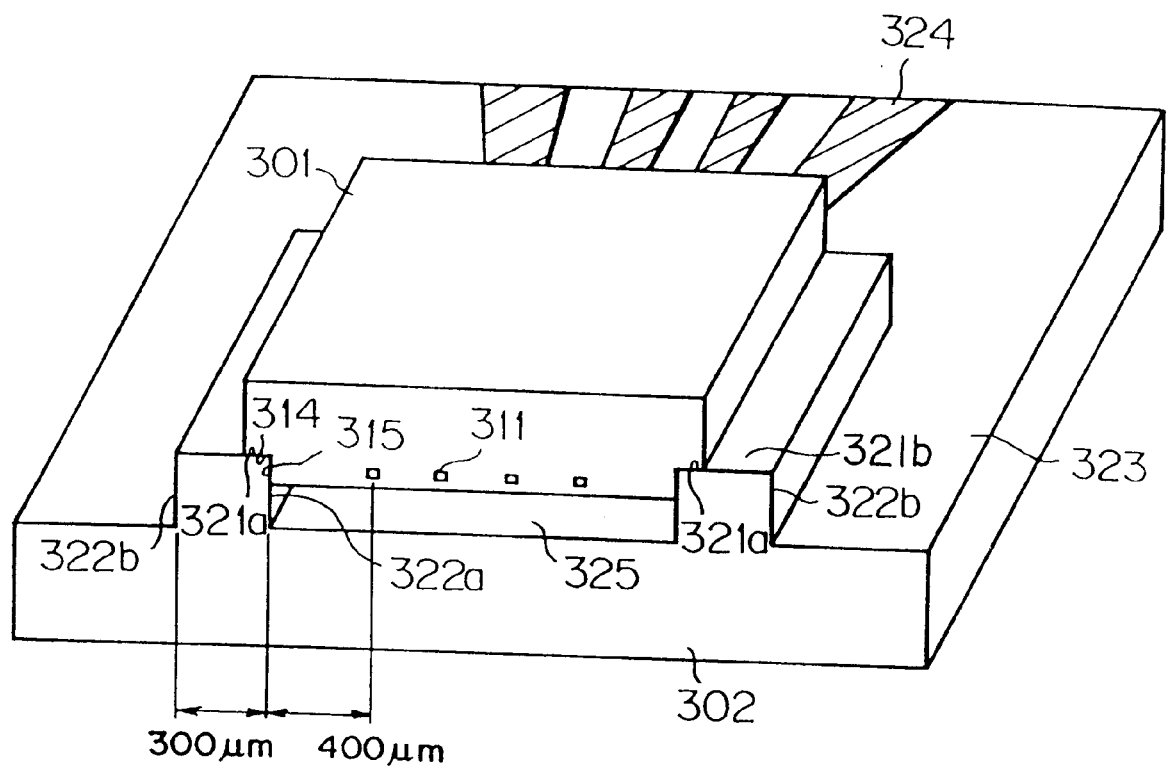
FIG. 73 is a schematic perspective view showing a fourth embodiment of an optical sub-module which is possible to mount on a platform of a thirty-fifth embodiment of an opto-electronic hybrid integrated circuit according to the present invention.

FIG. 73 is a schematic perspective view showing construction of a fourth embodiment of optical sub-module which can be mounted on a thirty-fifth embodiment of the hybrid optical integrated circuit of the present invention. Differences of the present embodiment from the optical sub-module of Embodiment 31 are that a positioning reference surface in the lateral direction is provided, and that the step between the region 325 and the region 323 is removed.

As shown in FIG. 73, the optical device 301 is an arrayed semiconductor optical amplifier which is the same as in Embodiment 31, and various dimensions are the same. In the carrier 302, as in Embodiment 31, the optical device holding surface 321a and the carrier height reference surface 321b are formed on the same surface with no step, and an optical device mounting lateral direction reference surface 322a for positioning in the lateral direction of the optical device is formed on the inside surface of the optical device holding surface 321a. In mounting the optical device 301 on the carrier 302, the optical device height reference surface 314 is contacted with the optical device holding surface 322a, and the optical device lateral direction reference surface 315 is contacted with the optical device mounting lateral direction reference surface 322a, thereby determining a relative position between the carrier 302 and the optical device 301. A carrier lateral direction reference surface 322b is formed on the outer side surface of the carrier height reference surface 321b of the carrier 302, and the carrier lateral direction reference surface 322b and the optical device mounting direction reference surface 322a are separated by 300 μm. The structure and sizes of the carrier 302 other than the above are the same as in Embodiment 31. Therefore, when the optical device 301 is mounted on the carrier 302, distances between the optical device active layer 311 and the carrier height reference surface 321b and the carrier lateral direction reference surface 322b are 3 μm and 700 μm, respectfully.

Embodiment 36

Figure 74:
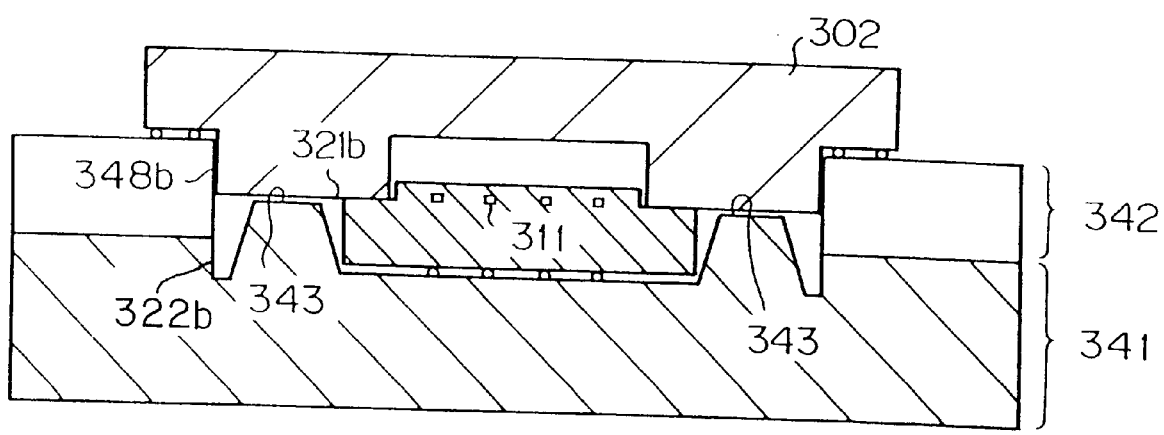
FIG. 74 is a schematic perspective view showing a thirty-sixth embodiment of an opto-electronic hybrid integrated circuit according to the present invention.

FIG. 74 is a schematic cross-sectional view showing construction of a thirty-sixth embodiment of the hybrid optical integrated circuit of the present invention. The present embodiment is characterized in that the optical sub-module of Embodiment 35 is included.

The optical packaged substrate mounting the optical sub-module of Embodiment 35 is the same in structure as shown in FIG. 70. However, in the present embodiment, the distance from the optical waveguide core center to a device mounting groove side wall 348b is set to 700 µm. Other sizes are the same as in Embodiment 34.

In the present embodiment, in mounting the optical sub-module, as shown in FIG. 74, positioning of the optical device active layer 311 with the optical waveguide core 342b is completed by contacting the carrier height reference surface 321b of the optical sub-module with the substrate height reference surface 343 of the optical packaged substrate, and contacting the carrier mounting lateral direction reference surface 322b with the device mounting groove side wall 348b. After that, the hybrid optical integrated circuit can be fabricated through the same process as Embodiment 34 shown in FIGS. 70 to 72.

Even with an optical device of a different size, when the individual height reference surface and the lateral direction reference surface provided on the carrier are appropriately selected, the distances between the optical device active layer 311 and the carrier height reference surface 321b and the carrier mounting lateral direction reference surface 322a (see FIG. 73) can always be set to 3 µm and 700 µm, respectively. Therefore, with the present embodiment, even when the size of the optical device is changed, the hybrid optical integrated circuit can be formed without changing the size of the optical device mounting part of the optical packaged substrate. In addition, various effects obtained in the above individual embodiments can be achieved by the present embodiment as well.

Embodiment 37

Figure 75:
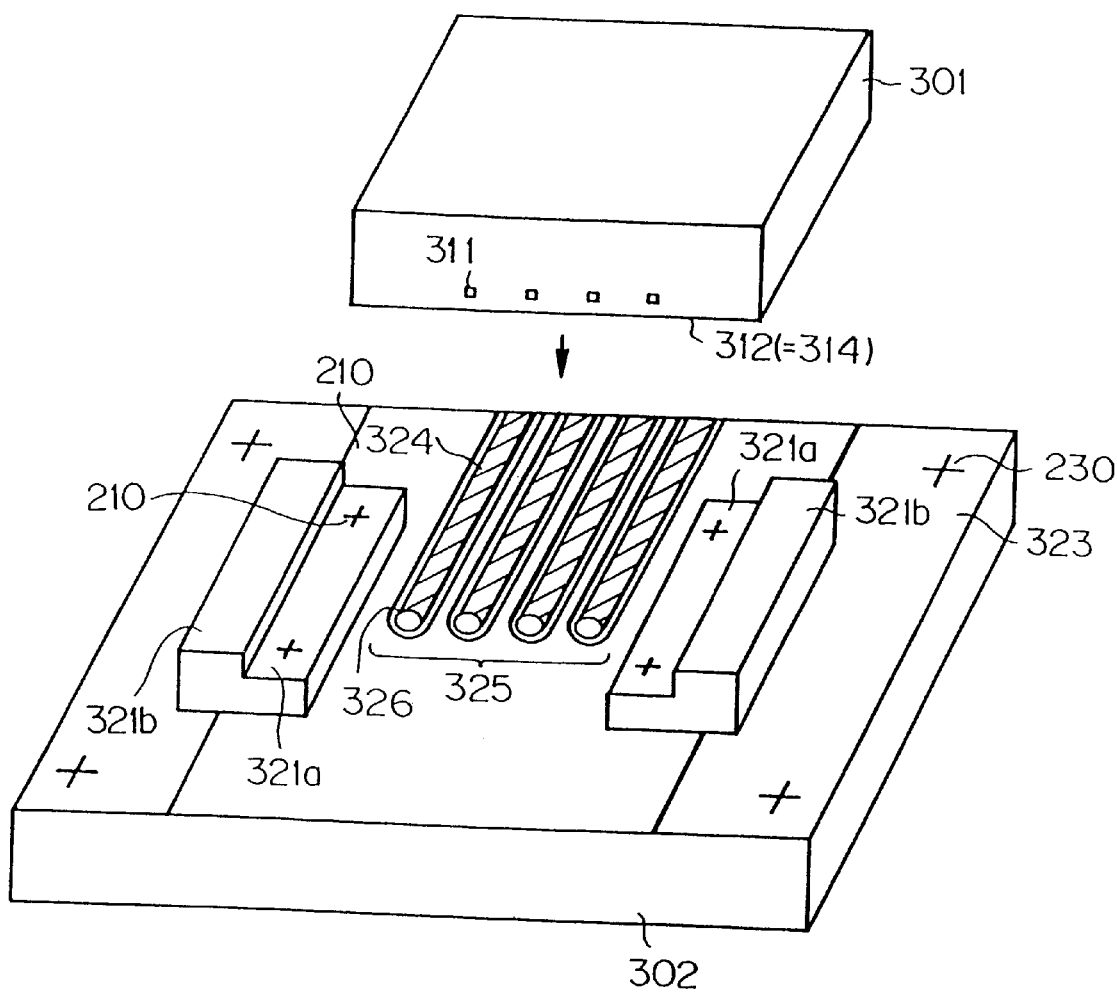
FIG. 75 is a schematic exploded perspective view showing a fifth embodiment an optical sub-module which is possible to mount on a platform of a thirty-seventh embodiment of an opto-electronic hybrid integrated circuit according to the present invention.

FIG. 75 is a schematic exploded perspective view showing construction of a fifth embodiment of an optical sub-module which can be mounted on a thirty-seventh embodiment of the hybrid optical integrated circuit of the present invention. In the present embodiment, a transparent silica glass is used as a material of the carrier 302. Compared with the carrier of Embodiment 31, structural differences are that an optical device positioning marker 210 and a carrier positioning marker 230 are provided respectively on the optical device holding part 321a and the peripheral region 323. Further, the optical device electrode take-out region 325 and the peripheral region 323 are set at the same height. The rest of the construction is the same as the carrier structure of the optical sub-module of Embodiment 33 shown in FIG. 69. The active layer side surface 312 of the optical device 301 is set to the optical device height reference surface 314, and on which a marker (not shown) corresponding to the optical device positioning marker 210 is formed.

Since, in the present embodiment, transparent silica glass is used as the carrier, on mounting the optical device 301 on the carrier 302, the markers formed on the optical device and the carrier can be observed through the transparent carrier. Then, the optical device height reference surface 314 and the carrier holding surface 321a are contacted, and the optical device is mounted so that the marker formed on the optical device is in line with the optical device positioning marker 210 provided on the carrier, thereby achieving exact positioning in both the height direction and the lateral direction.

Further, in the present embodiment, since the electrical wiring 324 is a coplanar wiring, and formed on the surface of silica glass with a small dielectric constant, much superior high-frequency characteristics can be obtained compared to Embodiment 36 using the silicon substrate as the carrier 302.

Embodiment 38

Figure 76:
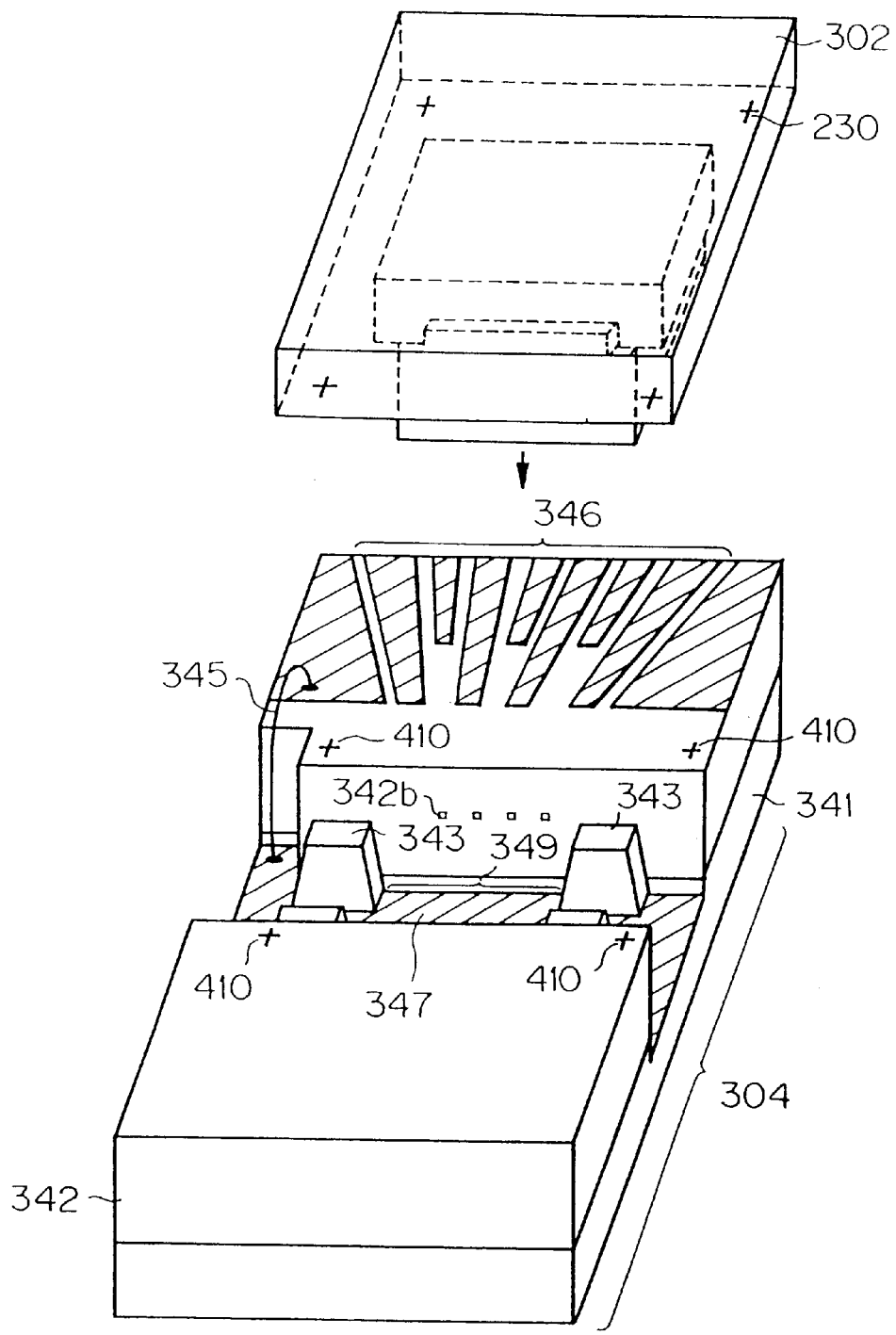
FIG. 76 is a schematic exploded perspective view showing a thirty-eighth embodiment of an opto-electronic hybrid integrated circuit according to the present invention.

FIG. 76 is a schematic exploded perspective view showing construction of a thirty-eighth embodiment of the hybrid optical integrated circuit of the present invention. The present embodiment features that the optical sub-module of Embodiment 37 shown in FIG. 75 is mounted on the optical packaged substrate 304. Except for a substrate marker 410 provided on the over-clad of the optical waveguide 302, the rest of the construction is almost the same as Embodiment 34 shown in FIG. 70. When the optical sub-module is mounted on the substrate, the substrate marker 410 can be set in line with the carrier positioning marker 230, and the carrier height reference surface and the substrate height reference are contacted and fixed.

In the silica glass carrier of the present embodiment, the thermal conductivity is much inferior compared with the silicon carrier of Embodiments 31 and 32. However, when mounting on the optical packaged substrate of FIG. 76, there is no problem because the optical packaged substrate itself functions as a heat sink.

Embodiment 39

Figure 77:
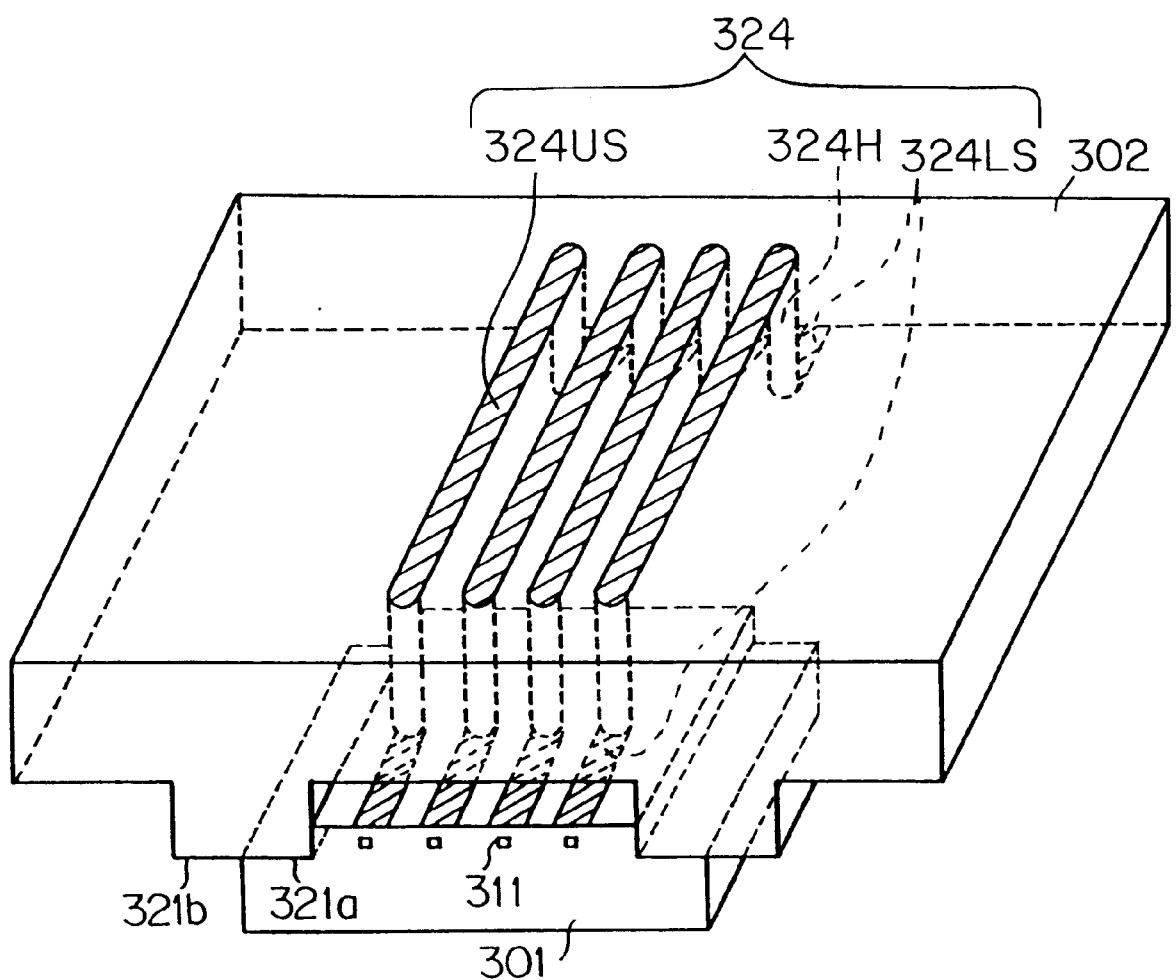
FIG. 77 is a schematic perspective view showing a sixth embodiment of an optical sub-module which is possible to mount on a platform of a thirty-ninth embodiment of an opto-electronic hybrid integrated circuit according to the present invention.

FIG. 77 is a schematic perspective view showing construction of a sixth embodiment of an optical sub-module which can be mounted on a thirty-ninth embodiment of the hybrid optical integrated circuit of the present invention. In the present embodiment, the carrier 302 is constructed using a ceramic substrate having a multilayered electrical wiring 324. The electrical wiring 324 has an upper surface wiring 324 US, a lower surface wiring 324 LS and a via-hole wiring 324 H which electrically connects the upper surface wiring 324 US and the lower surface wiring 324 LS. The carrier (ceramic substrate) 302 is formed therein with an electrical wiring 324 H in the perpendicular direction for connecting electrical wirings on the upper and lower surfaces, an electrode of the optical device 301 is connected on the lower surface of the ceramic substrate 302, and again taken from the lower surface through a wiring 324 US on the upper surface of the substrate.

The optical device holding surface 321a and the carrier height reference surface 321b are formed of polyimide. Such a construction can be achieved, after forming a thick polyimide film on the ceramic substrate, by removing unnecessary portion of polyimide by etching.

Using the optical sub-module, it can be mounted on the optical packaged substrate to obtain the hybrid optical integrated circuit of the present invention by the same method as was employed for the other embodiments described above.

In the present embodiment, since the ceramic substrate is used as the carrier for the optical sub-module, good electrical characteristics can be obtained, and multilayered electrical wiring can be easily achieved. Further, since the electrical wiring can be provided on the carrier, previous inspection of the optical device is very easy.

Embodiment 40

Figure 78:
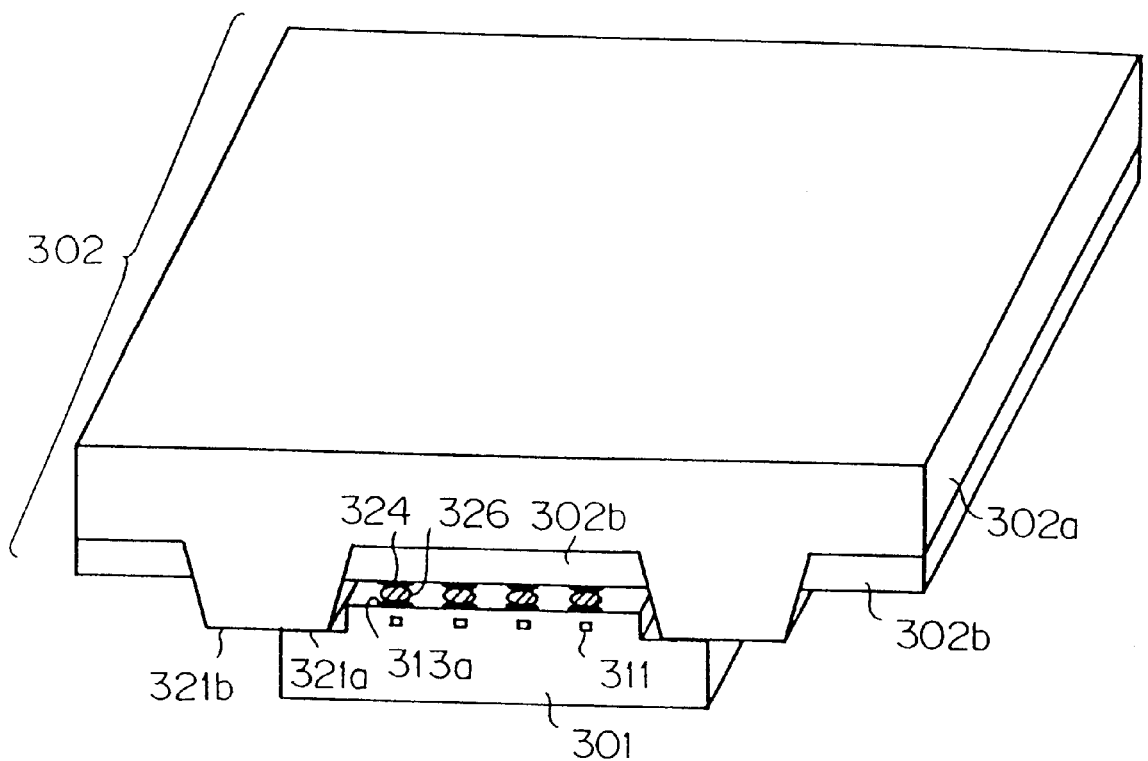
FIG. 78 is a schematic perspective view showing a seventh embodiment of an optical sub-module which is possible to mount on a platform of a fortieth embodiment of an opto-electronic hybrid integrated circuit according to the present invention.

FIG. 78 is a schematic perspective view showing construction of a seventh embodiment of an optical sub-module which can be mounted on a fortieth embodiment of the hybrid optical integrated circuit of the present invention. The carrier 302 of the present embodiment includes a silicon substrate 302a of protrusion and recess configuration, a silica glass layer 302b as a sufficiently thick dielectric layer formed in the recess, the electrical wiring 324 formed on the dielectric layer 302b, the optical device holding surface 321a formed on the silicon protrusion, and the carrier height reference surface 321b as basic components.

Use of the highly heat conductive silicon substrate and the carrier of silica glass laminate structure with a sufficient thickness provides effects that 1) since the electrical wiring is formed on the surface of the silica glass layer having a small dielectric constant, good high-frequency characteristics are obtained as in Embodiment 33, and 2) since silicon is exposed on the optical device holding surface and the carrier height reference surface, and both surfaces individually contact with the optical device height reference surface and the substrate height reference surface, an improved heat dissipation can be obtained.

As the dielectric layer, other than silica glass, a polymeric dielectric material such as polyimide can be applied. When polyimide is used, it is easy to form multilayered high-density electrical wiring, which is suitable for packaging of large-scale optical integrated chip having multiple electrical wirings such as a matrix optical switch.

Embodiment 41

Figure 79:
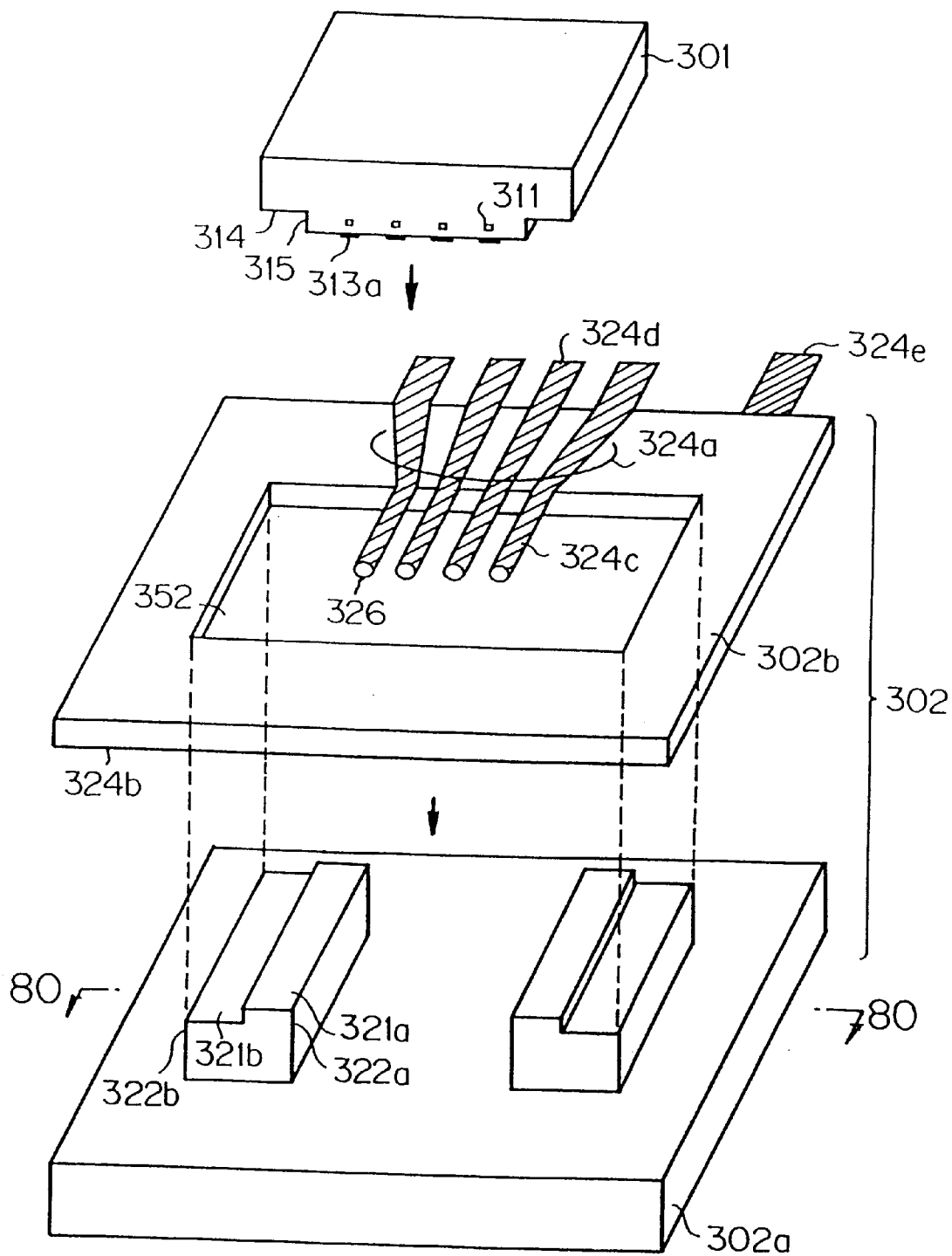
FIG. 79 is a schematic perspective view showing an eighth embodiment of an optical sub-module which is possible to mount on a platform of a forty-first embodiment of an opto-electronic hybrid integrated circuit according to the present invention.
Figure 80:
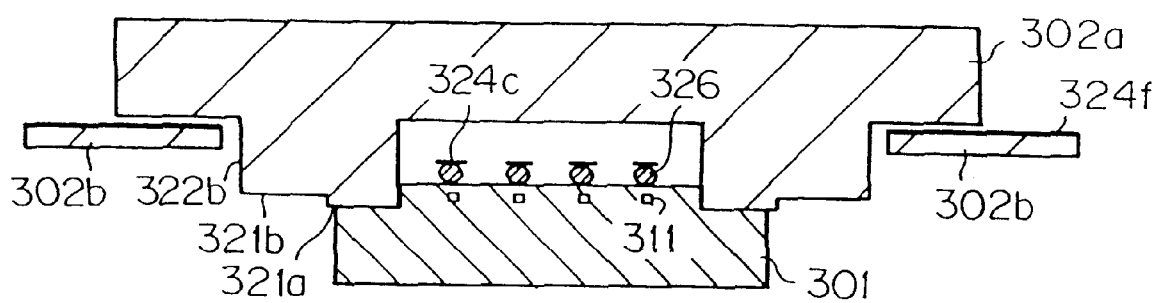
FIG. 80 is a cross-sectional view taken on line 80—80 of FIG. 79.

FIG. 79 is a schematic exploded perspective view showing construction of an eighth embodiment of an optical sub-module which can be mounted on a forty-first embodiment of the hybrid optical integrated circuit of the present invention, and FIG. 80 is a cross-sectional view taken along line 80—80 of FIG. 79.

In the present embodiment, as shown in FIG. 79, the carrier 302 comprises the silicon substrate 302a of protrusion and recess configuration, and a wiring film 302b having electrical wiring. In the protrusion region of the silicon substrate 302a, a signal wiring 324a is provided on the polyimide film surface, and a microstrip wiring with the ground wiring 324b is formed on the backside. The film 302b is provided with a window 352. An inner lead 324c for connecting the signal wiring 324a and the optical device active layer side electrode extend inside the window 352. Further, in the outer periphery of the film 302b, an outer lead 324d connecting to the signal wiring 324a and an outer lead 324c connecting to the ground wiring 324b are provided.

The optical sub-module is fabricated using the following procedure. That is, first, the optical device active layer side electrode 313a and the inner lead 324c of the wiring film are connected with solder, the protrusion of the silicon substrate 302a is inserted from the window 352 of the wiring film, and the optical device height reference surface 314 and the optical device lateral direction reference surface 315 of the optical device 301 are individually contacted with the optical device holding surface 321a and the optical device mounting direction reference surface 322a and fixed.

Embodiment 42

Figure 81:
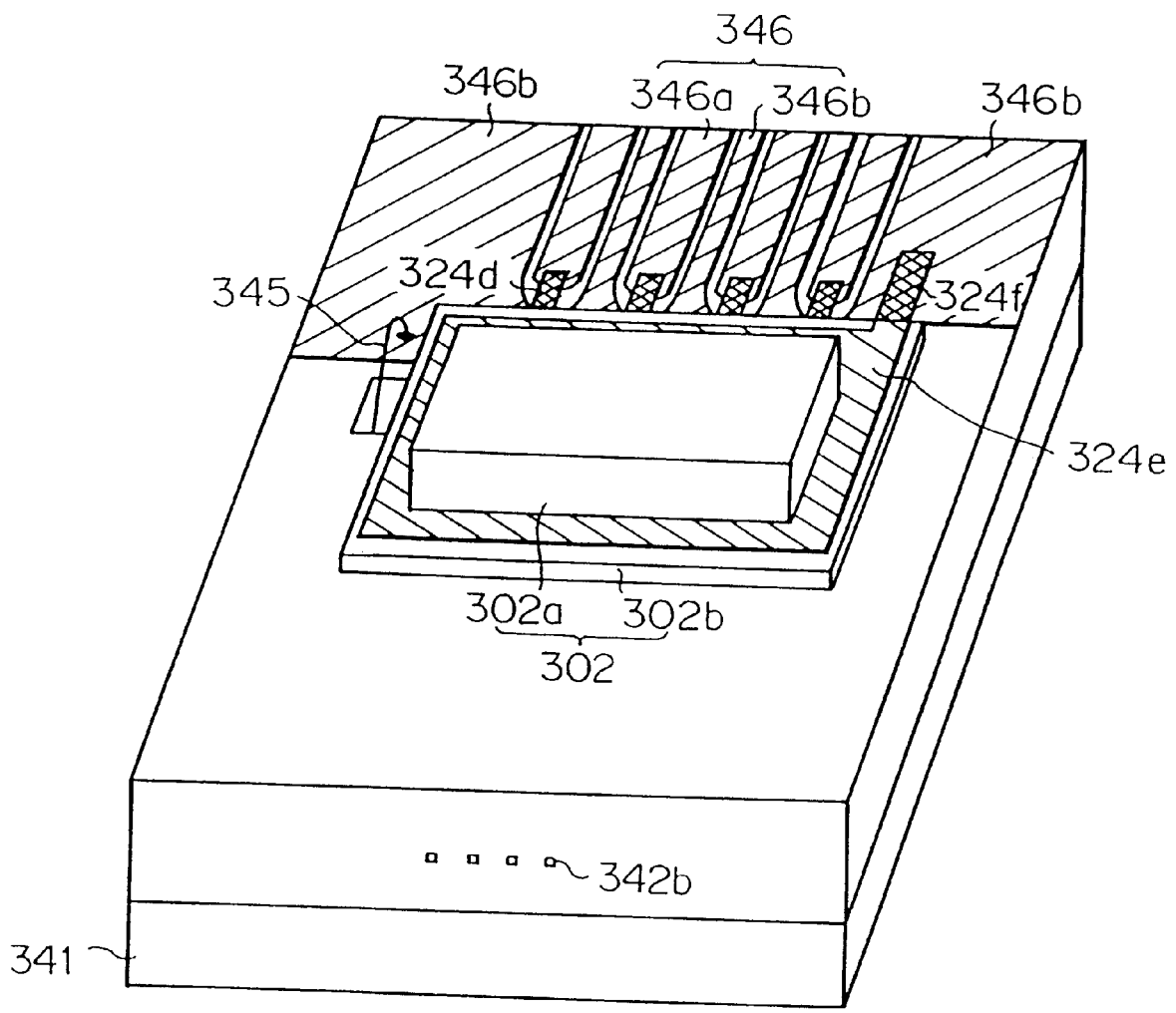
FIG. 81 is schematic perspective view showing a forty-second embodiment of an opto-electronic hybrid circuit according to the present invention.

FIG. 81 is a schematic perspective view showing construction of a forty-second embodiment of the hybrid optical integrated circuit of the present invention. The present embodiment features that the optical sub-module of Embodiment 41 is included.

The optical packaged substrate of the present embodiment is the same in structure as in Embodiment 34 shown in FIGS. 70 to 72. The carrier height reference surface and the carrier lateral direction reference surface of the optical sub-module are individually contacted and fixed with the substrate height reference surface and the substrate lateral direction reference surface of the optical packaged substrate, the outer lead 324d of the optical sub-module and the substrate electrical wiring 346 on the over-clad of the optical packaged substrate 304 are electrically connected.

As described above, in the optical sub-module of the present embodiment, the carrier is constructed by combining the silicon substrate in protrusion and recess configuration having the positioning function with the wiring film having the electrical wiring function. In particular, electrical connection of the wiring film and the optical device electrode is achieved using the inner lead. As a result, compared with the structure of Embodiment 34 and Embodiments 36 to 38 in which the optical device electrode is connected directly to the electrical wiring provided on the carrier surface, the stress acting upon the optical device can be remarkably reduced. This substantially improves reliability of the optical device. At the same time, using the inner lead, the yield of the electrical wiring process of the optical device electrode and the optical sub-module electrical wiring can be greatly improved. Further, since microstrip wiring can be easily formed on the wiring film, the wiring density can be enhanced. The electrical wiring can also be formed not only on the film surface but also inside, and multilayered electrical wiring can be easily achieved. In addition, since the outer lead extends from the optical sub-module, previous inspection of the optical device before mounting on the optical packaged substrate can be carried out very easily.

Since, in the hybrid optical integrated circuit of the present embodiment, the process for positioning and fixing the optical sub-module on the optical packaged substrate and the process for electrically connecting the optical device electrode and the substrate electrical wiring can be separated from each other, the yield of fabrication can be remarkably improved.

As described above, in the optical sub-module of the present embodiment, the optical device is mounted on the carrier having the electrical wiring function for taking out the electrode of the optical device active layer side and the positioning function of the optical device and the optical packaged substrate so that the active layer side contacts. As a result, electrical wiring of superior high-frequency characteristics can be formed within the optical sub-module, and the high-speed characteristics of the optical device can be greatly improved. Further, previous inspection prior to mounting the optical device on the optical packaged substrate can be made very easily. Further, the distance from the carrier positioning reference surface to the optical device active layer can be set to a standardized value regardless of the optical device size.

Further, in the hybrid optical integrated circuit of the present embodiment, since formation of fine electrical wiring pattern is not needed on the bottom surface of the device mounting part where a large step is formed, it is possible to mount not only an optical device of a single end coupling type but also that of the both end coupling type despite an embedded type optical waveguide being used. Further, since the electrical wiring is provided in the carrier and previously connected to the optical device before mounting on the substrate, difficulty in simultaneously making a core adjustment and an electrical connection is removed, and the fabrication work is greatly facilitated.

The present invention has been described in detail with respect to preferred embodiments, and it will now be evident that changes and modifications may be made without departing from the invention in its broader aspects, and it is the intention, therefore, in the appended claims to cover all such changes and modifications as fall within the true spirit of invention.

What is claimed is:

1. A method for producing a platform comprising the steps of:

providing a protruding silicon terrace on a substrate;

forming an optical waveguide under-cladding layer on said substrate, and flattening the surface of said under-cladding layer;

forming a core pattern and an over-cladding layer;

removing said over-cladding layer, said core pattern, and part of said under-cladding layer to expose an upper surface of said silicon terrace and form an electrical wiring part having a surface lower by a desired size than the upper surface of said silicon terrace surface; and forming a conductor pattern on said electrical wiring part.

2. An opto-electronic hybrid integrated circuit, comprising a packaged platform, said platform including:

an optical waveguide having an under-cladding layer, a core, and an over-cladding layer provided on a substrate;

an optical device silicon terrace functioning as a device mounting part provided as a protrusion adjacent to said optical waveguide;

an electrical wiring part provided adjacent to said silicon terrace and including a dielectric layer and a conductor pattern provided on a surface or inside of said dielectric layer; and an optical functional device mounted on said optical device silicon terrace having an optical device surface facing down and at least part of the optical device surface contacting an upper surface of the silicon terrace, said optical functional device optically coupled with said optical waveguide and electrically connected with the conductor pattern of said electrical wiring part.

3. An opto-electronic hybrid integrated circuit as claimed in claim 2, wherein said optical waveguide includes at one least one signal line optical waveguide and at least one monitor optical waveguide;

said optical functional device has a signal port and a monitor port formed at positions individually corresponding to said signal line optical waveguide and said monitor optical waveguide on said platform; and said monitor optical waveguide of said platform and said monitor port of said optical functional device are optically coupled and, at the same time, said optical functional device is disposed on said optical device silicon terrace on said platform with said platform signal optical waveguide and said signal port optically coupled.

4. An opto-electronic hybrid integrated circuit, comprising a platform, said platform including:

an optical waveguide including an under-cladding layer, a core, and an over-cladding layer provided on a substrate;

an optical device silicon terrace functioning as a device mounting part provided as a protrusion adjacent to said optical waveguide;

an electrical wiring part provided adjacent to said silicon terrace and including a dielectric layer and a conductor pattern provided on a surface or inside of said dielectric layer;

an electronic circuit silicon terrace provided as a protrusion on said substrate in said electrical wiring part and functioning as an electronic circuit mounting part;

an optical functional device mounted on said optical device silicon terrace having, an optical device surface facing down and at least part of the optical device surface contacting an upper surface of said optical device silicon terrace, said optical functional device optically coupled with said optical waveguide and electrically connected with the conductor pattern of said electrical wiring part; and an electronic circuit mounted on said electronic circuit silicon terrace and thermally connected with said electronic circuit silicon terrace.

5. An opto-electronic hybrid integrated circuit as claimed in claim 4, wherein a height of an upper surface of the conductor pattern on said dielectric layer in a vicinity of said electronic circuit silicon terrace is set lower than an upper surface of said electronic circuit silicon terrace, a part of said electronic circuit is contacted with said electronic circuit silicon terrace, and at least a part of an electrode on a surface of the electronic circuit is electrically connected with the conductor pattern on said dielectric layer.

6. An opto-electronic hybrid integrated circuit as claimed in claim 5, wherein said optical functional device has a backslide electrode electrically contacted with a conductor pattern on a recess and a protrusion of a sub-carrier, said sub-carrier having thermal conductive material provided on said conductor pattern of said sub-carrier;

said optical device silicon terrace is divided into two or more sections, and a spacing between said divided silicon terrace sections is filled with said dielectric layer;

a first conductor pattern corresponding to a surface electrode provided on an active layer side surface of said optical functional device and a second conductor pattern corresponding to the backside electrode of said optical functional device are provided on said dielectric layer in a periphery of said optical device silicon terrace;

heights of upper surfaces of said first and second conductor patterns are set lower than an upper surface of said optical device silicon terrace;

said optical functional device is mounted on said sub-carrier and is mounted on said platform with a device surface facing down, a periphery of said optical device surface maintains connection and thermal connection with an upper surface of said silicon terrace;

the surface electrode of said optical functional device and said first conductor pattern are electrically connected through an electroconductive bonding material; and the backside electrode of said optical functional device and said second conductor pattern on the protrusion of said sub-carrier are electrically connected through an electroconductive bonding material.

7. An opto-electronic hybrid integrated circuit as claimed in claim 6, wherein a distance from an outer side surface of said sub-carrier to the active layer of said optical functional device is set to a desired setting value D in said optical functional device mounted on said sub-carrier;

a guide structure formed of the optical waveguide material is provided in a vicinity of said optical device silicon terrace;

a distance from an inner side surface of said guide structure to a center of the core of said optical waveguide is set to the setting value D; and said optical functional device is mounted on said optical device silicon terrace while the outer side surface of said sub-carrier maintains contact with the inner side surface of said guide structure.

8. An opto-electronic hybrid electronic circuit as claimed in claim 6, wherein said optical waveguide includes at least one signal line optical waveguide and at least one monitor optical waveguide;

said optical functional device has a signal port and a monitor port formed at positions individually corresponding to said signal line optical waveguide and said monitor optical waveguide on said platform; and said monitor optical waveguide of said platform and said monitor port of said optical functional device are optically coupled and, at the same time, said optical functional device is disposed on said optical device silicon terrace on said platform with said signal optical waveguide and said signal port optically coupled.

9. An opto-electronic hybrid integrated circuit as claimed in claim 5, wherein said optical functional device has backside electrode electrically contacted with a conductor pattern on a recess and a protrusion of a sub-carrier, said sub-carrier having thermal conductive material provided on said conductor pattern;

said optical device silicon terrace is divided into two or more sections, and has an inclination angle;

a periphery of said divided silicon terrace is filled with said dielectric layer;

on said dielectric layer in a periphery of said silicon terrace, a first conductor pattern corresponding to a surface electrode provided on an active layer side surface of said optical functional device, and a height of said first conductor pattern is set lower than an upper surface of said optical device silicon terrace;

a thin film electrode corresponding to said optical functional device backside electrode is formed on part of the upper surface and the inclined side surface of said optical device silicon terrace , and said thin film electrode is electrically connected with a second conductor pattern provided on said dielectric layer;

wherein said optical functional device is mounted on said sub-carrier and is mounted on said packaged substrate with a device surface facing down, a periphery of the device surface facing down of said optical functional device maintains connection and thermal connection with the upper surface of said optical device silicon terrace;

wherein the surface electrode of said optical functional device and said first conductor pattern are electrically connected through an electroconductive bonding material; and wherein the backside electrode of said optical functional device and said second conductor pattern are electrically connected through the conductor pattern on the protrusion of said sub-carrier and said thin film electrode on said optical device silicon terrace.

10. An opto-electronic hybrid integrated circuit as claimed in claim 9, wherein a distance from an outer side surface of said sub-carrier to the active layer of said optical functional device is set to a desired setting value D in said optical functional device mounted on said sub-carrier;

a guide structure formed of the optical waveguide material is provided in a vicinity of said optical device silicon terrace;

a distance from an inner side surface of said guide structure to a center of the core of said optical waveguide is set to the setting value D; and said optical functional device is mounted on said optical device silicon terrace while the outer side surface of said sub-carrier maintains contact with the inner side surface of said guide structure.

11. An opti-electronic hybrid integrated circuit as claimed in claim 9, wherein an other end of a waveguide of individual monitor optical waveguides optically coupled with said optical functional device is conducted to an end of said opto-electronic hybrid platform.

12. An opto-electronic hybrid integrated circuit as claimed in claim 9, wherein two or more optical functional devices are mounted on said opto-electronic hybrid packaged substrate, and a monitor port of each optical functional device is optically coupled with a monitor optical waveguide connecting said optical functional device monitor port and an end of said opto-electronic hybrid platform or said monitor optical waveguide connecting between said two or more optical functional devices.

13. An opto-electronic hybrid integrated circuit as claimed in claim 9, wherein said optical functional device mounted on said opto-eletronic hybrid platform has two or more monitor ports, monitor optical waveguides of a number corresponding to a number of said monitor ports are provided on said opto-electronic hybrid platform; and at least one of said monitor ports is set to a width wider than a signal port width, or at least one of signal optical waveguides is set to a width wider than a signal optical waveguide width.

14. An opto-electronic hybrid integrated circuit as claimed in claim 9, wherein said optical waveguide includes at least one signal line optical waveguide and at least one monitor optical waveguide;

said optical functional device has a signal port and a monitor port formed at positions individually corresponding to said signal line optical waveguide and said monitor optical waveguide on said platform; and said monitor optical waveguide of said platform and said monitor port of said optical functional device are optically coupled and, at the same time, said optical functional device is disposed on said optical device silicon terrace on said platform with said signal optical waveguide and said signal port optically coupled.

15. An opto-electronic hybrid integrated circuit as claimed in claim 5, wherein said optical waveguide includes at least one signal line optical waveguide and at least one monitor optical waveguide;

said optical functional device has a signal port and a monitor port formed at positions individually corresponding to said signal line optical waveguide and said monitor optical waveguide on said platform; and said monitor optical waveguide of said platform and said monitor port of said optical functional device are optically coupled and, at the same time, said optical functional device is disposed on said optical device silicon terrace on said platform with said signal optical waveguide and said signal port optically coupled.

16. An opto-electronic hybrid integrated circuit as claimed in claim 4, wherein said optical waveguide includes at least one signal line optical waveguide and at least one monitor optical waveguide;

said optical functional device has a signal port and a monitor port formed at positions individually corresponding to said signal line optical waveguide and said monitor optical waveguide on said platform; and said monitor optical waveguide of said platform and said monitor port of said optical functional device are optically coupled and, at the same time, said optical functional device is disposed on said optical device silicon terrace on said platform with said signal optical waveguide and said signal port optically coupled.

17. An opto-electronic hybrid packaged platform, comprising:

an optical waveguide part, an optical device mounting part, and an electrical wiring part provided on a same substrate, wherein said optical device mounting part comprises a terrace made of silicon material provided as a protrusion on said substrate;

said electrical wiring part comprises a dielectrical layer formed on said substrate and a conductor pattern formed on a surface or inside of said dielectric layer; and an upper surface of said conductor pattern on said dielectric layer is set lower than an upper surface of said silicon terrace of said optical device mounting part and at least in a vicinity of a silicon terrace of said electrical wiring part.

18. A platform as claimed in claim 17, wherein said optical waveguide part includes a positioning groove formed on said silicon terrace, and an optical fiber fixed in said positioning groove.

19. A platform as claimed in claim 17, wherein said optical waveguide part comprises an under-cladding layer formed on said substrate, a core, and an over-cladding layer, and a height of a bottom surface of said core of said optical waveguide is set higher than the upper surface of said silicon terrace of said optical device mounting part.

20. A platform as claimed in claim 17, wherein said silicon terrace of said optical device mounting part has a side surface having an inclination angle; and a thin film electrode is formed on a surface and the side surface of said silicon terrace of said optical device mounting part, and said thin film electrode is electrically connected to said conductor pattern.

21. A platform as claimed in claim 20, wherein said optical waveguide part includes at least one signal optical waveguide and at least one monitor optical waveguide.

22. A platform as claimed in claim 19, wherein a conductor pattern is formed within said substrate, and said conductor pattern in said substrate and said conductor pattern in or on said dielectric layer are electrically connected.

23. A platform as claimed in claim 17, wherein said substrate is a silicon substrate having a protrusion and a depression; said optical waveguide part is formed on said depression; and said conductor pattern is formed on said dielectric layer on said depression.

24. A platform as claimed in claim 17, wherein said silicon terrace of said electrical wiring part is formed on said substrate for mounting an integrated circuit.

25. A platform as claimed in claim 17, wherein said silicon terrace of said optical device mounting part is divided into two or more sections, a space between said divided silicon terrace sections is filled with said dielectric layer, and a conductor pattern is provided on said dielectric layer of said space between said silicon terrace sections.

26. A platform as claimed in claim 25, wherein said optical waveguide part includes a positioning groove formed on said silicon terrace of said optical device mounting part, and an optical fiber fixed in said positioning groove.

27. A platform as claimed in claim 26, wherein said optical waveguide includes at least one signal optical waveguide and at least one monitor optical waveguide.

28. A platform as claimed in claim 25, wherein said optical waveguide part comprises an under-cladding layer formed on said substrate, a core, and an over-cladding layer, and a height of a bottom surface of said core of said optical waveguide part is set higher than an upper surface of said silicon terrace of said optical device mounting part.

29. A platform as claimed in claim 28, wherein said optical waveguide includes at least one signal optical waveguide and at least one monitor optical waveguide.

30. A platform as claimed in claim 25, wherein a conductor pattern is formed within said substrate, and said conductor pattern in said substrate and said conductor pattern in or on said dielectric layer are electrically connected.

31. A platform as claimed in claim 17, wherein said optical waveguide part includes at least one signal optical waveguide and at least one monitor optical waveguide.

32. A platform as claimed in claim 17, wherein a conductor pattern is formed within said substrate, and said conductor pattern in said substrate and said conductor pattern in or on said dielectric layer are electrically connected.

33. An opto-electronic hybrid packaged platform, comprising:

an optical waveguide part, an optical device mounting part, and an electrical wiring part provided on a same substrate, wherein said optical device mounting part comprises a terrace made of silicon material provided as a protrusion on said substrate;

said electrical wiring part comprises a dielectrical layer formed on said substrate and a conductor pattern formed on a surface or inside of said dielectric layer; and said optical waveguide part includes a positioning groove formed on said silicon terrace, and an optical fiber fixed in said positioning groove.

34. A platform as claimed in claim 33, wherein said substrate is a silicon substrate having a protrusion and a depression; said optical waveguide part is formed on said depression; and said conductor pattern is formed on said dielectric layer on said depression.

35. A platform as claimed in claim 33, further comprising an additional terrace formed on said substrate for mounting an integrated circuit.

36. A platform as claimed in claim 33, wherein said optical waveguide part includes at least one signal optical waveguide and at least one monitor optical waveguide.

37. A platform as claimed in claim 36, wherein said substrate is a silicon substrate having a depression and a protrusion, said optical waveguide part is formed on said depression, and said dielectric layer is formed on said depression.

38. A platform as claimed in claim 17, wherein a conductor pattern is formed within said substrate, and said conductor pattern in said substrate and said conductor pattern in or on said dielectric layer are electrically connected.

39. A platform as claimed in claim 33, wherein said optical waveguide part includes at least one signal optical waveguide and at least one monitor optical waveguide.

40. An opto-electronic hybrid packaged platform, comprising:

an optical waveguide part, an optical device mounting part, and an electrical wiring part provided on a same substrate, wherein said optical device mounting part comprises a terrace made of silicon material provided as a protrusion on said substrate;

said electrical wiring part comprises a dielectrical layer formed on said substrate and a conductor pattern formed on a surface or inside of said dielectric layer; and said optical waveguide part comprises an under-cladding layer formed on said substrate, a core, and an over-cladding layer, and a height of a bottom surface of said core of said optical waveguide part is set higher than an upper surface of said silicon terrace.

41. A platform as claimed in claim 40, wherein said optical waveguide part is a dielectric optical waveguide part, and said dielectric layer of said electrical wiring part comprises an under-cladding layer of said dielectric optical waveguide; and a second dielectric layer is stacked on a part of a first dielectric layer, said first dielectric layer including said under-cladding layer of said optical waveguide part, said second dielectric layer including a material different from said optical waveguide part, and a conductor pattern is formed inside or on the surface of said second dielectric layer.

42. A platform as claimed in claim 41, wherein said optical waveguide part has a total thickness of 120 µm or less.

43. A platform as claimed in claim 42, wherein said substrate is a silicon substrate having a depression and a protrusion, said optical waveguide part is formed on said depression, and said dielectric layer is formed on said depression.

44. A platform as claimed in claim 40, wherein said substrate is a silicon substrate having a protrusion and a depression; said optical waveguide part is formed on said depression; and said conductor pattern is formed on said dielectric layer on said depression.

45. A platform as claimed in claim 40, further comprising an additional terrace formed on said substrate for mounting an integrated circuit.

46. A platform as claimed in claim 40, wherein said optical waveguide part is a dielectric optical waveguide part, and said dielectric layer of said electrical wiring part comprises an under-cladding layer of said dielectric optical waveguide, wherein said substrate is a silicon substrate, said optical waveguide and said dielectric layer are formed of a silica-based optical waveguide, the conductor pattern formed on said dielectric layer is a coplanar wiring comprising a central conductor and a ground conductor, and said dielectric layer has a thickness of 50 µm or more.

47. A platform as claimed in claim 46, wherein said silica-based optical waveguide has a total thickness of 120 µm or less.

48. A platform as claimed in claim 47, wherein said substrate is a silicon substrate having a depression and a protrusion, said optical waveguide part is formed on said depression, and said dielectric layer is formed on said depression.

49. A platform as claimed in claim 29, wherein said optical waveguide part is a dielectric optical waveguide part, and said dielectric layer of said electrical wiring part comprises an under-cladding layer of said dielectric optical waveguide, wherein said silicon substrate has an average resistivity of 50 ohm-cm or more, said optical waveguide and said dielectric layer are formed of a silica-based optical waveguide, the conductor pattern provided on said dielectric layer is a coplanar wiring comprising a central conductor and a ground conductor, and said dielectric layer has a thickness of 20 µm or more.

50. A platform as claimed in claim 49, wherein said silica-based optical waveguide has a total thickness of 120 µm or less.

51. A platform as claimed in claim 50, wherein said substrate is a silicon substrate having a depression and a protrusion, said optical waveguide part is formed on said depression, and said dielectric layer is formed on said depression.

52. A platform as claimed in claim 40, wherein said optical waveguide part includes at least one signal optical waveguide and at least one monitor optical waveguide.

53. A platform as claimed in claim 40, wherein said optical waveguide part is a dielectric optical waveguide part, and said dielectric layer of said electrical wiring part comprises an under-cladding layer of said dielectric optical waveguide, wherein said substrate is a silicon substrate having a depression and a protrusion, said optical waveguide part is formed on said depression, and said dielectric layer is formed on said depression.

54. An opto-electronic hybrid packaged platform, comprising:

an optical waveguide part, an optical device mounting part, and an electrical wiring part provided on a same substrate, wherein said optical device mounting part comprises a terrace made of silicon material provided as a protrusion on said substrate;

said electrical wiring part comprises a dielectrical layer formed on said substrate and a conductor pattern formed on a surface or inside of said dielectric layer; and said optical waveguide part includes an under-clad, a core, and an over-clad formed on said silicon substrate, wherein a height of a bottom surface of said core of said optical waveguide part is higher than an upper surface of said silicon terrace, and wherein said conductor pattern of said electrical wiring part is formed on a surface of said dielectric layer, said dielectric layer having a height which is substantially equal to a surface of said over-clad of said optical waveguide part.

55. A platform as claimed in claim 54, further comprising an additional terrace formed on said substrate for mounting an integrated circuit.

56. An opto-electronic hybrid packaged platform, comprising:

an optical waveguide part, an optical device mounting part, and an electrical wiring part provided on a same substrate, wherein said optical device mounting part comprises a terrace made of silicon material provided as a protrusion on said substrate;

said electrical wiring part comprises a dielectrical layer formed on said substrate and a conductor pattern formed on a surface or inside of said dielectric layer; and an upper surface of said conductor pattern on said dielectric layer is set lower than an upper surface of said silicon terrace of said optical device mounting part and at least in the vicinity of a silicon terrace of said electrical wiring part, and wherein said silicon terrace of said optical device mounting part is divided into two or more sections, a space between said divided silicon terrace sections is filled with said dielectric layer, and a conductor pattern is provided on said dielectric layer of said space between said silicon terrace sections.

57. A platform as claimed in claim 56, wherein said substrate is a silicon substrate having a protrusion and a depression; said optical waveguide part is formed on said depression; and said conductor pattern is formed on said dielectric layer on said depression.

58. A platform as claimed in claim 56, wherein said silicon terrace of said electrical wiring part is formed on said substrate for mounting an integrated circuit.

* * * * *